United States Patent
Yamazaki et al.

(10) Patent No.: US 6,362,027 B1
(45) Date of Patent: Mar. 26, 2002

(54) SEMICONDUCTOR DEVICE, ACTIVE MATRIX SUBSTRATE, METHOD OF MANUFACTURING THE SEMICONDUCTOR DEVICE AND METHOD OF MANUFACTURING THE ACTIVE MATRIX SUBSTRATE

(75) Inventors: Shunpei Yamazaki, Tokyo; Hiroki Adachi, Kanagawa, both of (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 09/348,617

(22) Filed: Jul. 6, 1999

(30) Foreign Application Priority Data

Jul. 8, 1998 (JP) .......................................... 10-208724
Jul. 30, 1998 (JP) .......................................... 10-230005
Jul. 30, 1998 (JP) .......................................... 10-230006

(51) Int. Cl.$^7$ .............................................. H01L 21/00
(52) U.S. Cl. ........................ 438/149; 438/166; 438/486
(58) Field of Search ................................ 438/149, 166, 438/486

(56) References Cited

U.S. PATENT DOCUMENTS 5,648,277 A  7/1997  Zhang et al. ................ 438/151
5,879,969 A  * 3/1999  Yamazaki et al. ........... 438/151
6,110,598 A  * 8/2000  Maeda et al. ................ 428/457

FOREIGN PATENT DOCUMENTS

| JP | 06-232059 | 8/1994 |
| JP | 07-015017 | 1/1995 |
| JP | 07-094752 | 4/1995 |
| JP | 07-321339 | 12/1995 |
| JP | 08-015686 | 1/1996 |
| JP | 08-330602 | 12/1996 |

* cited by examiner

Primary Examiner—Wael Fahmy
Assistant Examiner—William M. Brewster
(74) Attorney, Agent, or Firm—Cook, Alex, McFarron, Manzo, Cummings & Mehler, Ltd.

(57) ABSTRACT

In a method of manufacturing a semiconductor device, a Ta film and an Al film are formed on a gate insulating film 103. The Al film is patterned to form an Al layer 106 for each of gate wirings. With this structure, all the Al layers 106 are electrically short-circuited by the Ta film. A probe of an anodic oxidation device is brought into contact with the Ta film to anodically oxidize the Al layers 106 and the Ta film to form a barrier A.O. film 107 and a TaOx film 109. The Ta film which has not been anodically oxidized functions as a Ta layer 108 of the gate wiring.

53 Claims, 45 Drawing Sheets

X-X' CROSS - SECTIONAL VIEW ( N-CHANNEL TFT )

100: SUBSTRATE   102: SEMICONDCTOR LAYER   103: GATE INSULATING FILM
106: A1 LAYER (SECOND WIRING LAYER)   107: BARRIER A.O. FILM (SECOND ANODIC OXIDE FILM)   108: Ta LAYER (FIRST WIRING LAYER)
109: TaOx FILM (FIRST ANODIC OXIDE FILM)   110: SOURCE REGION
112: DRAIN REGION   113: CHANNEL FORMATION REGION
120: INTERLAYER INSULATING FILM   121: SOURCE WIRING
122: DRAIN WIRING   123: LEAD ELECTRODE

FIG. 1A
Z-Z' CROSS-SECTIONAL VIEW

FIG. 1C
Y-Y' CROSS-SECTIONAL VIEW

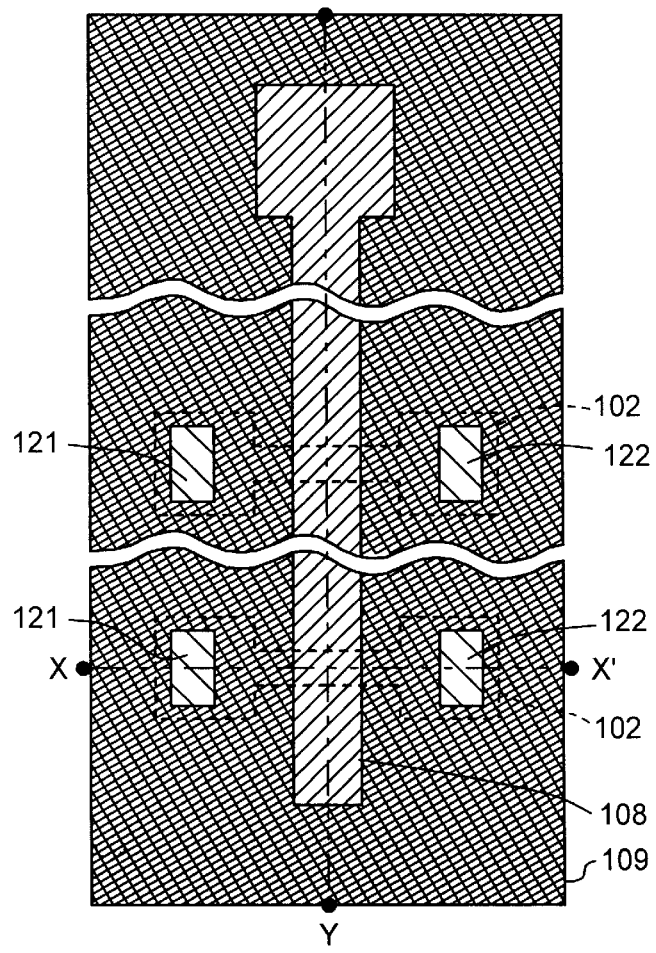

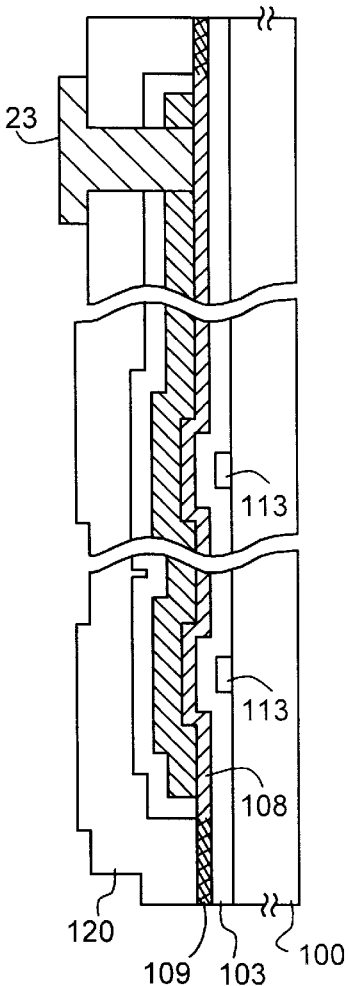

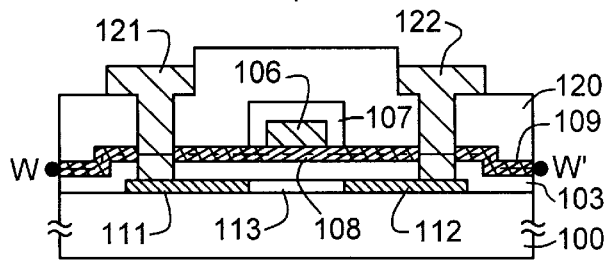

FIG. 1B
X-X' CROSS-SECTIONAL VIEW (N-CHANNEL TFT)

100: SUBSTRATE  102: SEMICONDCTOR LAYER  103: GATE INSULATING FILM
106: A1 LAYER (SECOND WIRING LAYER)  107: BARRIER A.O. FILM (SECOND ANODIC OXIDE FILM)  108: Ta LAYER (FIRST WIRING LAYER)
109: TaOx FILM (FIRST ANODIC OXIDE FILM)  110: SOURCE REGION
112: DRAIN REGION  113: CHANNEL FORMATION REGION
120: INTERLAYER INSULATING FILM  121: SOURCE WIRING
122: DRAIN WIRING  123: LEAD ELECTRODE

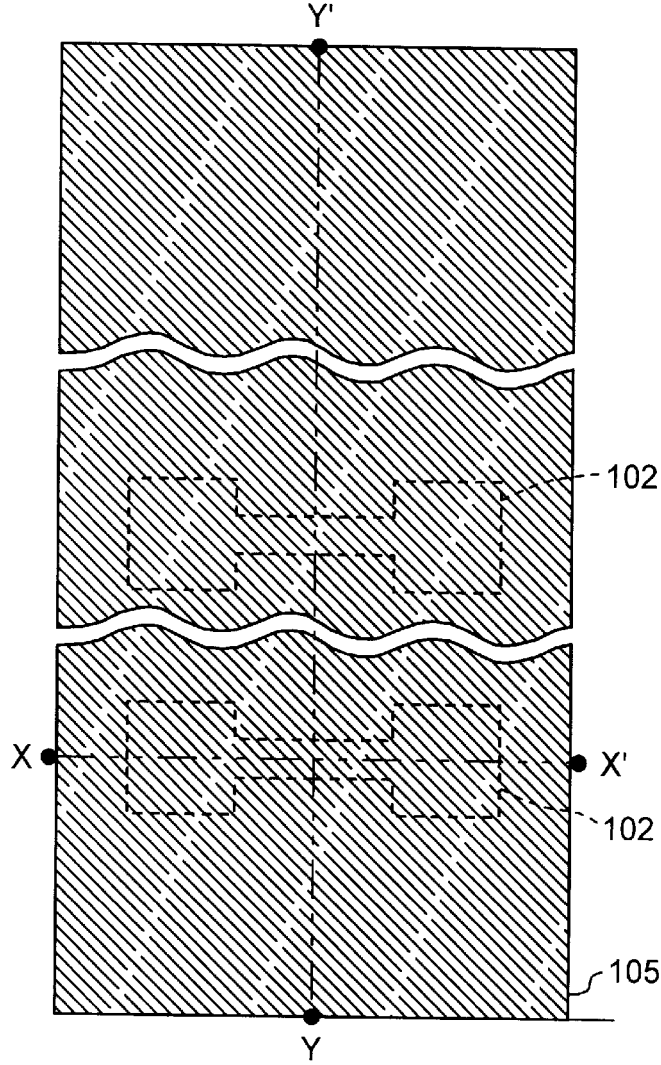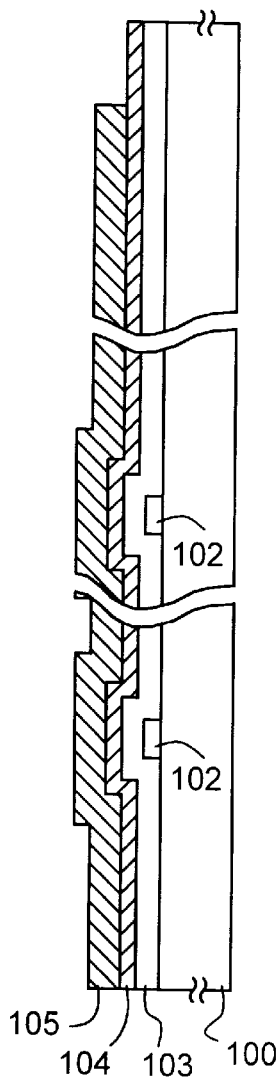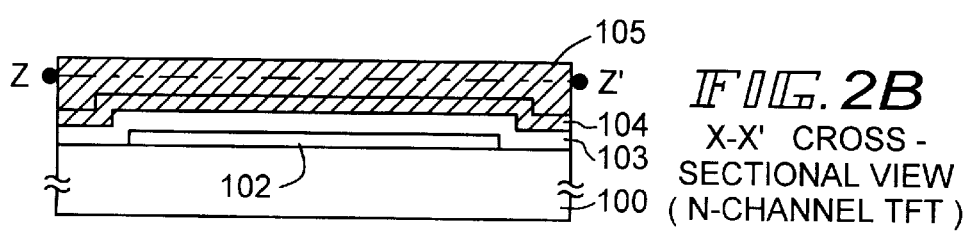

FIG. 3A
Z-Z' CROSS-SECTIONAL VIEW
FIG. 3C
Y-Y' CROSS-SECTIONAL VIEW
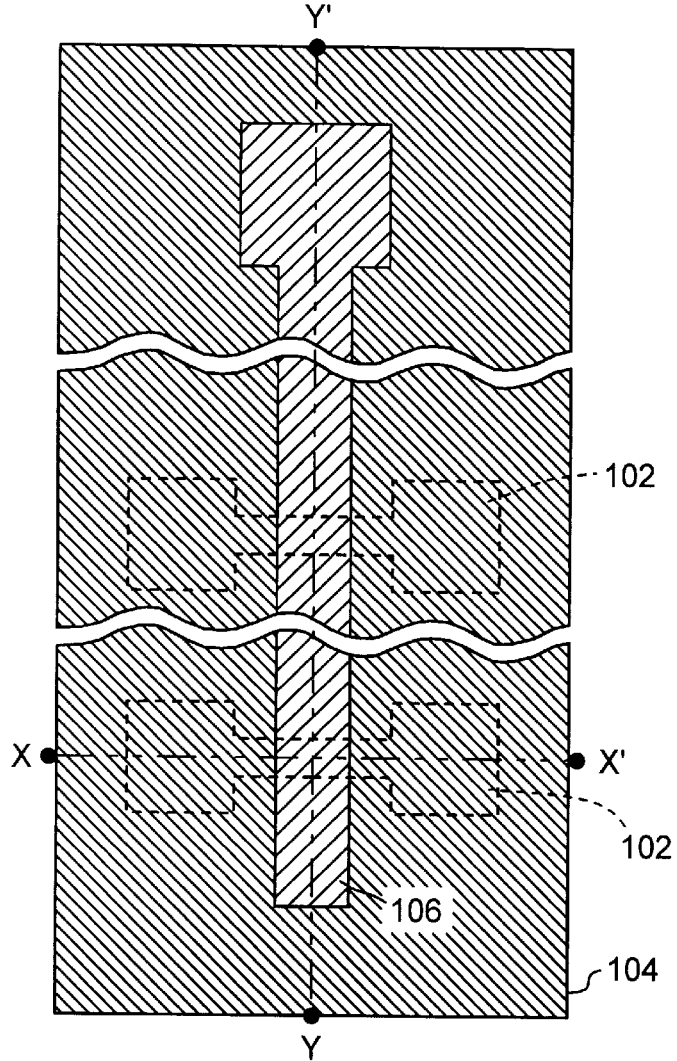
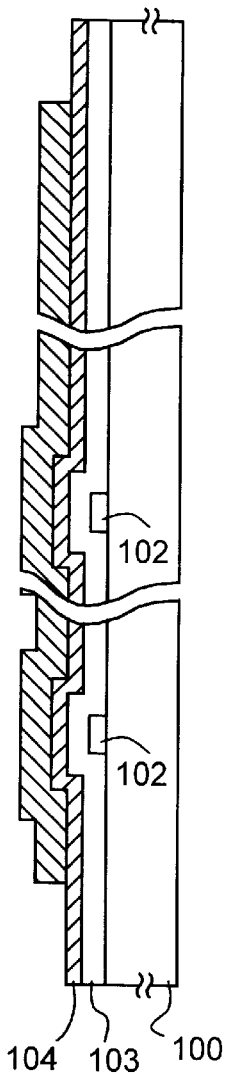
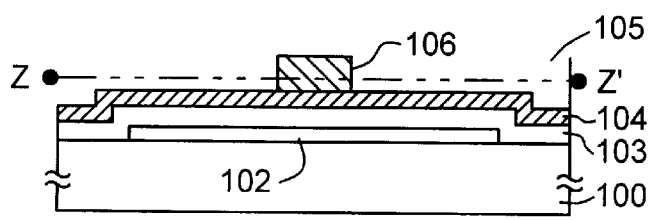
FIG. 3B
X-X' CROSS-SECTIONAL VIEW
(N-CHANNEL TFT)
100: SUBSTRATE  102: SEMICONDCTOR LAYER
103: GATE INSULATING FILM
104: Ta FILM (FIRST CONDUCTIVE FILM)
106: Al LAYER (SECOND WIRING LAYER)

FIG. 4A
Z-Z' CROSS-SECTIONAL VIEW
FIG. 4C
Y-Y' CROSS-SECTIONAL VIEW
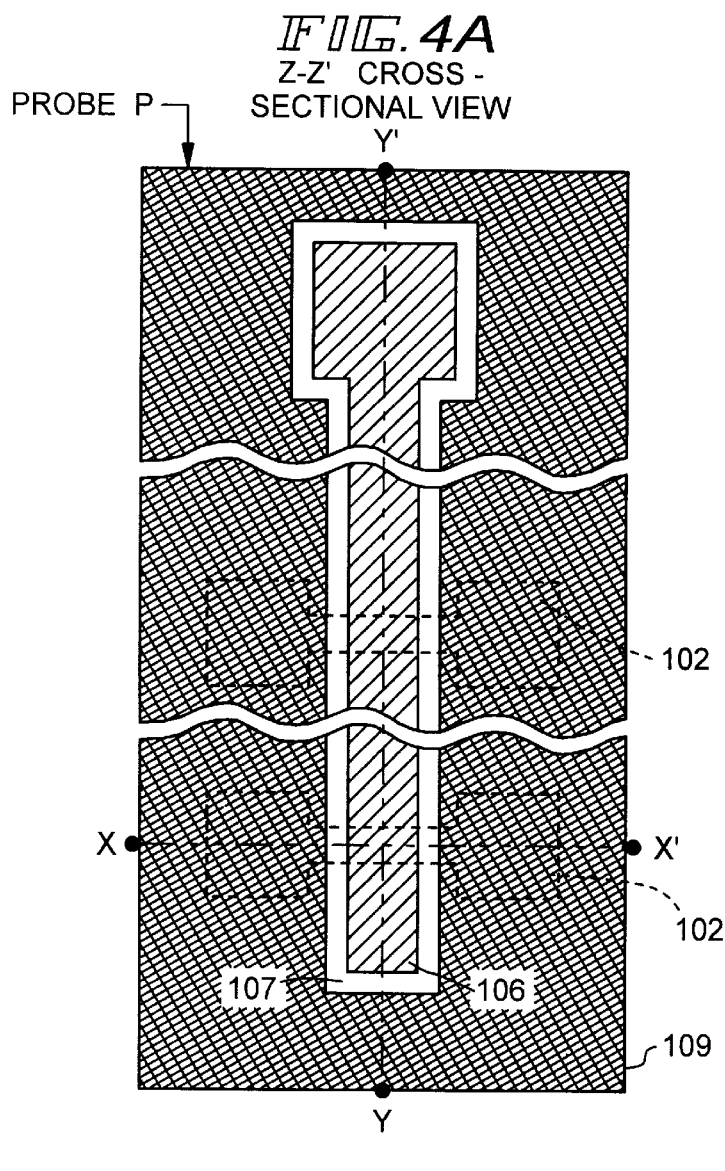
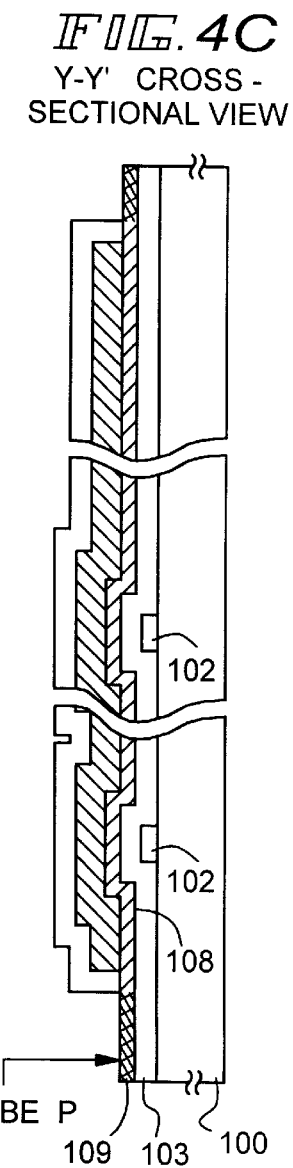
FIG. 4B
X-X' CROSS-SECTIONAL VIEW (N-CHANNEL TFT)
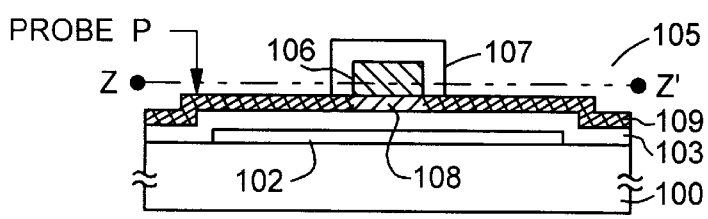
100: SUBSTRATE  102: SEMICONDCTOR LAYER
103: GATE INSULATING FILM
106: A1 FILM (SECOND WIRING LAYER)
107: BARRIER A.O. FILM (SECOND ANODIC OXIDE FILM)
108: Ta LAYER (FIRST WIRING LAYER)
109: TaOx FILM (FIRST ANODIC OXIDE FILM)

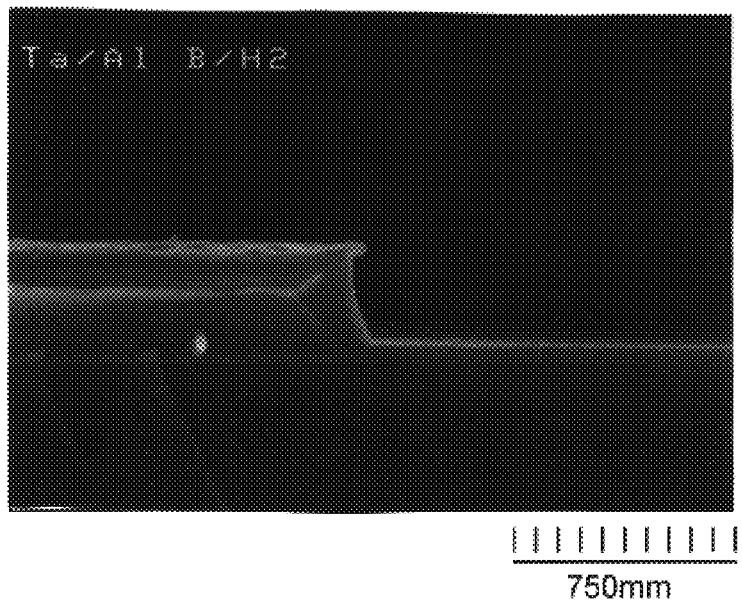
*FIG. 5A* PHOTOGRAPH OF SEM OBSERVATION
(CROSS - SECTION)
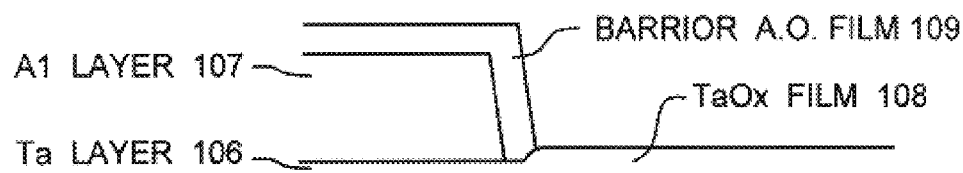
*FIG. 5B* SCHEMATIC DIAGRAM OF PHOTOGRAPH
OF SEM OBSERVATION
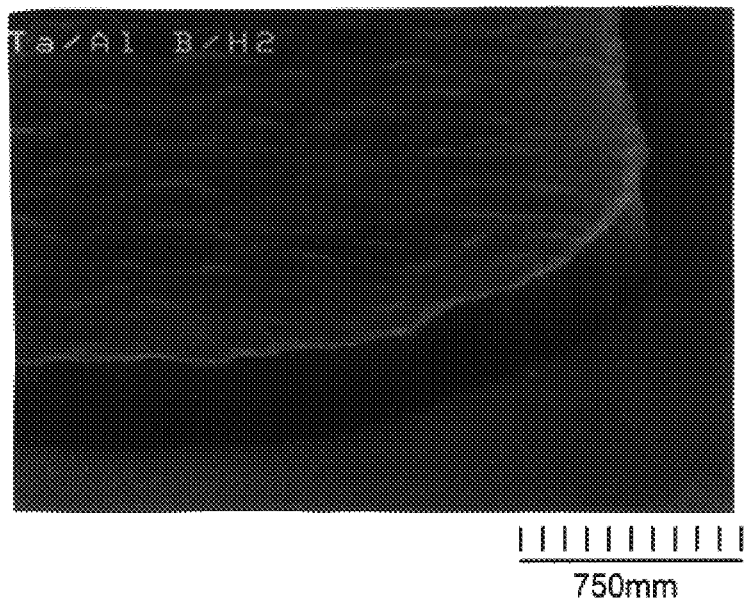
*FIG. 5C* PHOTOGRAPH OF SEM OBSERVATION
(EXTERIOR VIEW)

FIG. 6A
Z-Z' CROSS-SECTIONAL VIEW

FIG. 6C
Y-Y' CROSS-SECTIONAL VIEW

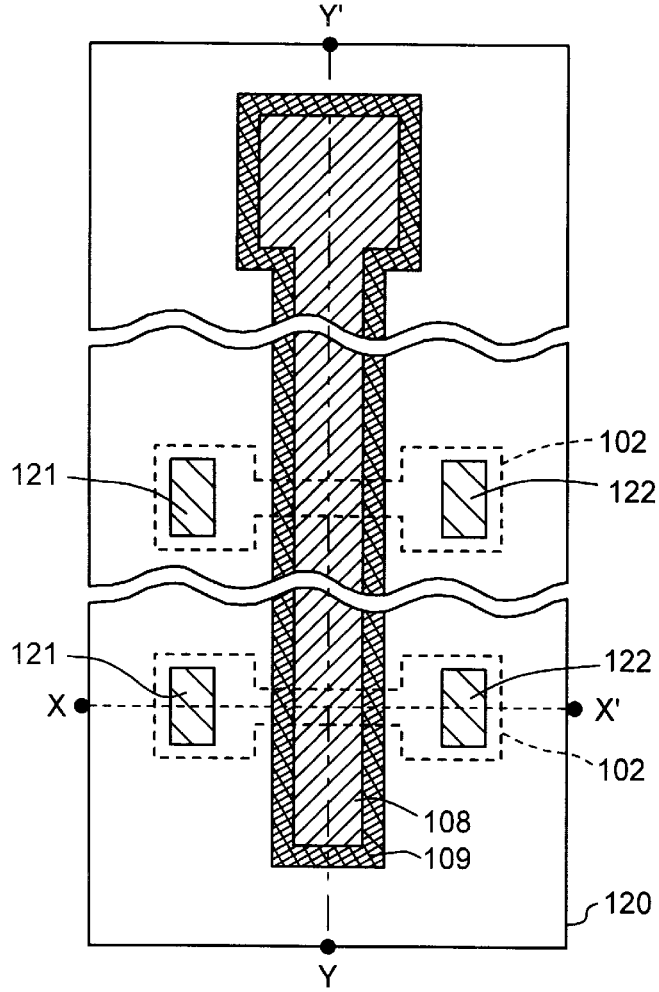
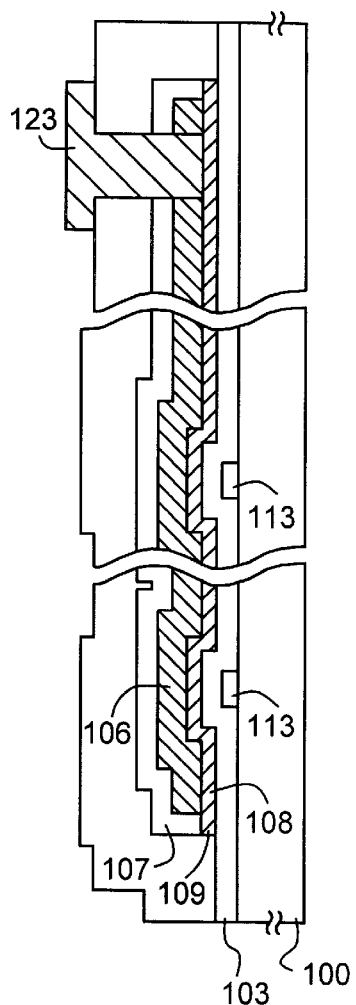

FIG. 6B
X-X' CROSS-SECTIONAL VIEW (N-CHANNEL TFT)

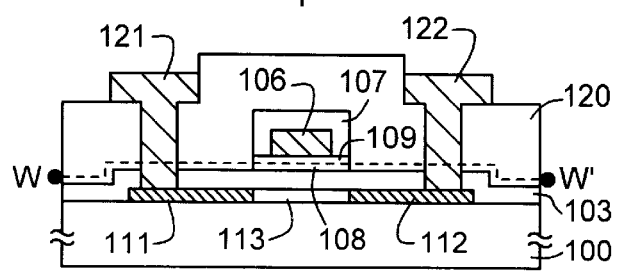

100: SUBSTRATE  102: SEMICONDCTOR LAYER  103: GATE INSULATING FILM
106: Al LAYER (SECOND WIRING LAYER)  107: BARRIER A.O. FILM (SECOND ANODIC OXIDE FILM)  108: Ta LAYER (FIRST WIRING LAYER)
109: TaOx FILM (FIRST ANODIC OXIDE FILM)  110: SOURCE REGION
112: DRAIN REGION  113: CHANNEL FORMATION REGION
120: INTERLAYER INSULATING FILM  121: SOURCE WIRING
122: DRAIN WIRING  123: LEAD ELECTRODE

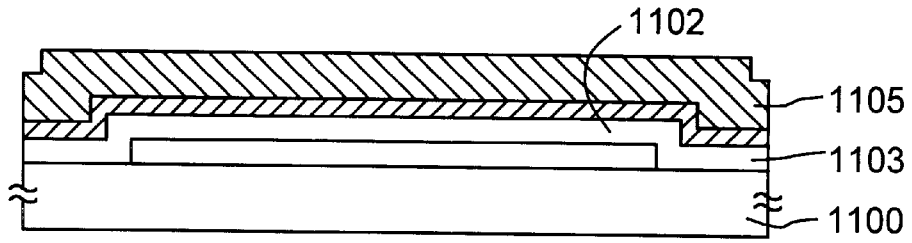
FIG. 7A  FORMATION OF FIRST AND SECOND CONDUCTIVE FILM
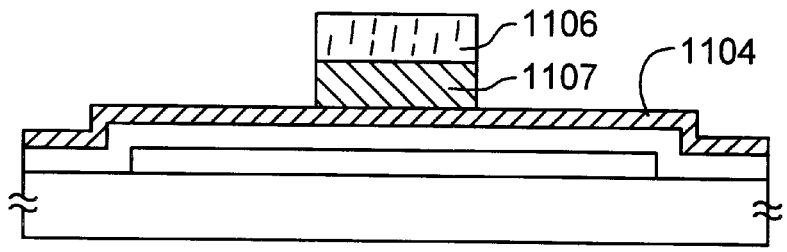
FIG. 7B  FORMATION OF SECOND WIRING LAYER
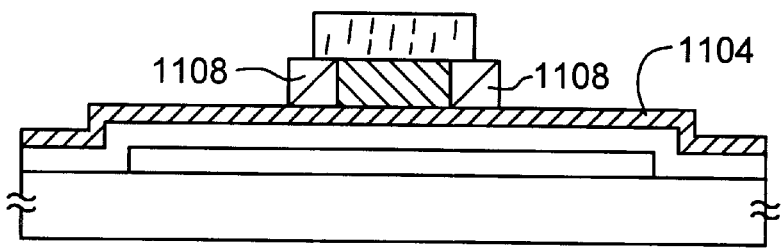
FIG. 7C  ANODIC OXIDATION STEP
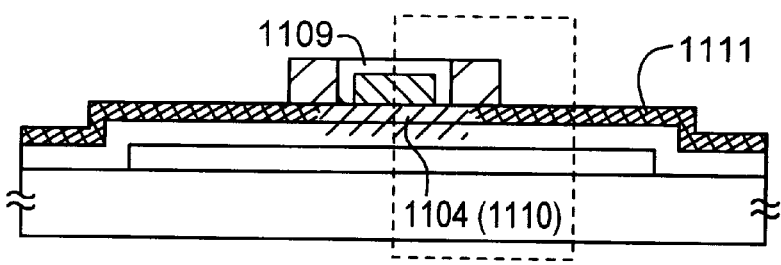
FIG. 7D  ANODIC OXIDATION STEP

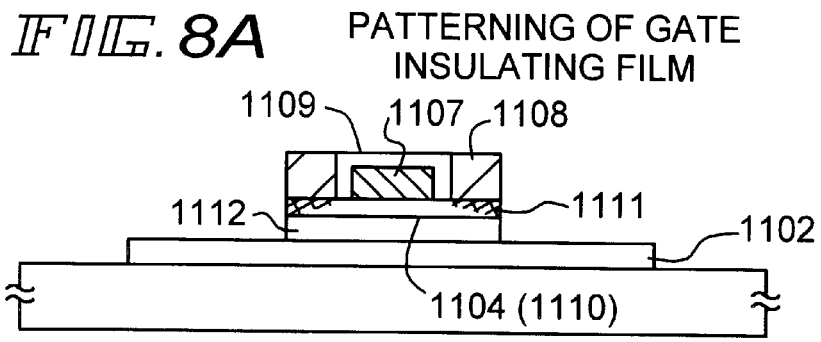
FIG. 8A PATTERNING OF GATE INSULATING FILM
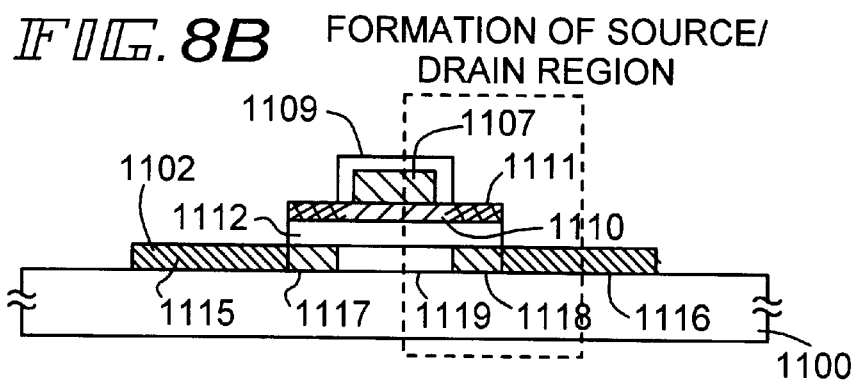
FIG. 8B FORMATION OF SOURCE/DRAIN REGION
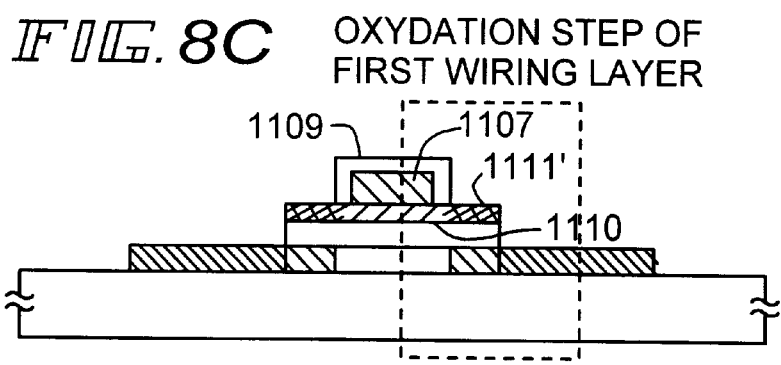
FIG. 8C OXYDATION STEP OF FIRST WIRING LAYER
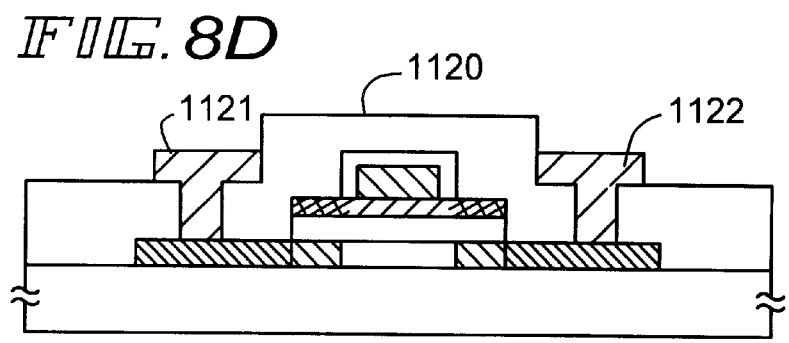
FIG. 8D

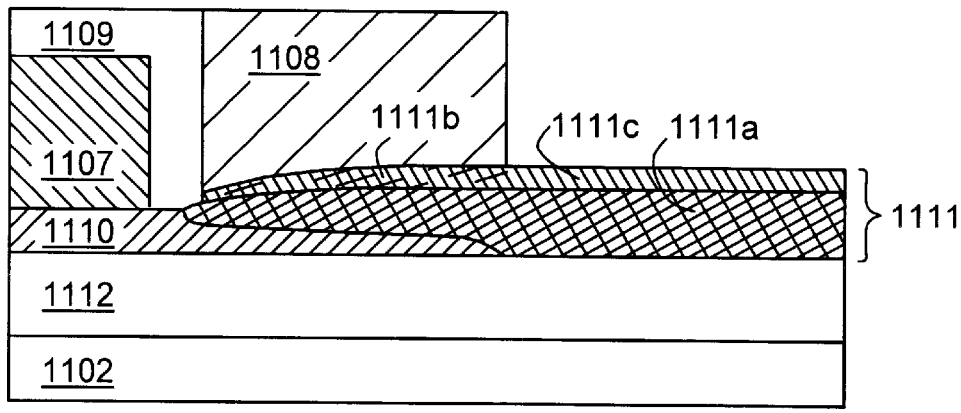
FIG. 9A  PATTERNING OF GATE INSULATING FILM
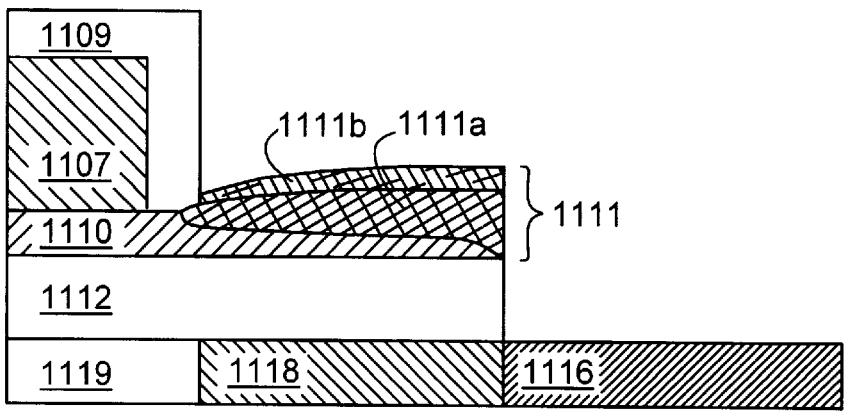
FIG. 9B  FORMATION OF SOURCE/DRAIN REGION
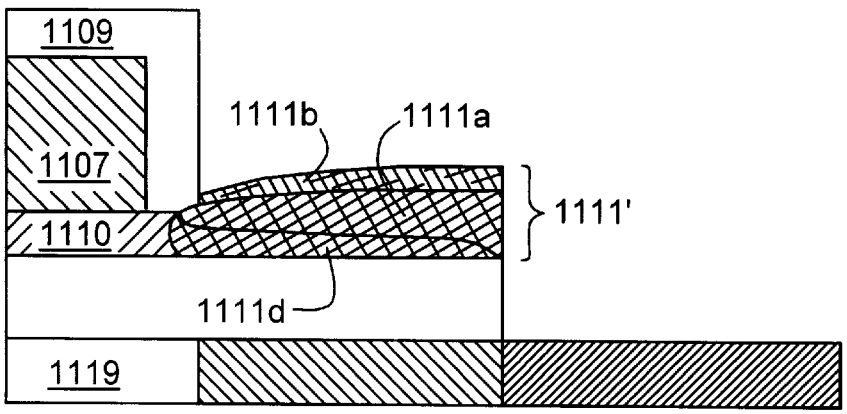
FIG. 9C  OXIDATION STEP OF FIRST WIRING LAYER

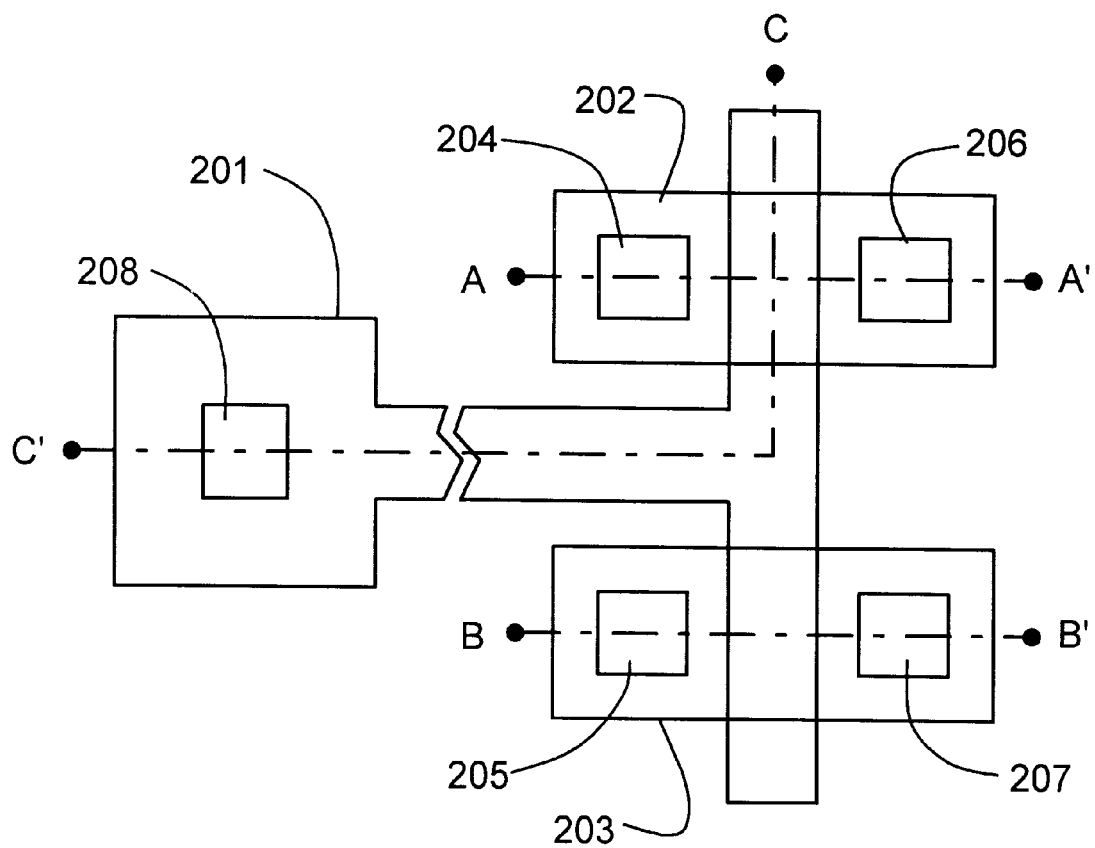
FIG. 10  P - CHANNEL TFT
201: GATE WIRING
202, 203: SEMICONDUCTOR LAYER
204, 205: SOURCE CONTACT PORTION
206, 207: DRAIN CONTACT PORTION
208: GATE CONTACT PORTION FIG. 11A STEP OF ADDING Ni

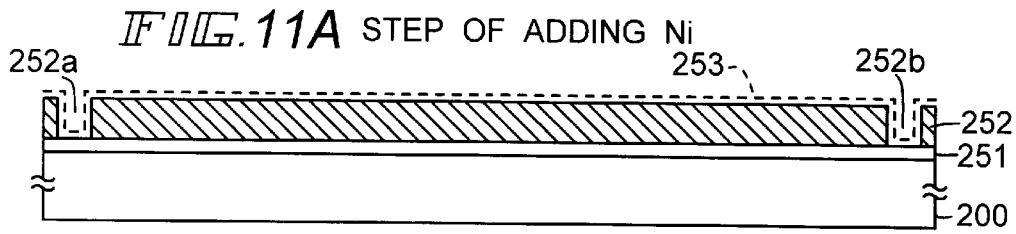

FIG. 11B CRYSTALLIZATION STEP

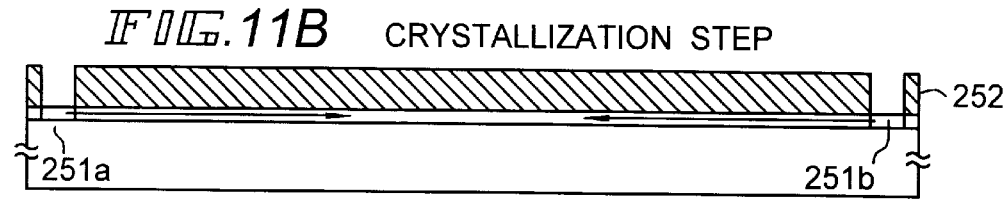

FIG. 11C FORMATION OF SEMICONDUCTOR LAYER

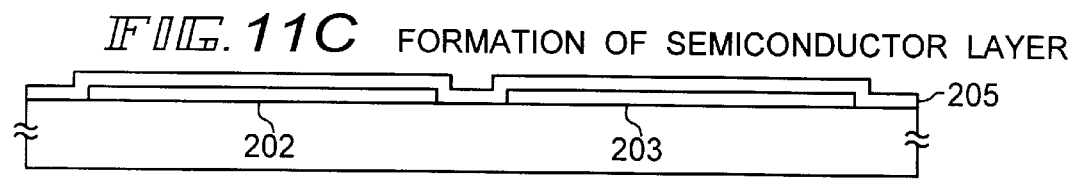

FIG. 11D FORMATION OF Ta FILM, Al FILM

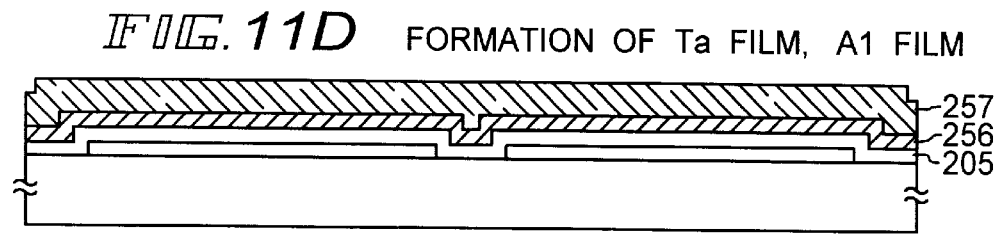

FIG. 11E FORMATION OF Al LAYER

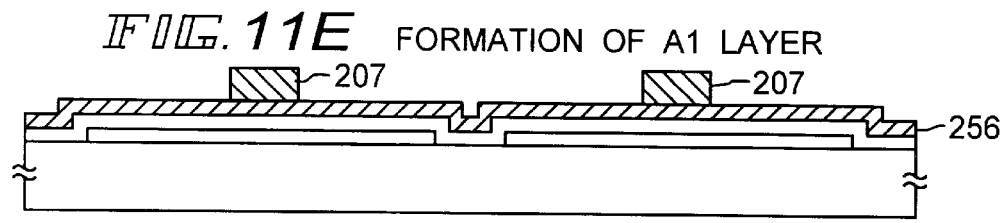

FIG. 11F ANODIC OXIDATION

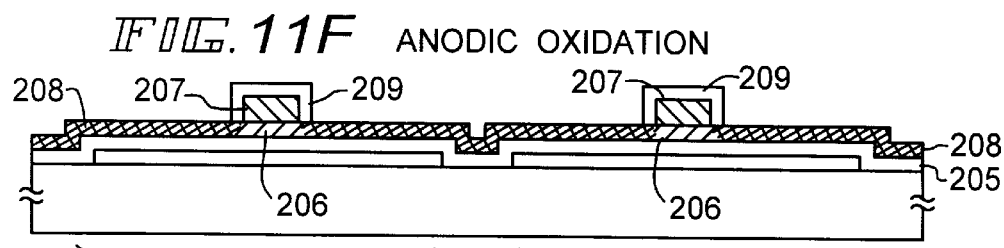

N - CHANNEL TFT    P - CHANNEL TFT
A - A' CROSS - SECTION   B - B' CROSS - SECTION

200: GLASS SUBSTRATE  202, 203: SEMICONDUCTOR LAYER
205: GATE INSULATING FILM  206: Ta LAYER (FIRST WIRING LAYER)
207: Al LAYER (SECOND WIRING LAYER)  208: Ta Ox FILM
209: BARRIER A. O. FILM  251: AMORPHOUS SILICON FILM
252: MASK INSULATING FILM  253: Ni LAYER
256: Ta FILM  257: Al FILM

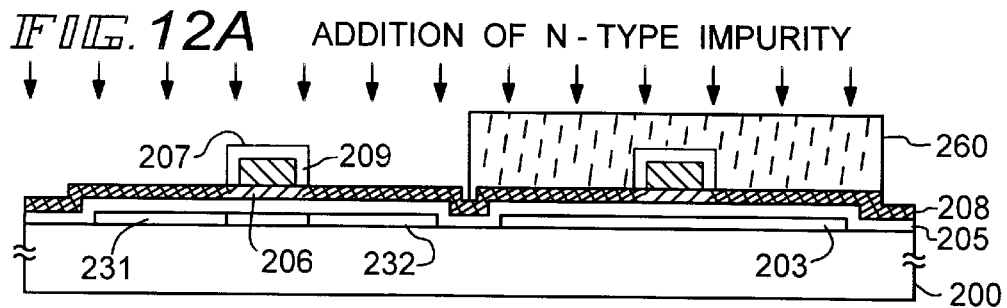

FIG. 12A ADDITION OF N-TYPE IMPURITY

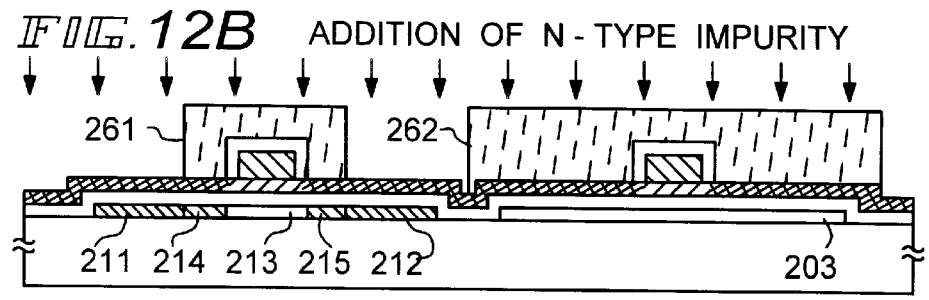

FIG. 12B ADDITION OF N-TYPE IMPURITY

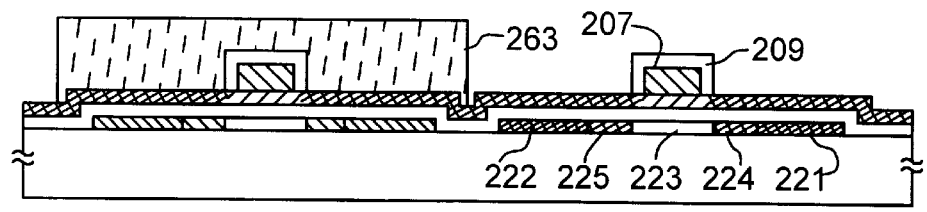

FIG. 12C ADDITION OF P-TYPE IMPURITY

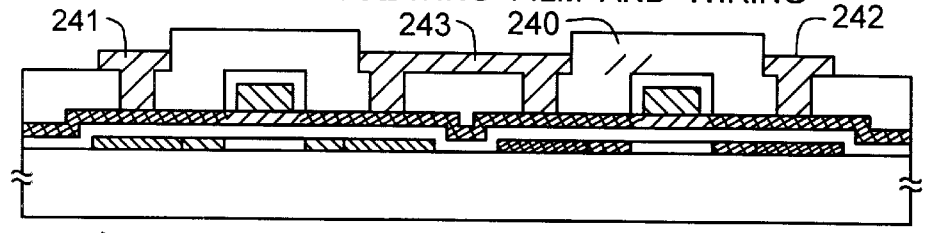

FIG. 12D FORMATION OF INTERLAYER INSULATING FILM AND WIRING

N-CHANNEL TFT  
A-A' CROSS-SECTION

P-CHANNEL TFT  
B-B' CROSS-SECTION

200: GLASS SUBSTRATE    205: GATE INSULATING FILM  
206: Ta LAYER (FIRST WIRING LAYER)  
207: Al LAYER (SECOND WIRING LAYER)    208: Ta Ox FILM  
209: BARRIER A. O. FILM    211: SOURCE REGION (N-TYPE)  
212: DRAIN REGION (N-TYPE)    213: CHANNEL FORMATION REGION  
214, 215: LIGHTLY-DOPED IMPURITY REGION  
221: SOURCE REGION (P-TYPE)  
222: DRAIN REGION (P-TYPE)    223: CHANNEL FORMATION REGION  
224, 225: LIGHTLY-DOPED IMPURITY REGION  
240: INTERLAYER INSULATING FILM  
241, 242, 243: WIRING

FIG. 13A
Z - Z' CROSS-SECTIONAL VIEW
FIG. 13C
Y - Y' CROSS-SECTIONAL VIEW
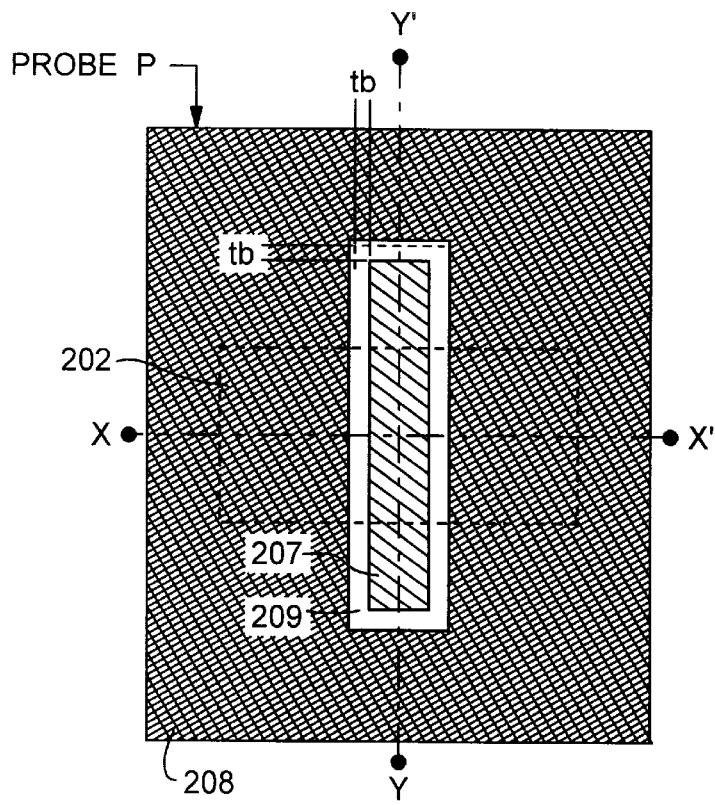
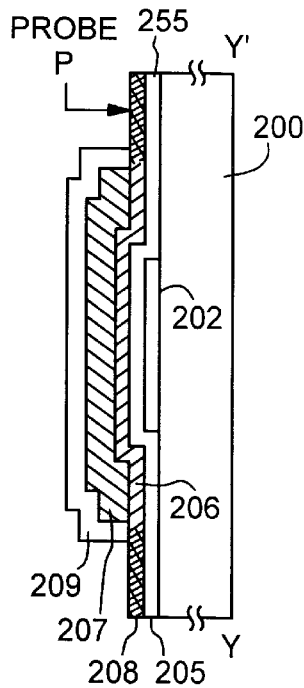
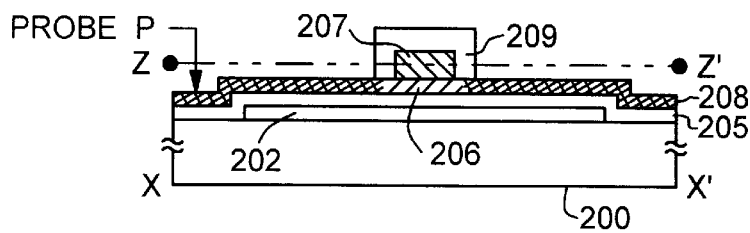
FIG. 13B
X - X' CROSS-SECTIONAL VIEW
(N - CHANNEL TFT)
200: GLASS SUBSTRATE
202: SEMICONDUCTOR LAYER
206: Ta LAYER (FIRST WIRING LAYER)
207: Al LAYER (SECOND WIRING LAYER)
208: Ta Ox FILM
209: BARRIER A. O. FILM

CROSS-SECTIONAL VIEW OF GATE ELECTRODE

N-CHANNEL TFT C-C' CROSS-SECTIONAL VIEW

200: GLASS SUBSTRATE
205: GATE INSULATING FILM
206: Ta LAYER (FIRST WIRING LAYER)
207: Al LAYER (SECOND WIRING LAYER)
208: Ta Ox FILM
209: BARRIER A. O. FILM
212: DRAIN REGION (N-TYPE)
213: CHANNEL FORMATION REGION
215: LIGHTLY-DOPED IMPUNITY REGION
240: INTERLAYER INSULATING FILM
244: LEAD WIRING

N - CHANNEL TFT
C - C' CROSS - SECTIONAL VIEW

200: GLASS SUBSTRATE
205: GATE INSULATING FILM
206: Ta LAYER (FIRST WIRING LAYER)
207: A1 LAYER (SECOND WIRING LAYER)
208: Ta Ox FILM
209: BARRIER A. O. FILM
213: CHANNEL FORMATION REGION
240: INTERLAYER INSULATING FILM
244: LEAD WIRING

N - CHANNEL TFT  A - A' CROSS - SECTION   P - CHANNEL TFT  B - B' CROSS - SECTION

N - CHANNEL TFT
A - A' CROSS - SECTION

P - CHANNEL TFT
B - B' CROSS - SECTION

N - CHANNEL TFT
A - A' CROSS - SECTION

P - CHANNEL TFT
B - B' CROSS - SECTION

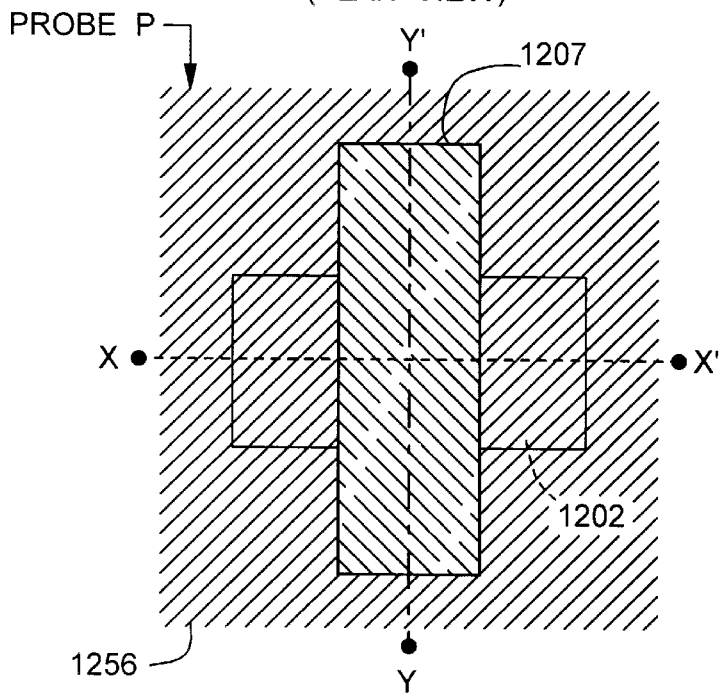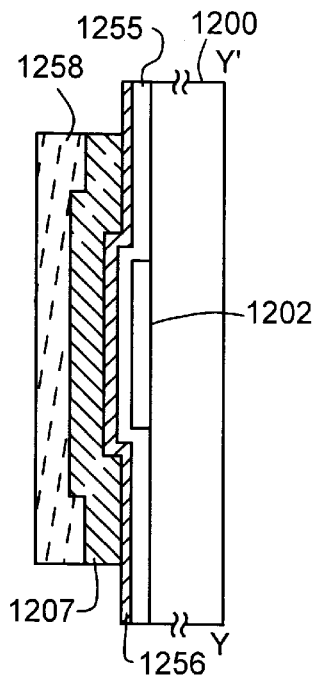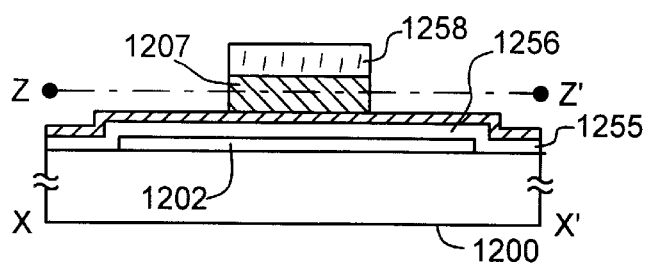

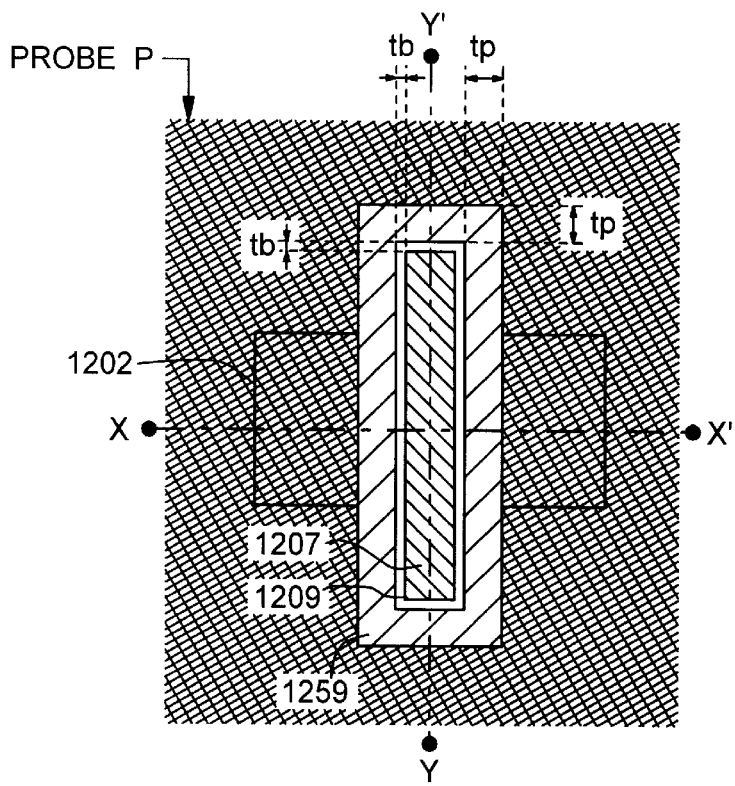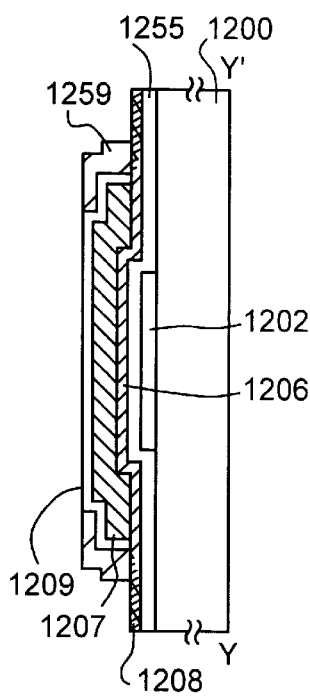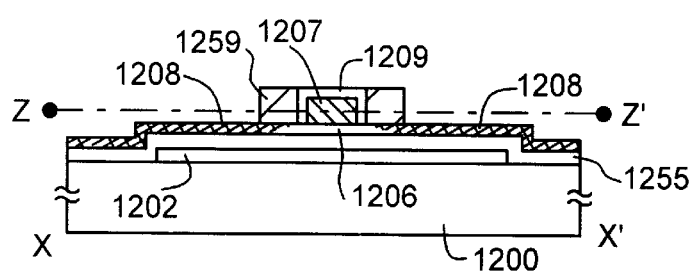

Z-Z' CROSS-SECTIONAL VIEW (PLAN VIEW)

Y-Y' CROSS-SECTIONAL VIEW

X-X' CROSS-SECTIONAL VIEW (N-CHANNEL TFT)

N - CHANNEL TFT
C - C' CROSS - SECTIONAL VIEW

FIG. 26 HEAT TREATMENT FOR GETTERING

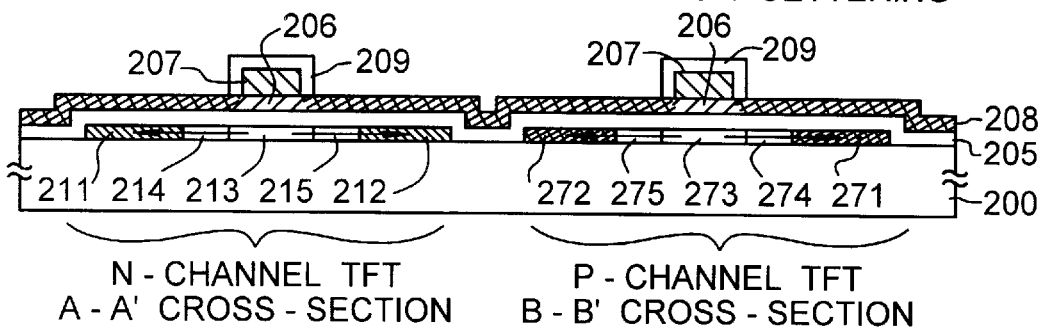

N - CHANNEL TFT
A - A' CROSS - SECTION

P - CHANNEL TFT
B - B' CROSS - SECTION

200: GLASS SUBSTRATE  205: GATE INSULATING FILM
206: Ta LAYER (FIRST WIRING LAYER)
207: Al LAYER (SECOND WIRING LAYER)
208: Ta Ox FILM    209: BARRIER A. O. FILM
271: SOURCE REGION (P TYPE)  272: DRAIN REGION (P TYPE)
273: CHANNEL FORMATION REGION
274, 275: LIGHTLY - DOPED IMPURITY REGION

FIG. 27A FORMATION OF P ADDING REGION

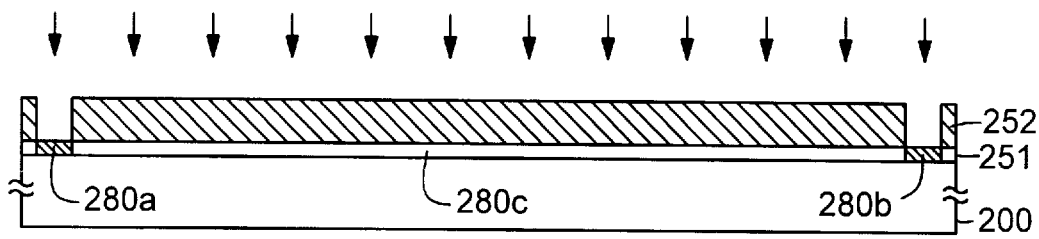

FIG. 27B THERMAL TREATMENT FOR GETTERING

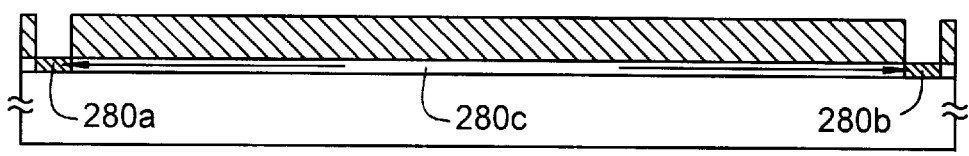

FIG. 27C FORMATION OF SEMICONDUCTOR LAYER

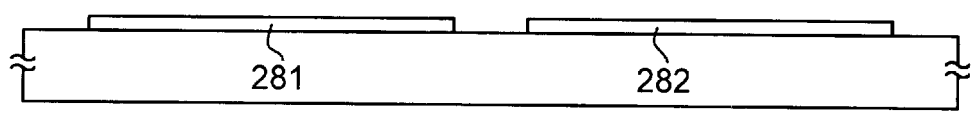

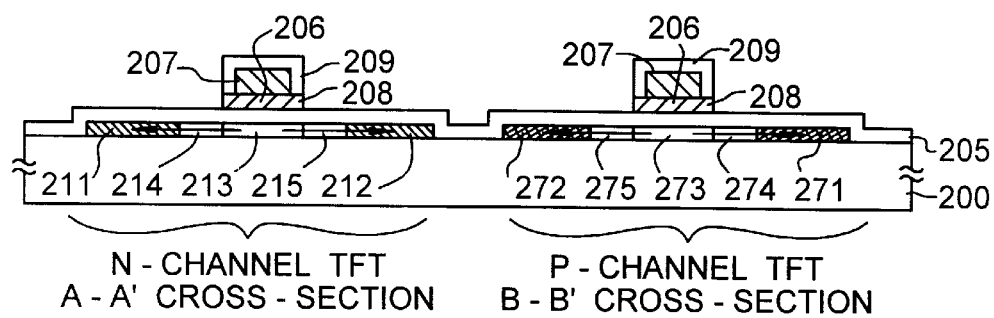
FIG. 28 THERMAL TREATMENT FOR GETTERING
N - CHANNEL TFT
A - A' CROSS - SECTION
P - CHANNEL TFT
B - B' CROSS - SECTION
200: GLASS SUBSTRATE   205: GATE INSULATING FILM
206: Ta LAYER (FIRST WIRING LAYER)
207: Al LAYER (SECOND WIRING LAYER)
208: Ta Ox FILM      209: BARRIER A. O. FILM
271: SOURCE REGION (P TYPE)   272: DRAIN REGION (P TYPE)
273: CHANNEL FORMATION REGION
274, 275: LIGHTLY - DOPED IMPURITY REGION

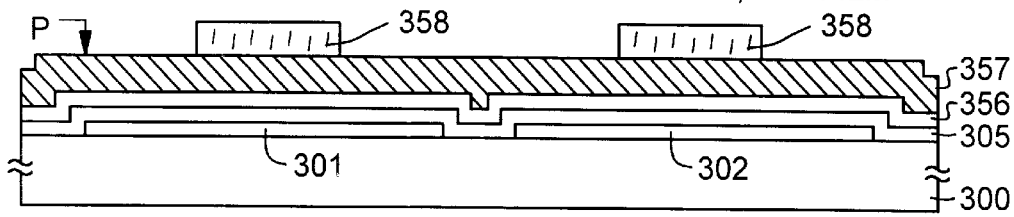
FIG. 29A FORMATION OF Ta FILM, A1 FILM
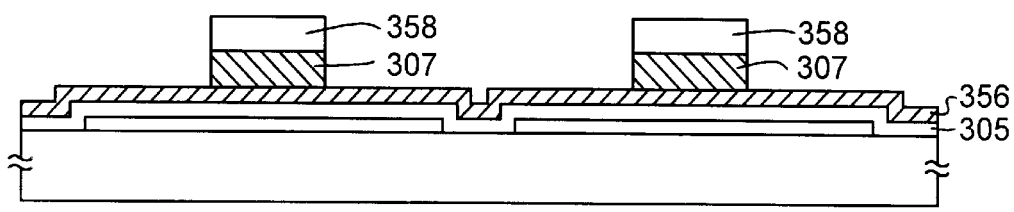
FIG. 29B FORMATION OF A1 LAYER
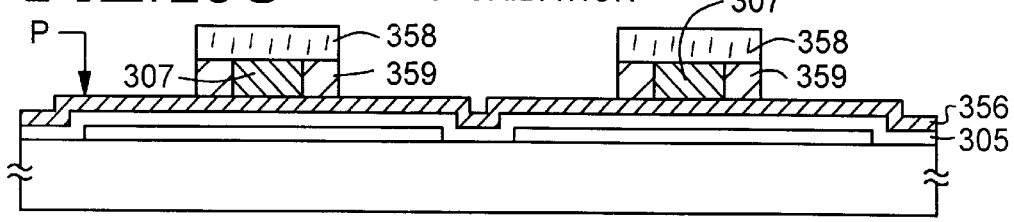
FIG. 29C ANODIC OXIDATION
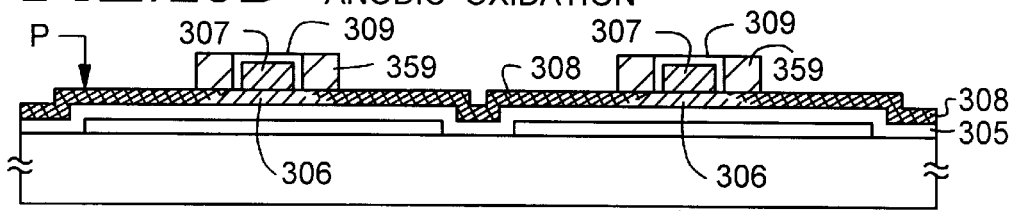
FIG. 29D ANODIC OXIDATION
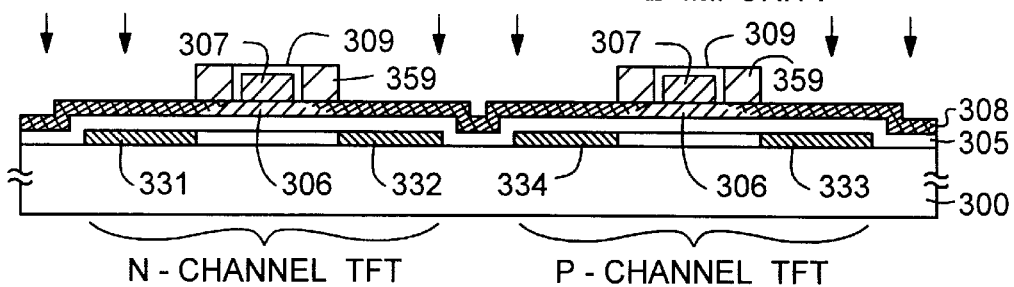
FIG. 29E ADDITION OF N-TYPE IMPURITY
300: GLASS SUBSTRATE  302, 303: SEMICONDUCTOR LAYER
305: GATE INSULATING FILM  306: Ta LAYER (FIRST WIRING LAYER)
307: A1 LAYER (SECOND WIRING LAYER)  308: Ta Ox FILM
309: BARRIER A.O. FILM  359: POROUS A.O. FILM

FIG. 30A ADDITION OF N-TYPE IMPURITY

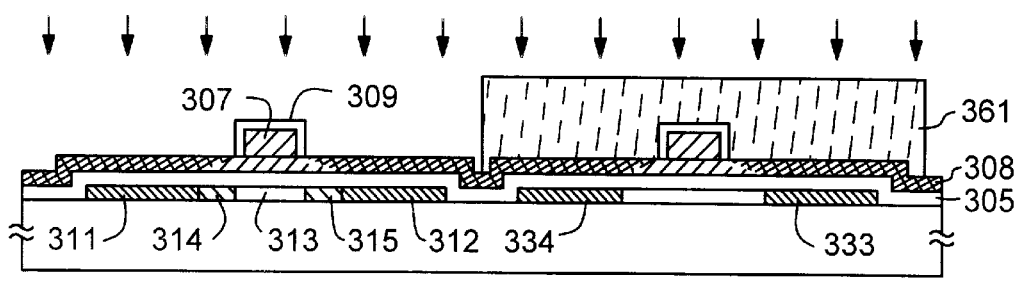

FIG. 30B ADDITION OF P-TYPE IMPURITY

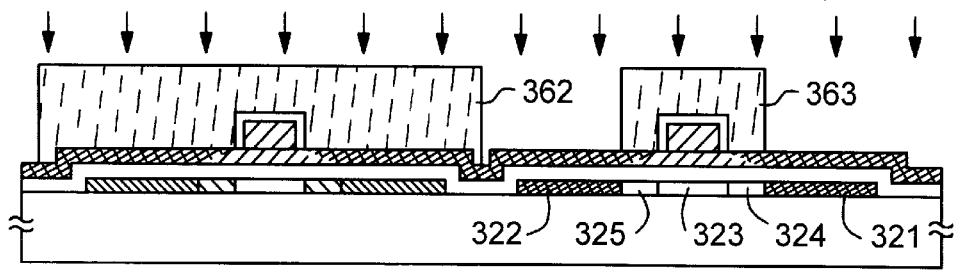

FIG. 30C THERMAL OXIDATION OF Ta LAYER

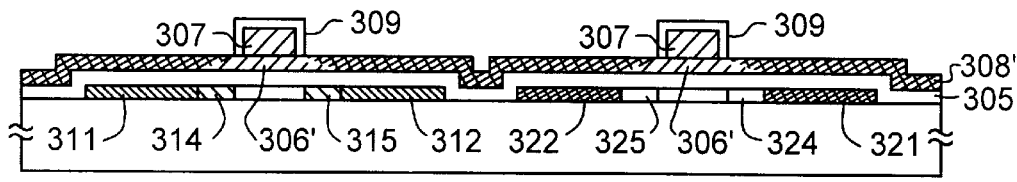

FIG. 30D FORMATION OF INTERLAYER INSULATING FILM, WIRING

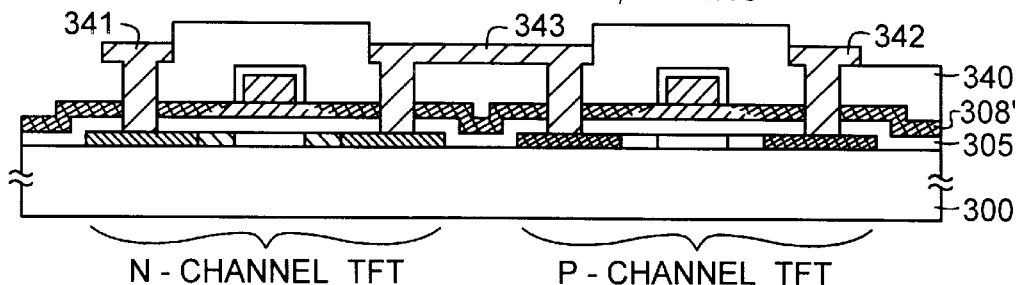

N - CHANNEL TFT    P - CHANNEL TFT

300: GLASS SUBSTRATE    305: GATE INSULATING FILM
306, 306': Ta LAYER (FIRST WIRING LAYER)
307: A1 LAYER (SECOND WIRING LAYER)    308, 308': Ta Ox FILM
309: BARRIER A. O. FILM    311: SOURCE REGION (N - TYPE)
312: DRAIN REGION (N - TYPE)    313: CHANNEL FORMATION REGION
314, 315: LIGHTLY - DOPED IMPURITY REGION
321: SOURCE REGION (P - TYPE)    322: DRAIN REGION (P - TYPE)
323: CHANNEL FORMATION REGION    324, 325: OFF - SET REGION
340: INTERLAYER INSULATING FILM    341, 342, 343: WIRING
359: POROUS A. O. FILM

FIG. 31A
Z-Z' CROSS-SECTIONAL VIEW (PLAN VIEW)
FIG. 31C
Y-Y' CROSS-SECTIONAL VIEW
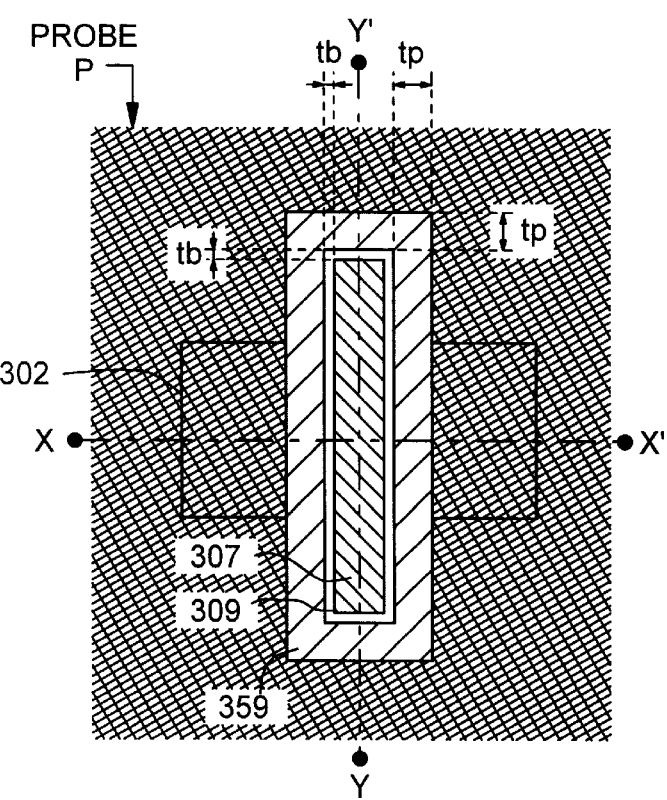
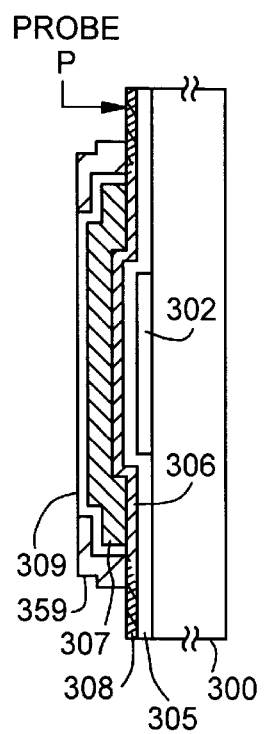
FIG. 31B
X-X' CROSS-SECTIONAL VIEW (N-CHANNEL TFT)
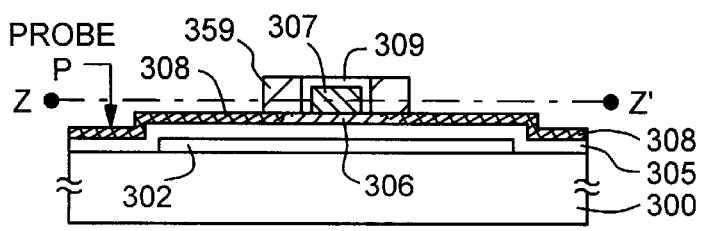
300: GLASS SUBSTRATE   302: SEMICONDUCTOR LAYER
305: GATE INSULATING FILM   306: Ta LAYER (FIRST WIRING LAYER)
307: Al LAYER (SECOND WIRING LAYER)   308: Ta Ox FILM
309: BARRIER A.O. FILM   359: POROUS A.O. FILM

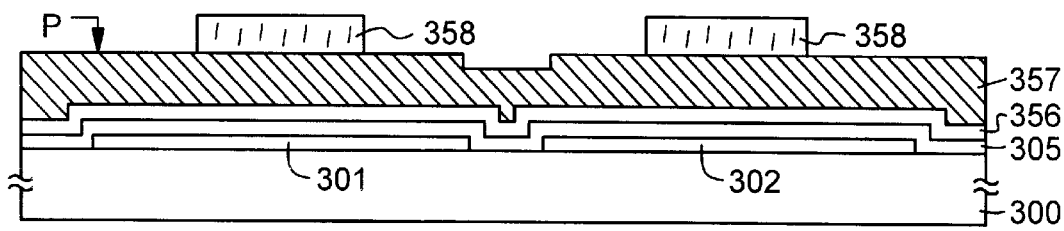
FIG. 32A  FORMATION OF Ta FILM, A1 LAYER
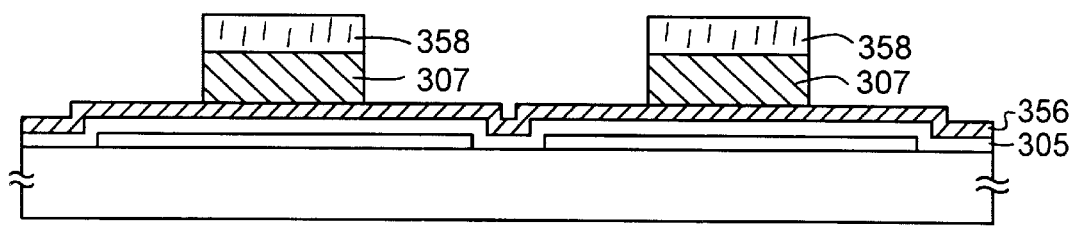
FIG. 32B  FORMATION OF A1 LAYER
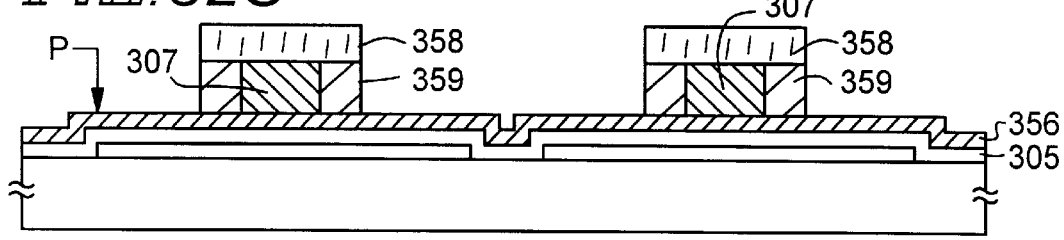
FIG. 32C  ANODIC OXIDATION
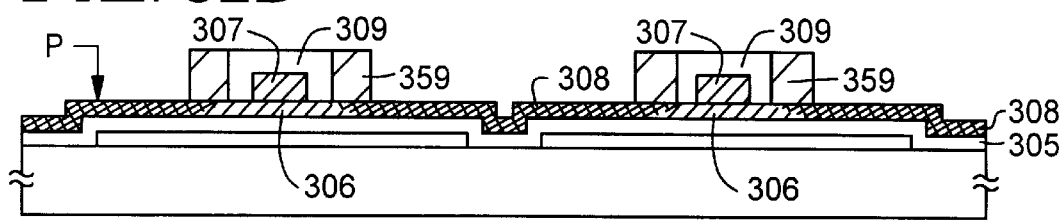
FIG. 32D  ANODIC OXIDATION
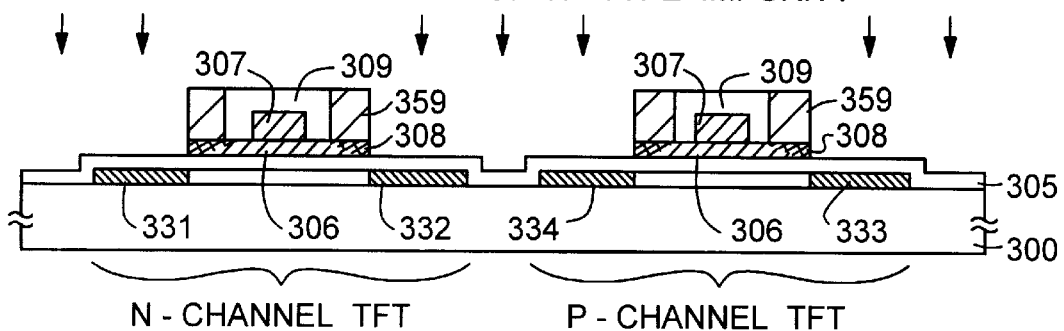
FIG. 32E  PATTERNING OF Ta Ox FILM, ADDITION OF N-TYPE IMPURITY

FIG. 33A  PATTERNING OF Ta Ox FILM, ADDITION OF N - TYPE IMPURITY

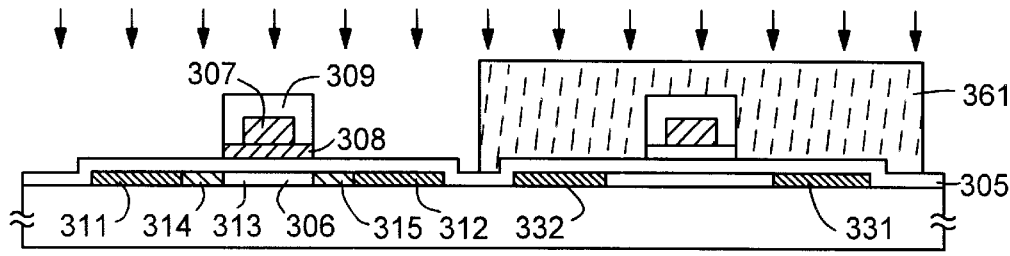

FIG. 33B  ADDITION OF P - TYPE IMPURITY

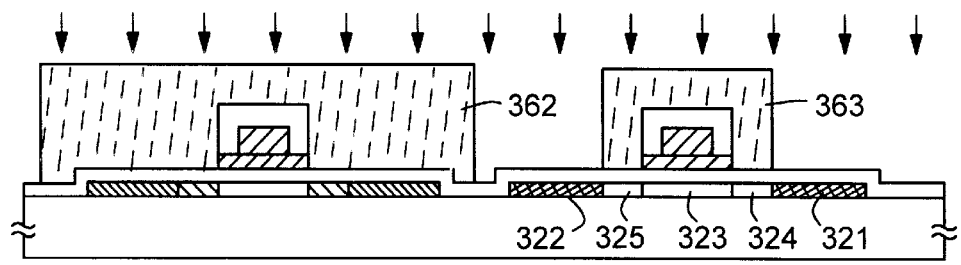

FIG. 33C  FORMATION OF INTERLAYER INSULATING FILM, WIRING

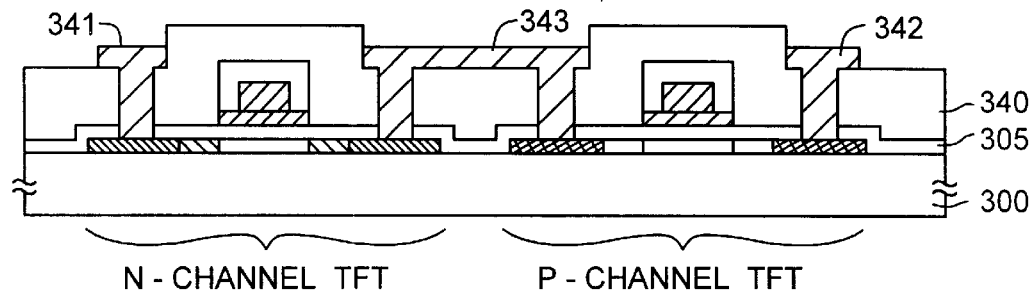

N - CHANNEL TFT    P - CHANNEL TFT

300: GLASS SUBSTRATE    305: GATE INSULATING FILM
306, 306': Ta LAYER (FIRST WIRING LAYER)
307: Al LAYER (SECOND WIRING LAYER)    308, 308': Ta Ox FILM
309: BARRIER A.O. FILM    311: SOURCE REGION (N - TYPE)
312: DRAIN REGION (N - TYPE)   313: CHANNEL FORMATION REGION
314, 315: LIGHTLY - DOPED IMPURITY REGION
321: SOURCE REGION (P - TYPE)   322: DRAIN REGION (P - TYPE)
323: CHANNEL FORMATION REGION    324, 325: OFF - SET REGION
340: INTERLAYER INSULATING FILM    341, 342, 343: WIRING
359: POROUS A.O. FILM

Z-Z' CROSS-SECTIONAL VIEW (PLAN VIEW)

Y-Y' CROSS-SECTIONAL VIEW

X-X' CROSS-SECTIONAL VIEW (N-CHANNEL TFT)

300: GLASS SUBSTRATE  302: SEMICONDUCTOR LAYER
305: GATE INSULATING FILM  306: Ta LAYER (FIRST WIRING LAYER)
307: Al LAYER (SECOND WIRING LAYER)  308: Ta Ox FILM
309: BARRIER A.O. FILM  359: POROUS A.O. FILM

FIG. 35
CROSS - SECTINAL VIEW OF GATE ELECTRODE

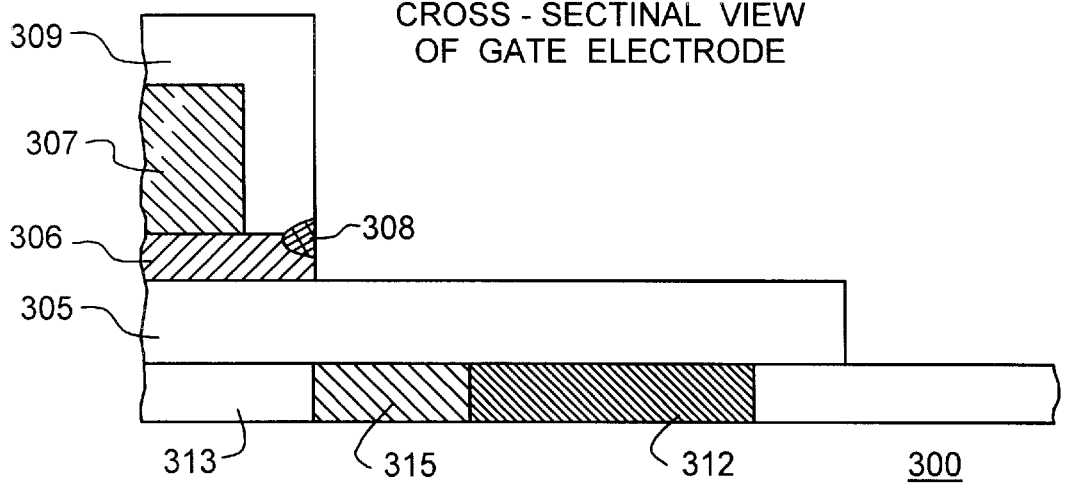

300: GLASS SUBSTRATE    305: GATE INSULATING FILM
306: Ta LAYER    307: A1 LAYER    308: Ta Ox FILM
309: BARRIER A.O. FILM  312: DRAIN REGION (N - TYPE)
313: CHANNEL FORMATION REGION
315: LIGHTLY - DOPED IMPURITY REGION

FIG. 36

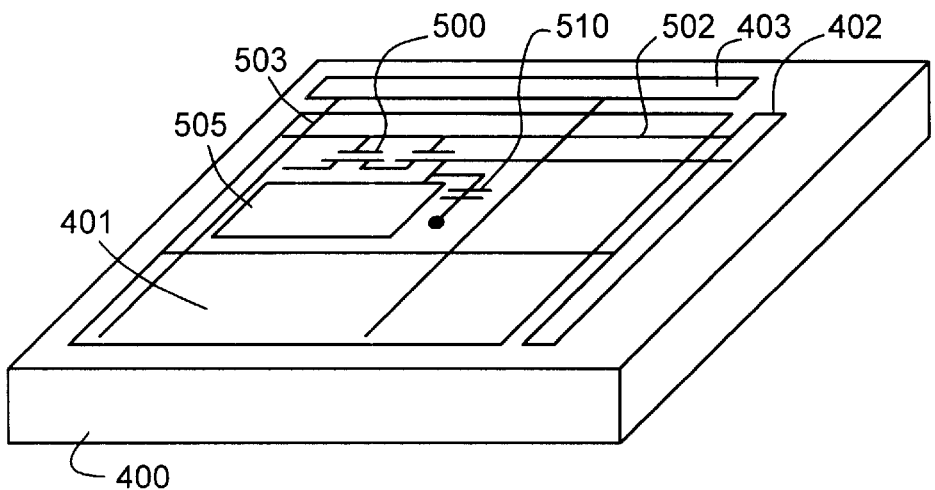

400: GLASS SUBSTRATE    401: PIXEL MATRIX CIRCUIT
402: SCANNING LINE DRIVE CIRCUIT
403: SIGNAL LINE DRIVE CIRCUIT
500: PIXEL TFT    502: SCANNING LINE
503: SIGNAL LINE    505: PIXEL ELECTRODE
510: ADDITIONAL CAPACITOR

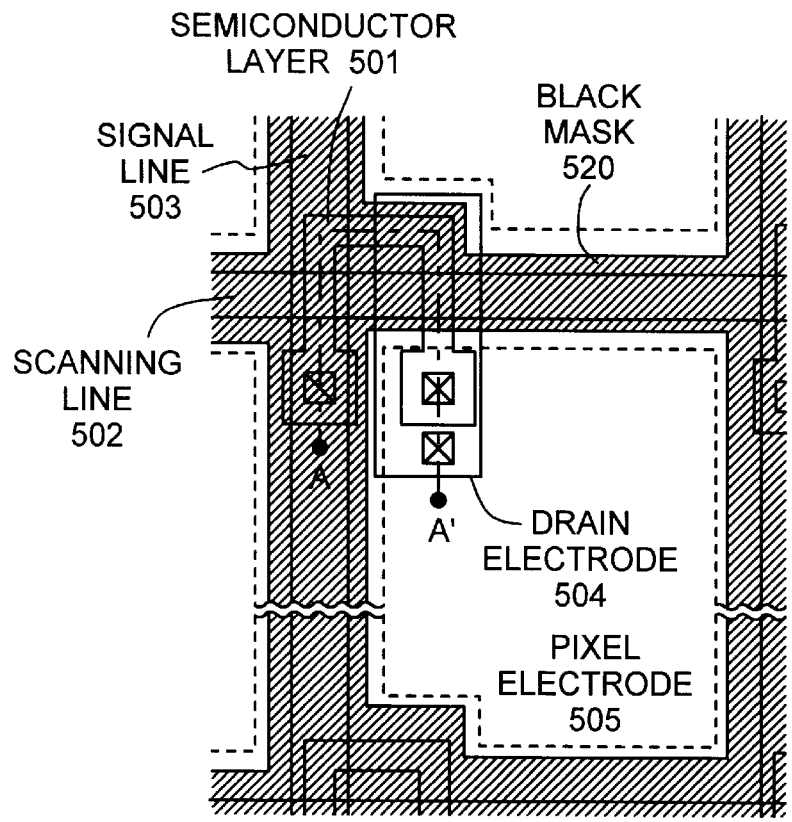
FIG. 37A PIXEL MATRIX CIRCUIT 301 PLAN VIEW
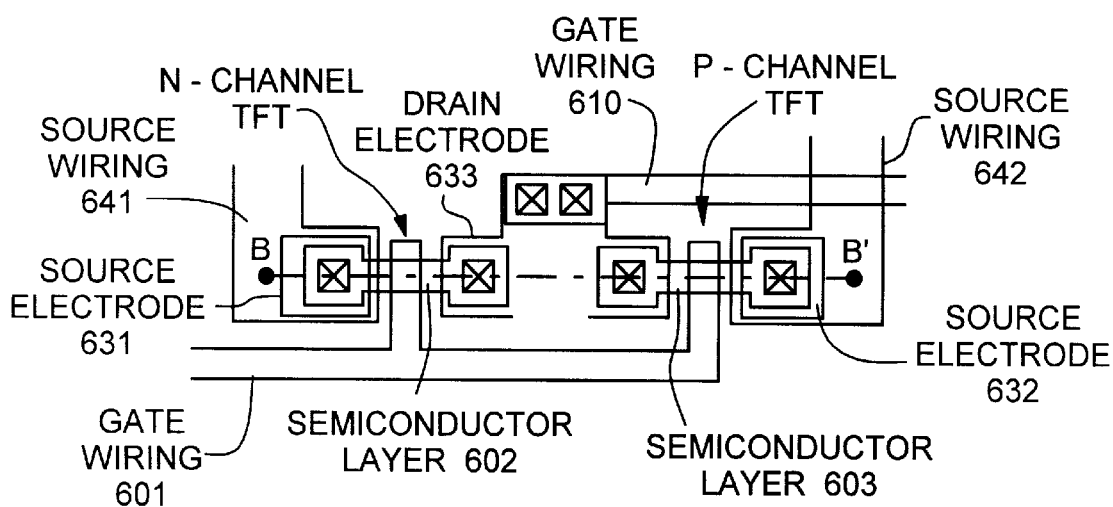
FIG. 37B PLAN VIEW OF CMOS CIRCUIT

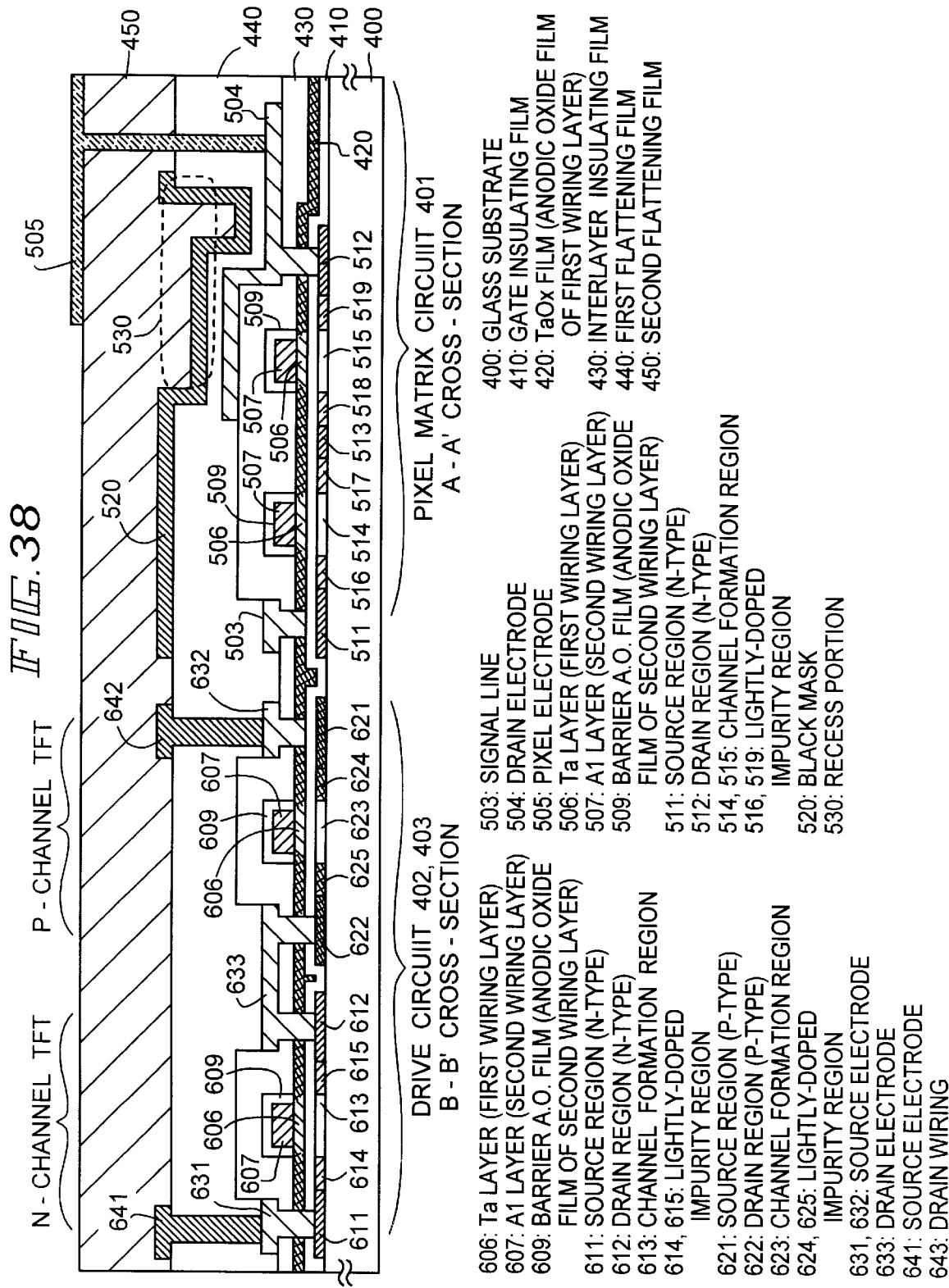

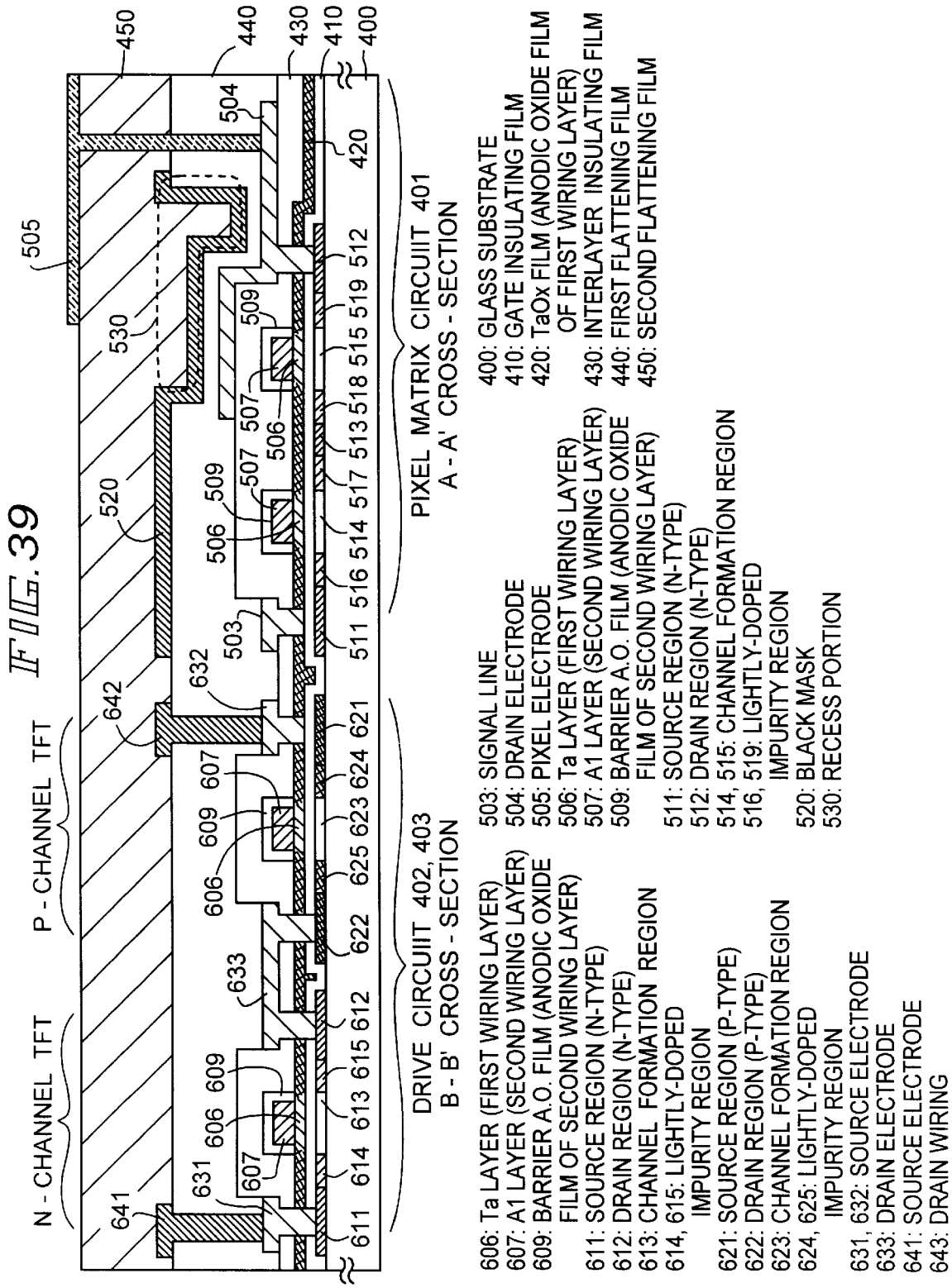

ACTIVE MATRIX SUBSTRATE
400: GLASS SUBSTRATE
401: PIXEL MATRIX CIRCUIT
402: DRIVE CIRCUIT OF GATE SIDE
403: DRIVE CIRCUIT OF SOURCE SIDE
700: OPPOSING SUBSTRATE
710: FPC
711, 712: IC CHIP
720: LOGIC CIRCUIT

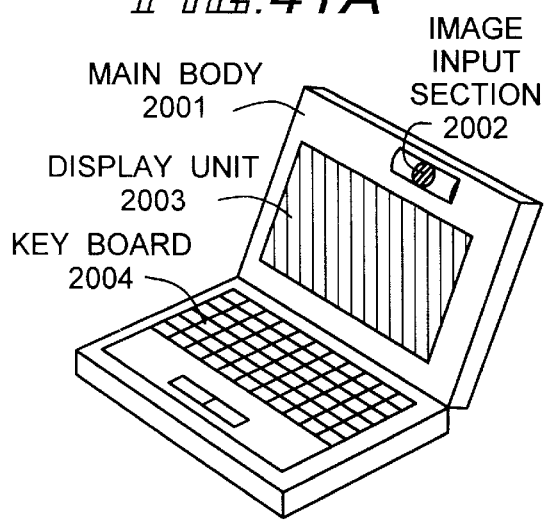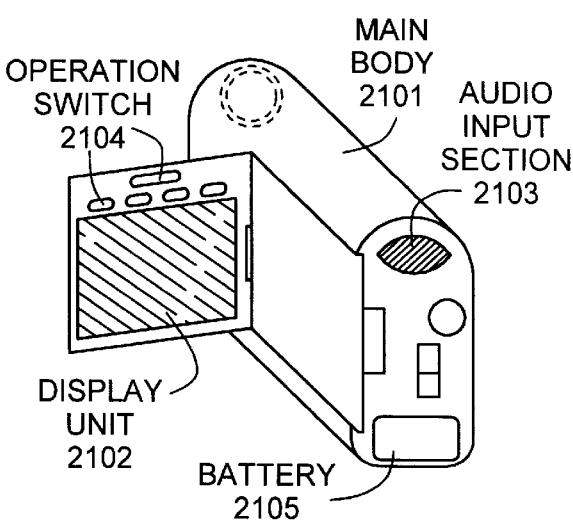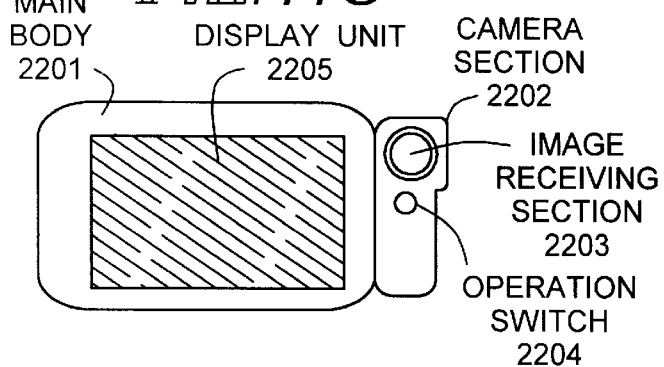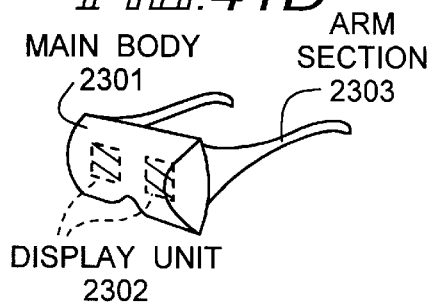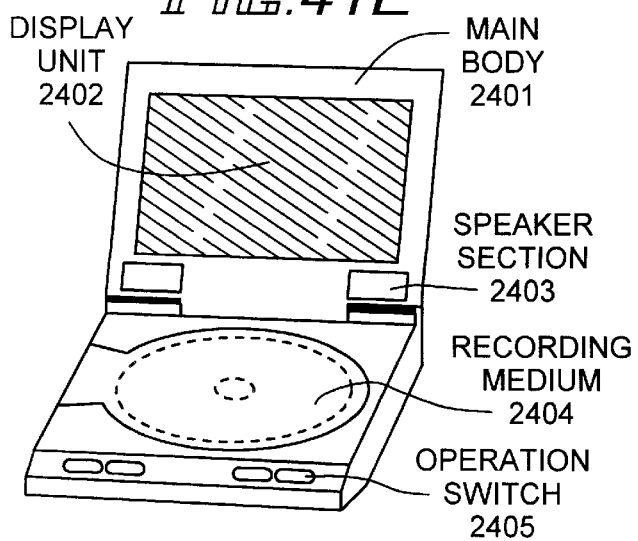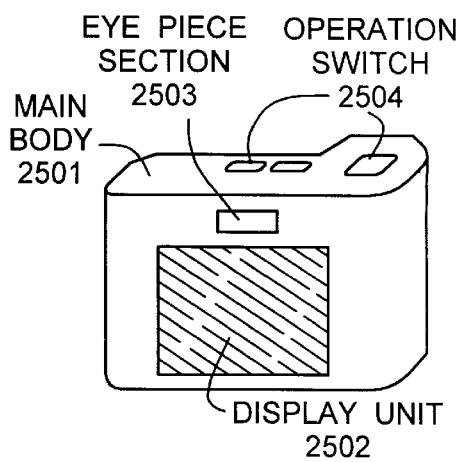

LIGHT SOURCE OPTICAL SYSTEM AND
DISPLAY UNIT (THREE-PLATE TYPE)

LIGHT SOURCE
OPTICAL SYSTEM
LENS ARRAY
2813

FIG. 43A MASK ANODIC OXIDATION
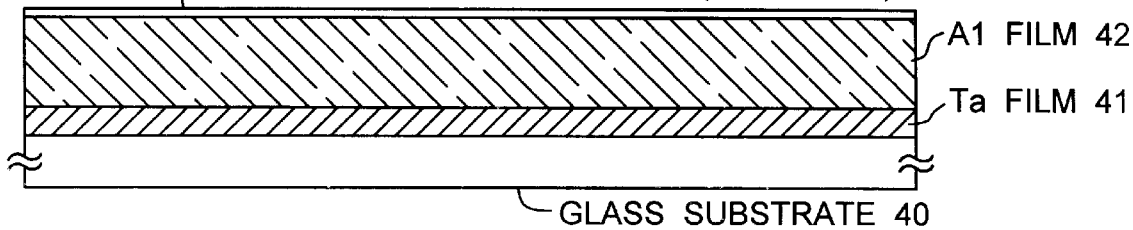
FIG. 43B FORMATION OF GATE Al PATTERN
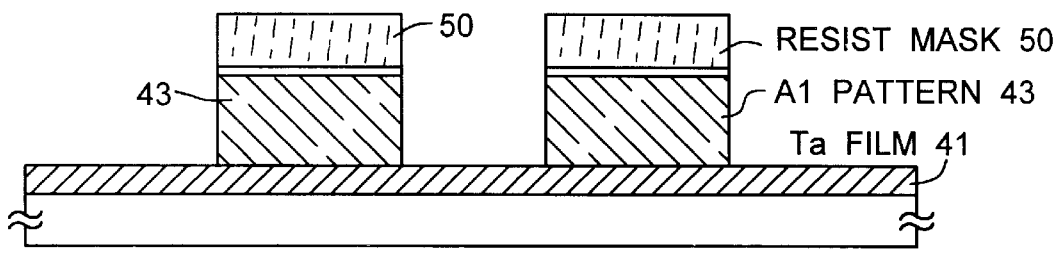
FIG. 43C SIDE ANODIC OXIDATION
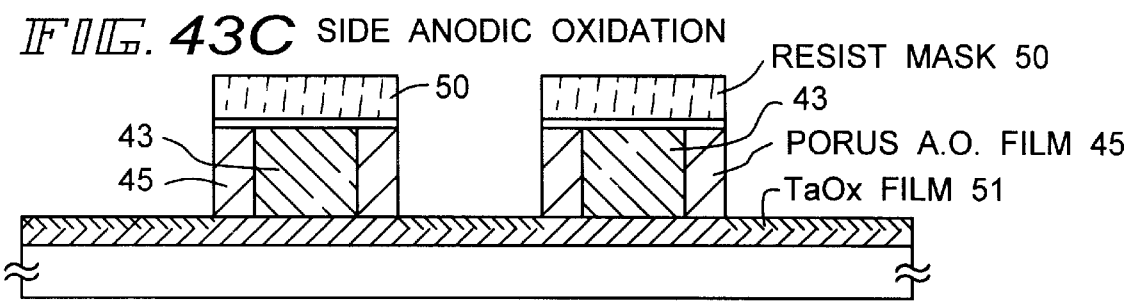
FIG. 43D BARRIER ANODIC OXIDATION
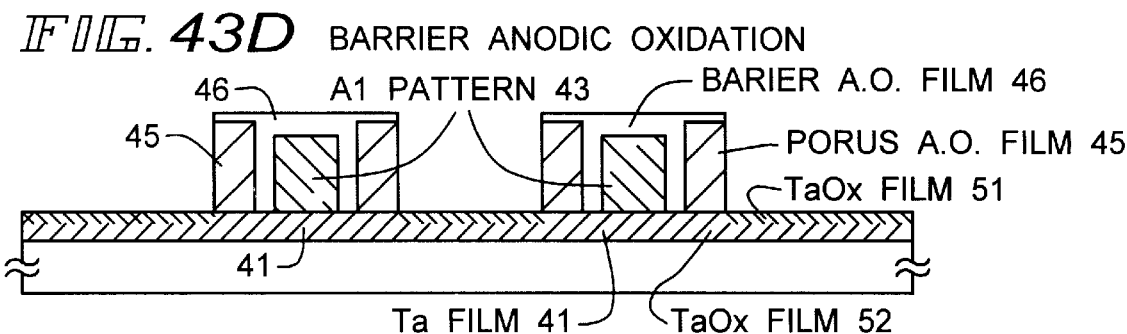
FIG. 43E REMOVAL OF PORUS A.O. FILM
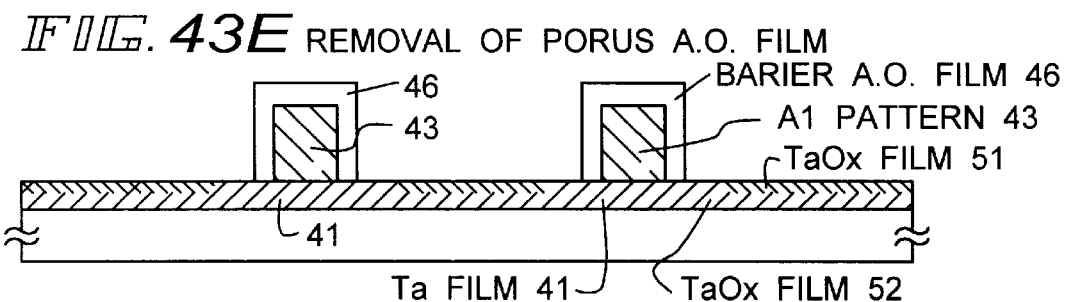

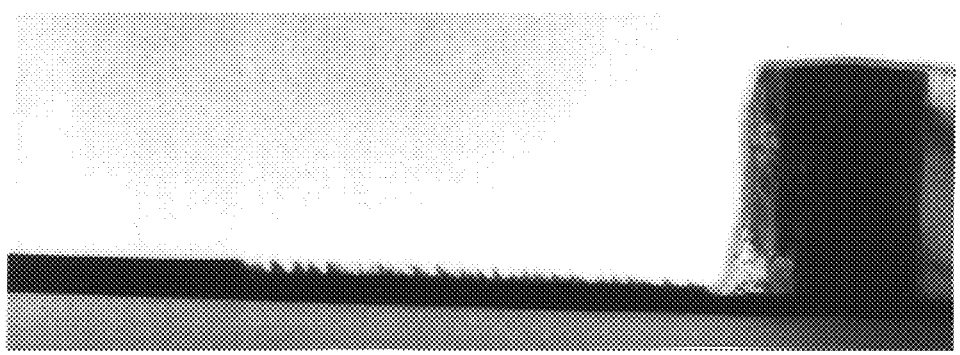
FIG. 44A PHOTOGRAPH OF TEM OBSERVATION  0.4 μm
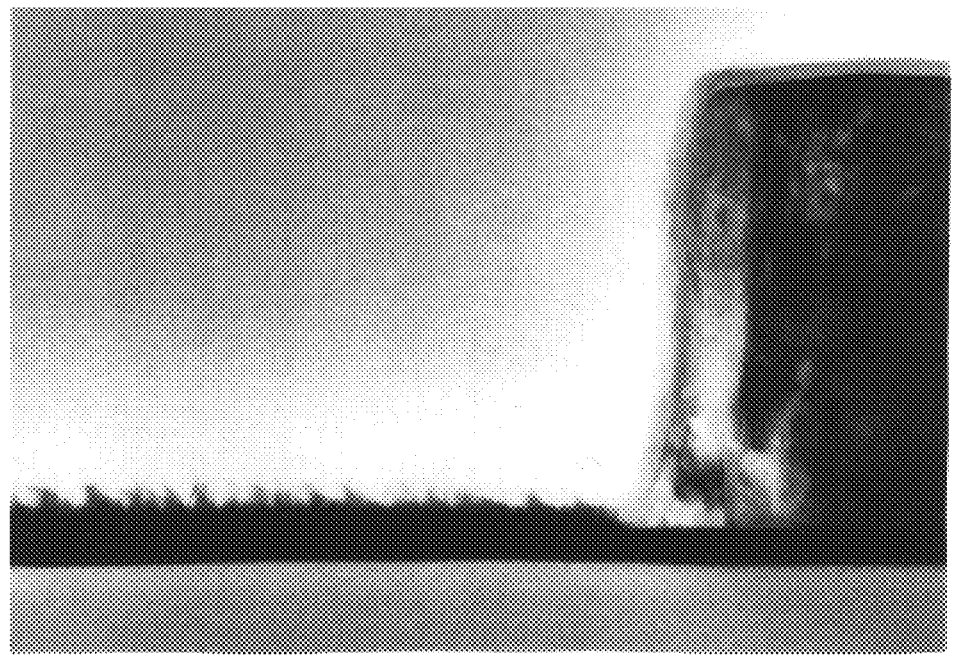
FIG. 44B PHOTOGRAPH OF TEM OBSERVATION  0.2 μm
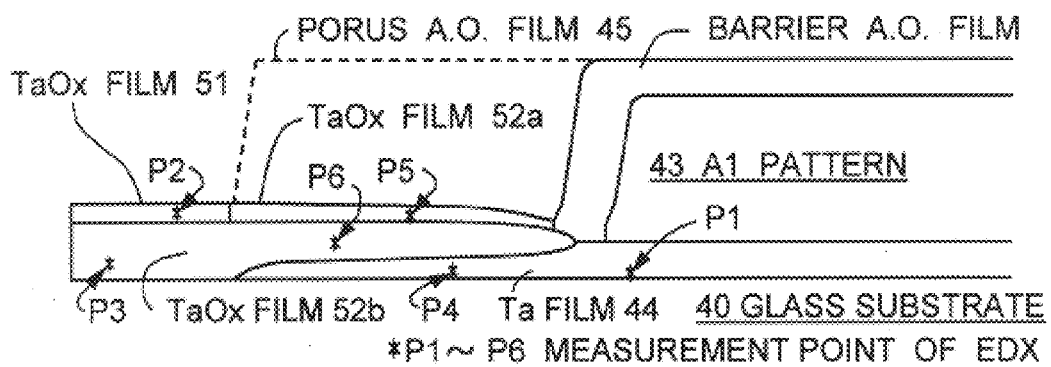
FIG. 44C SCHEMATIC DIAGRAM
*P1~P6 MEASUREMENT POINT OF EDX

FIG. 45A    SAMPLE A
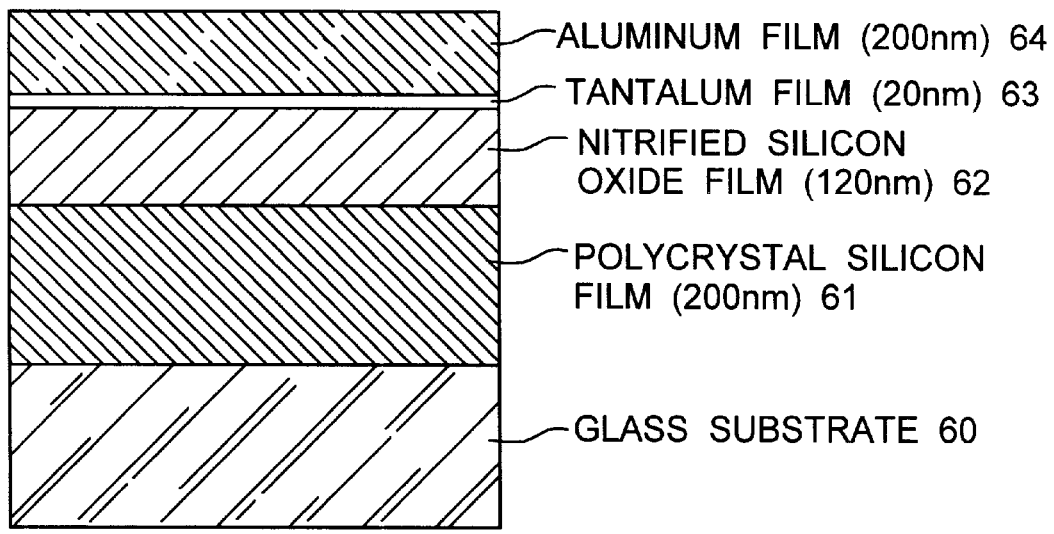
- ALUMINUM FILM (200nm) 64
- TANTALUM FILM (20nm) 63
- NITRIFIED SILICON OXIDE FILM (120nm) 62
- POLYCRYSTAL SILICON FILM (200nm) 61
- GLASS SUBSTRATE 60
FIG. 45B    SAMPLE B
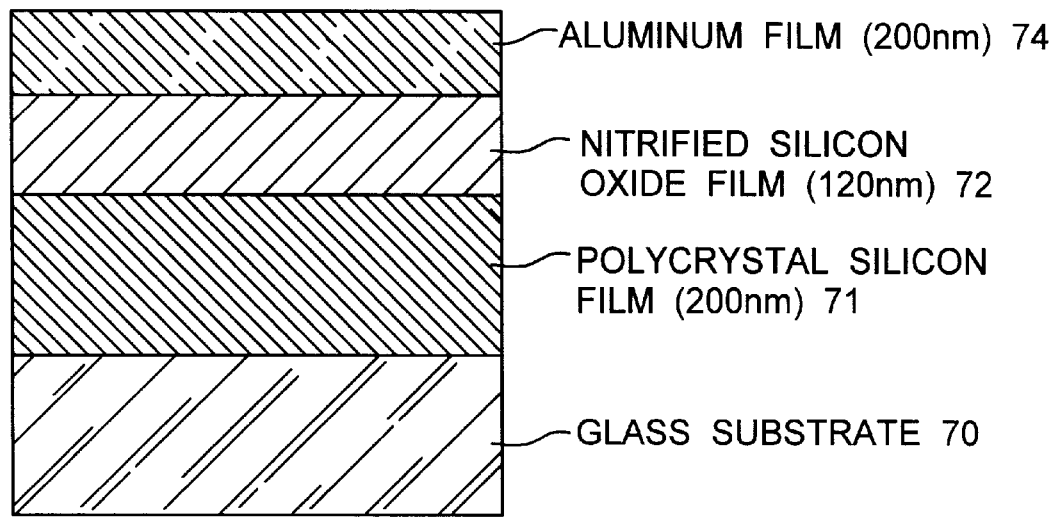
- ALUMINUM FILM (200nm) 74
- NITRIFIED SILICON OXIDE FILM (120nm) 72
- POLYCRYSTAL SILICON FILM (200nm) 71
- GLASS SUBSTRATE 70
SIMS MEASURED SAMPLES SIMS DATA OF SAMPLE A (HAVING Ta)

SIMS DATA OF SAMPLE B (WITHOUT Ta)

Ta = 0nm (SAMPLE B)

Ta = 20nm (SAMPLE A)

Ta = 30nm

Ta = 50nm

PROCESS FOR MANUFACTURING CONVENTIONAL TFT

SEMICONDUCTOR DEVICE, ACTIVE MATRIX SUBSTRATE, METHOD OF MANUFACTURING THE SEMICONDUCTOR DEVICE AND METHOD OF MANUFACTURING THE ACTIVE MATRIX SUBSTRATE

BACKGROUND OF THE INVENTION

1. Field of the Invention

The present invention relates to the structure of a semiconductor device such as an insulated gate transistor having a wiring made of an aluminum material and a method of manufacturing the semiconductor device. Also, the present invention relates to an active matrix substrate having a scanning line made of an aluminum material and a method of manufacturing the active matrix substrate.

It should be noted that the semiconductor device of the present invention includes not only elements such as a thin film transistor or a MOS transistor but also an electronic equipment having a semiconductor circuit formed of insulated gate semiconductor elements and an electronic equipment such as a personal computer or a digital camera having an electro-optic display device (representatively, a liquid crystal display device) formed of an active matrix substrate.

2. Description of the Related Art

Attention has been now paid to an active matrix liquid crystal display having a pixel matrix circuit and a drive circuit made up of a thin film transistor (hereinafter referred to as "TFT") formed on an insulating substrate. There are the liquid crystal display for a projector which is about 0.5 to 2 inches in size and the liquid crystal display for a note-type personal computer which is about 10 to 20 inches in size. Thus the liquid crystal display is used as a small-sized display or a middle-sized display.

The liquid crystal display has been so developed as to increase the display area. However, an increase in the display area causes a pixel matrix circuit which forms an image display section to increase in area, with which source wirings, gate wirings and so on which are arranged in a matrix become long, to thereby increase a wiring resistance. Further, since it is necessary to thin the wirings in response to a request for fining, an increase in the wiring resistance is more actualized. Also, a TFT is connected to the source wirings and the gate wirings for each of pixels, and an increase in the number of pixels leads to a problem that a parasitic capacitance increases. In the liquid crystal display, the gate wirings and the gate electrodes are generally integrated with each other, whereby a delay of gate signals is actualized with an increased area of the panel.

Under the above-mentioned circumstance, the gate wirings are made of a material mainly containing aluminum low in specific resistance. When the gate wirings and the gate electrodes are made of the material mainly containing aluminum, a gate delay time can be shortened, and also the TFT can be operated at a high speed. In general, in the case where the gate wirings are made of the aluminum material, aluminum is coated with an anodic oxide film so as to improve the heat resistance of the wirings.

Also, up to now, an attempt has been made that the thin film transistor is brought in an offset structure or an LDD (light doped drain) structure, to thereby reduce an off-state current. In Japanese Patent Publication No. 2759415, the present applicant teaches a technique by which the thin film transistor of the LDD structure is manufactured. The above-mentioned patent publication discloses a method in which a gate electrode made of aluminum is anodically oxidized to form the LDD structure on a semiconductor layer in a self-aligning manner. This method will be described with reference to FIGS. 49A to 49F.

An under film 11 such as a silicon oxide film is formed on a glass substrate 10. A semiconductor layer 13 consisting of a polycrystal silicon film is formed on the under film 11, and a gate insulating film 14 is formed on the semiconductor layer 13. Then, an aluminum film is formed on the upper surface and patterned by using a resist mask 16 to form a gate electrode 15 made of aluminum (FIG. 49A).

The gate electrode 15 is anodically oxidized in an electrolyte to form a porous alumina film 17. An oxalic acid aqueous solution is used for the electrolyte. Because the surface of the gate electrode 15 is covered with the resist mask 16, the porous alumina film 17 is formed only on side surfaces of the gate electrode 15. In this specification, the porous alumina film 17 is mentioned as "porous A.O. film 17" (FIG. 49B).

After the removal of the resist mask 16, the gate electrode 15 is again anodically oxidized to form a barrier (non-porous) alumina film 18. Ethylene glycol aqueous solution containing tartaric acid of several % therein is used for an electrolyte. An aluminum pattern remaining through two anodic oxidation process functions as a gate electrode 15'. In this specification, the barrier alumina film 18 is mentioned as "barrier A.O. film 18" (FIG. 49C).

Then, the gate insulating film 14 is patterned with the A.O. films 17 and 18 as a mask to form a gate insulating film 14' (FIG. 49D).

After the removal of the porous A.O. film 17, the semiconductor layer 13 is doped with impurities that give an n-type or p-type conductivity through the plasma doping method. The doping process is implemented twice. A first doping process is conducted at a low acceleration so that the gate insulating film 14' functions as a mask, and the dose amount is set to be large. A second doping process is conducted at a high acceleration so that the impurities pass through the gate insulating film 14', and the dose amount is set to be small in order to form an LDD region. In the semiconductor layer 13, a channel formation region 20, a source region 21, a drain region 22 and lightly-doped impurity regions 23, 24 are formed in a self-aligning manner. The lightly-doped impurity region 24 on the drain region 22 side constitutes the LDD region. When the gate insulating film 14' is allowed to function as a complete mask during the doping process, the regions 23 and 24 can be constituted as an offset region (FIG. 49E).

Subsequently, an interlayer insulating film 25 that covers the TFT is formed on the upper surface. Then, contact holes are opened in the interlayer insulating film 25, into which source and drain electrodes 26 and 27 are formed. Finally, a hydrogenation process is conducted to complete the TFT (FIG. 49F).

The application of an anodic oxidation process enables a TFT of the LDD structure or the offset structure to be formed in the self-aligning manner.

However, in order to conduct the anodic oxidation process, it is necessary to connect all of the electrodes and wirings to be anodically oxidized to a voltage supply wiring for anodic oxidation. For example, in the case where the technique disclosed in the above-mentioned Japanese Patent Publication is applied to the active matrix liquid crystal panel, it is necessary to connect all of the active matrix circuit and the gate electrode/wiring of the thin film transistor that constitutes a driver circuit to the voltage supply line. For achieving this connection, it is necessary to form the voltage supply wiring on the substrate, and a surplus space must be ensured.

Also, the structure is made so that the respective gate electrodes and the wirings are short-circuited by the voltage supply line at the time of anodic oxidation. Because the voltage supply line and the connection portions to the voltage supply line are not required after the anodic oxidation process, they are removed by etching so that the respective gate wirings and electrodes are cut off. To achieve this operation, a circuit arrangement must be designed taking a space in which the voltage supply line is formed and an etching process margin into consideration.

Accordingly, in manufacturing the transistor using the anodic oxidation process, the space in which the voltage supply line is formed and the etching margin are required, which impedes the high integration of the circuit and the reduction of the base area. In addition, since aluminum is exposed from the cut-off faces of the wirings, the heat resistance is deteriorated.

Also, in the TFT shown in FIGS. 49A to 49F, the operation defect of the TFT is confirmed even if a process temperature is 300 to 450° C. after the formation of the aluminum wiring. Various factors of the operation defect are presumed. In particular, it is presumed that many cases in which the operation defect occurs in a top gate TFT are caused by a protrusion such as hillock or whisker occurring at the gate electrode which penetrates the gate insulating film and reaches the channel formation region, or short-circuiting between the gate electrode and the channel which is generated by diffusing aluminum atoms in the gate insulating film.

For that reason, up to now, the upper limit of the heat temperature after the aluminum wiring has been formed is limited to about 450° C. To achieve this, in a process of activating the impurities added to the source and drain regions, it is necessary to conduct a laser activation by an excimer laser together with a thermal activation process because it is insufficient to conduct only the thermal activation process.

Also, a high mobility is demanded for the TFT at the present, and it is weightily presumed that a crystalline silicon film which is higher in mobility more than an amorphous silicon film will be used as a semiconductor layer. Up to now, in order to obtain the crystalline silicon film by a heat treatment, it is necessary to employ a quartz substrate having a high strain point. However, because the quartz substrate is expensive, crystallization at a low temperature is demanded so that an inexpensive glass substrate can be employed.

A technique by which the crystallization temperature is lowered is disclosed in Japanese Patent Application Laid-open Nos. Hei 6-232059, Hei 7-321339, and the like by the present applicant. The technique is that a slight amount of catalytic elements are introduced into an amorphous silicon film, and then a heat treatment is conducted to the film, to thereby obtain a crystallized silicon film. The catalytic elements that promote crystallization are elements selected from Fe, Co, Ni, Ru, Rh, Pd, Os, Ir, Pt, Cu, Au and Ge. The use of the above-mentioned crystallization technique makes it possible to produce a polycrystal silicon film at a process temperature which the glass substrate can withstand.

The above-mentioned crystallization technique leads to a problem in that the catalytic elements used for crystallization remain in the polycrystal silicon film, which causes the reliability of a TFT and the uniformity of the characteristics to be degraded. In view of this, in order to eliminate this problem, the present applicant discloses in Japanese Patent Application Laid-open No. Hei 8-330602 a technique by which metal elements in a polycrystal silicon film is gettered after the formation of a wiring made of an aluminum material. In the technique disclosed in the above-mentioned publication, the source and drain regions to which phosphorus is added are employed for gettering sink, and the catalytic elements in the channel formation region are gettered in the source and drain regions by a heat treatment.

However, in the case where an aluminum material that is low in heat resistance is used for the wiring, even if the wiring is coated with the anodic oxide film, a heat temperature for gettering is limited to 300 to 450° C. Because the heat temperature of 300 to 450° C. is low as a temperature for sufficiently gettering the metal elements in the polycrystal silicon film, a long processing period of time is required. For that reason, the diffusion of aluminum from the gate electrode and the expansion of the gate wirings due to hillock or the like are liable to occur.

As described above, it is desired to use the aluminum material for the wiring from the view point of lowering the resistance of the wirings. Since aluminum can be anodically oxidized, the thin film transistor having the LDD structure or the offset structure can be produced in a self-aligning manner by using the anodic oxidation technique. However, because it is necessary to form a voltage supply wiring for anodic oxidation, the high integration of circuits and the reduction of the substrate area are impeded.

Also, even if aluminum is coated with an anodic oxide, the process temperature after the formation of the gate wiring is limited to about 400° C. Also, aluminum diffuses from the gate wiring, the gate wiring and the channel are short-circuited due to the occurrence of hillock, or the gate wiring is deformed, resulting in the operation defect of the TFT.

SUMMARY OF THE INVENTION

The present invention has been made in order to eliminate the above-mentioned problems with the prior art, and therefore an object of the present invention is to enable an aluminum material to be anodically oxidized without forming a voltage supply wiring for anodic oxidation.

Also, another object of the present invention is to provide a method of manufacturing a semiconductor device which is excellent in yield and high in reliability by preventing the diffusion of aluminum from the wiring and the deformation of the wiring which are caused by heating.

Hereinafter, a process through which the present invention has been achieved will be described with reference to FIGS. 43A to 48D.

(1. Anodic Oxidation)

The present inventors have recognized whether an island-like aluminum pattern can be anodically oxidized on a tantalum film which is used as an electrode, or not. FIGS. 43A to 43E are cross-sectional views showing an aluminum pattern in the respective experimental procedures. In this example, aluminum is anodically oxidized by oxalic acid or tartaric acid as in the conventional example.

(Experimental Procedure)

A tantalum (Ta) film 41 having a thickness of 20 nm and an aluminum (Al) film 42 having a thickness of 400 nm are laminated on a 1737 glass substrate (5 inch square) 40 made by Corning Corp. In the gate wirings of the present invention, the Ta film 41 corresponds to a first conductive film, and the Al film 42 corresponds to a second conductive film. Then, a probe of an anodic oxidation device is connected to the aluminum film 42 and the surface of the aluminum film is anodically oxidized to form a barrier type anodic oxide film 44. Also, the barrier type anodic oxide film (hereinafter referred to as "barrier A.O. film") is made of alumina (FIG. 43A).

The anodic oxidation conditions are that ethylene glycol solution containing tartaric acid of 3% is used as an electrolyte solution, a solution temperature is 30° C., an arrival voltage is 10 V, a voltage supply period of time is 15 minutes, and a supply current is 10 mA/substrate. The anodic oxidation process is made in order to improve the adhesion of the resist mask 50. Since the barrier A.O. film 44 is formed on the surface of the Al film 42, the anodic oxidation process is called "mask anodic oxidation process" in the present specification. The alumina film 44 which has been anodically oxidized by tartaric acid has the corrosiveness with respect to buffered hydrofluoric acid.

Subsequently, a resist mask 50 is formed on the upper surface, and the A.O. film 44 and the Al film 42 are etched to form a plurality of gate wiring patterns 43 formed of the Al film 42 (hereinafter referred to as "Al pattern 43"). The Al patterns 43 are separately formed for each of the wirings, and only two Al patterns 43 are shown in FIGS. 43B to 43E. The Al patterns 43 correspond to a second wiring layer of the present invention.

The etchant of the barrier A.O. film 44 as used is an acid in which a chromic acid solution 550 g (chromic acid 300 g, water 250 g) is mixed with a solution 10 litters mixed with phosphoric acid, nitric acid, acetic acid and water at a rate of 85:5:5:5. In the present specification, the above-mentioned etchant is called "chromic mixed acid". The etchant of the Al film 42 as used is an acid in which phosphoric acid, acetic acid, nitric acid and water are mixed at a rate of 85:5:5:5 by volume % (hereinafter referred to as "aluminum mixed acid") (FIG. 43B).

Then, a voltage is applied to the Ta film 41 in an anodic oxidation device while the resist mask 50 remains to conduct anodic oxidation. The conditions are that oxalic acid aqueous solution of 3% is used as an electrolyte solution, an arrival voltage is 8 V, a voltage supply period of time is 40 minutes, and a supply current is 20 mA/substrate. In the conventional anodic oxidation method, with these anodic oxidation conditions, a porous type anodic oxide (porous A.O.) film 45 is formed on the side surface of the aluminum patter 43. Thus, this anodic oxidation process is called "side anodic oxidation process" in the present specification (FIG. 43C). Then, after the removal of the resist mask 50, a voltage is applied to the Ta film 41 again in the anodic oxidation device to conduct anodic oxidation. The conditions are that ethylene glycol solution containing tartaric acid of 3% is used as an electrolyte solution, an electrolyte solution temperature is 10° C., an arrival voltage is 80 V, a voltage supply period of time is 30 minutes, and a supply current is 30 mA/substrate. In the conventional method, in these anodic oxidation conditions, tartaric acid permeates the porous A.O. film 45, and the surface of the Al pattern 43 is anodically oxidized to form a barrier type anodic oxide (barrier A.O.) film 46. Accordingly, this anodic oxidation process is called "barrier anodic oxidation process" in the present specification. The barrier A.O. film 46 is made of non-porous alumina and have a hydrofluoric acid resistance (FIG. 43D).

Then, the porous A.O. film 45 is removed by wet etching using the above-described aluminum mixed acid. The barrier A.O. film 46 is hardly etched by aluminum mixed acid (FIG. 43E).

(Experimental Results and Consideration)

In order to recognize whether the Ta film 41 functions as the voltage supply wiring for anodic oxidation of the Al pattern, or not, the sheet resistance of the Ta film 41 has been measured for each of the processes.

Also, the cross-sectional structure of the Al pattern 43 has been observed through a transmission electron microscope (hereinafter referred to as "TEM") in order to investigate the cross-sectional structure thereof. In addition, elements in the fine region of the sectional structure are analyzed by an electron dispersion X-ray spectroscopy (hereinafter referred to as "EDX"). FIGS. 44A and 44B are photographs of the section of the Al pattern 43 shown in FIG. 43E which has been observed through the TEM, and FIG. 44C is a schematic diagram of the photographs of that section observed through the TEM. The TEM photograph of FIG. 44B shows an enlargement of the lower structure of the porous A.O. film 45. Also, the reference numerals used in FIG. 44C are identical with those in FIGS. 43A to 43E.

The sheet resistance of the Ta film 41 is 100.1 Ω/square cm in an initial state (before mask anodic oxidation), and 205.1 Ω/square cm after the side anodic oxidation process has been finished. The sheet resistance after the barrier anodic oxidation process has been finished becomes equal to or higher than a measurable range of a measuring device. Since the maximum measurable value of the measuring device is 5000 kΩ/square cm, it is presumed that the sheet resistance after the barrier anodic oxidation process has been finished is at least 5000 kΩ/square cm or higher.

As a result of observing the glass substrate 40 by eyes after the side anodic oxidation process has been finished, the Ta film 41 becomes slightly more transparent than that in the initial state. It is presumed from the observation by eyes and the sheet resistance that the surface of the Ta film 41 is slightly oxidized through the side anodic oxidation process to form a tantalum oxide film (hereinafter referred to as "TaOx film") 51. This presumption is also supported by the TEM observation and the EDX analysis result which will be described later.

Further, upon observation of the glass substrate 40 by eyes after the barrier anodic oxidation process has been completed, the Ta film 41 which has been exposed becomes almost transparent. This is because tartaric acid used during the mask anodic oxidation process also anodically oxidizes tantalum, and it is presumed that the Ta film 41 of that portion is anodically oxidized over the entire thickness of the film so as to be converted into a TaOx film 52. This presumption is also supported by the TEM observation and the EDX analysis result which will be described later.

However, because tantalum oxide is of an insulator, there arises a problem as to whether the TaOx films 51 and 52 function as a wiring, or not. Since there is found no large fluctuation in a current value monitored by an anodic oxidization device during the barrier anodic oxidization process, it is presumed that even if the Ta film 41 is converted into the TaOx film, a voltage is applied to the Al pattern 43. It is presumed that this exhibits a slight conductivity (semi-insulation) because the TaOx film is very large in sheet resistance but has the content of oxygen smaller than $Ta_2O_5$ (tantalum pentoxide) which is stoichiometric ratio. It is presumed that the shift from the stoichiometric ratio is largely caused by that the TaOx films 51 and 52 are formed by anodic oxidation.

In the etching process shown in FIG. 43E, aluminum mixed acid is employed. Although both of porous alumina (porous A.O. film 45) and aluminum (Al pattern 43) are etched by aluminum mixed acid, non-porous alumina (barrier A.O. film 46) is hardly etched. Accordingly, if the barrier A.O. film 46 is formed with a sufficient thickness in the barrier anodic oxidation process, the Al pattern 43 should not be etched.

It can be recognized from the TEM observation photograph of FIG. 44A that the Al pattern 43 remains even if the etching process is conducted with aluminum mixed acid. Accordingly, it can be presumed that the barrier A.O. film 46 that can withstand aluminum mixed acid is formed in the mask anodic oxidation process. According to the TEM observation photographs shown in FIGS. 44A and 44B, the thickness of the barrier A.O. film 46 is about 20 nm.

It has been found out through the above-mentioned experiments that the Al pattern 43 selectively formed on the upper portion of the Ta film 41 formed on the entire surface of the glass substrate 40 is short-circuited by the Ta film 41, and a voltage is applied to the Ta film 41, thereby making it possible to anodically oxidize the Al pattern 43. In particular, it has been recognized that even if the Ta film 41 is used for the voltage supply wiring in the anodic oxidation process using tartaric acid, the Al pattern 43 formed on the upper portion of the Ta film 41 can be anodically oxidized.

Hereinafter, the TaOx films 51 and 52 will be considered on the basis of the TEM observation photograph and the EDX analysis result.

It is found from the TEM observation photographs shown in FIGS. 44A and 44B that three different layers 51, 52a and 52b (refer to FIG. 44B) exist in the TaOx film. The composition of the respective layers of 51, 52a and 52b has been analyzed by the EDX. In FIG. 44B, points P1 to P6 indicated by "*" designate measurement points of the EDX.

The measurement point P1 is a portion which is not immersed in an electrolyte solution during all of the anodic oxidation processes and serves as a reference point for other measurement points. Although most of peaks at the measurement point P1 are Ta, low peaks such as C or O have also been recognized.

The measurement points P2 and P3 are portions which are immersed in the electrolyte solution during the porous anodic oxidation process and the barrier anodic oxidation process. At the measurement points P2 and P3, the measurement results of EDX are nearly identical with each other, in which the peaks of Ta and O are detected. Since the peak of O is higher than that at the point P1, it is presumed that Ta is anodically oxidized and converted into tantalum oxide (hereinafter referred to as TaOx) at the measurement points P2 and P3.

However, in the TEM photograph, since the TaOx film 51 which is a lower layer (measurement point P2) and the TaOx film 52b which is an upper layer (measurement point P3) are different in contrast from each other, it is presumed that the crystal structure is different between the TaOx film 52b and TaOx film 51. The TaOx film 51 is a portion which has been oxidized during the side anodic oxidation process of FIG. 43C, and it is presumed that the TaOx film 51 is of the porous crystal structure. The TaOx film 52b which is the lower layer is a portion which has been oxidized during the barrier anodic oxidation process, and it is presumed that the TaOx film 52b is finer in crystal structure than the TaOx film 51 which is the upper layer.

Since in the region where the porous A.O. film 45 exists, the detected peak of elements at the measurement point P4 in the vicinity of the boundary of the glass substrate 40 is nearly identical with that at the measurement point P1, it is presumed that Ta is not anodically oxidized at that portion and remains as the Ta layer 40.

At the measure point P5, the peaks of Ta, O and Al are detected. The peak of O is higher than that at the point P1.

It is presumed that TaOx and Al exist together in the TaOx film 52a, or the alloy of Ta and Al is oxidized. In the TEM photograph, it is found that the TaOx film 52a is shaped in needles (porous shaped) or shaped in a cotton, and it is presumed that the TaOx film 52a is the lowest density in the TaOx film.

Since the EDX result at the measurement point P6 between the measurement points P4 and P5 is nearly identical with that at the measurement point P3, it is presumed that the TaOx film 52b is TaOx which has been oxidized during the barrier anodic oxidation process.

It is presumed from the above-mentioned TEM observation photograph and the EDX that the TaOx layers 51 and 52b different in density (contrast on the photograph) are formed on the glass substrate 40 in the region outside of the porous A.O. film 45.

On the other hand, it is presumed that in the region under the porous A.O. film 45, three-layer films consisting of the Ta film 41, the TaOx film 52a and the TaOx film 52b are formed on the glass substrate 40, and the TaOx film 52b is TaOx containing Al therein or the oxide of an alloy consisting of Al and Ta.

The present invention has been based on the above-described experimental results, and has one structure in which in order to anodically oxidize a wiring formed of an Al layer, a Ta film is formed over the entire surface of the substrate as the lower layer of the Al layer, and the Ta film is used as a voltage supply line.

Therefore, the gate wiring of a two-layer structure consisting of Al and Ta shown in FIGS. 43A to 43E is applied to the gate wiring of the TFT shown in FIGS. 49A to 49F to thus produce a TFT. However, there arises the following problems.

In the conventional example, in order to form the LDD in a self-aligning manner, the gate insulating film 14 is etched with the porous A.O. film 17 as a mask (refer to FIG. 49D). The gate insulating film 14 is made of nitrified silicon oxide or silicon oxide. A dry etching process using $CHF_3$ gas is used for etching the gate insulating film 14.

After the gate insulating film 14 has been etched, the porous A.O. film 17 is wet-etched by aluminum mixed acid (refer to FIG. 49E), and at this time, etching remainder frequently occurs. Therefore, after wet-etching, the remainder is removed by a chemical only for remainder etching. It is proved that the remainder is a reaction product stuck to the side surface of the porous A.O. film 17 by dry-etching the gate insulating film 14.

If the wiring having the two-layer structure consisting of Al and Ta shown in FIGS. 43A to 43E is applied to the conventional TFT manufacturing process shown in FIGS. 49A to 49F, the TaOx film is dry-etched together with the gate insulating film during the dry etching process of the gate insulating film shown in FIG. 49D, and a reaction product is similarly stuck to the side surface of the porous alumina film in this dry etching process.

Likewise, in this case, although the film is processed by a chemical only for remainder etching as described above after the porous alumina film has been wet-etched, the remainder can be hardly removed. Even after the film has been processed by the chemical, the remainder exists in a state where a wall-like structure erects just around the periphery of the porous A.O. film 17, or in a state where the wall-like structure is turned upside down, and the base of the wall-like remainder is firmly fitted to the substrate. It is presumed that the reason why the wall-like remainder can not be removed from the substrate even if it is processed by the remainder removal chemical is that metal components such as Ta is mixed with the reaction product obtained when the gate insulating film is dry-etched.

In order to eliminate the problem of the remainder occurrence, the present invention has another structure in which the gate insulating film and the TaOx film are not dry-etched at the same time with the porous alumina as a mask when the gate wiring of the two-layer structure consisting of Al and Ta is used.

Also, in the conventional example, portions where lightly-doped impurity regions 23 and 24 exist under the gate insulating film 14' are portions where the porous A.O. film 17 has existed. Accordingly, in the case where the wiring of the two-layer structure consisting of Al and Ta shown in FIGS. 43A to 43E is applied to the gate wiring of the TFT shown in FIGS. 49A to 49F, the Ta film 41 exists on the lightly-doped impurity regions 23 and 24 through the gate insulating film 14' according to the above-described EDX analysis result. This structure causes a voltage to be always applied to the lightly-doped impurity regions 23 and 24 by the Ta film 41 in the on-state, resulting in such a problem that the deterioration of the TFT is hastened.

The remainder of the Ta film on the lightly-doped impurity region is caused by anodically oxidizing the Ta film 41 in a state where the Ta film 41 is coated with the porous A.O. film 45. Since the electrolyte solution does not sufficiently go over a portion coated with the porous A.O. film 45, the Ta film 41 cannot be anodically oxidized over the entire thickness of the film. Accordingly, an object of the present invention is to eliminate the remaining Ta film on the lightly-doped impurities. In order to achieve this object, the present invention has another structure in which a barrier anodic oxidation process is conducted without conducting the side anodic oxidation process shown in FIG. 43C to anodically oxidize the Ta film (first conductive film) and the Al pattern (second wiring layer) 43.

In other words, in the present invention, in the formation of the respective anodic oxide films that coat the first wiring layer and the second wiring layer, the surface of a portion of the first conductive film to be anodically oxidized is exposed so that the first conductive film is surely anodically oxidized.

Also, the present invention has a process of thermally oxidizing the Ta film in order to eliminate the Ta film which has remained during the side anodic oxidation process shown in FIG. 43C. That is, the present invention has another structure in which there is provided a process of thermally oxidizing the first conductive film after the first conductive film has been anodically oxidized.

(2. Evaluation of the blocking property of Ta layer)

Subsequently, the blocking property of the Al diffusion in the Ta layer will be evaluated. A sample in which a Ta layer is formed (called "sample A") and a sample in which no Ta layer is formed (called "sample B") are subjected to a heat treatment in a nitrogen atmosphere, and the distributions of the Al concentrations of the respective samples after the heat treatment has been made have been measured through the secondary ion mass spectroscope (SIMS). The heat treatment was conducted at a temperature of 550° C. for a processing period of 2 hours in the nitrogen atmosphere.

FIGS. 45A and 45B show cross-sectional structures of the respective samples A and B. The sample A is that a polycrystal silicon film 61 (200 nm in thickness) corresponding to a semiconductor layer, a nitrified silicon oxide (SiON) film 62 (120 nm) corresponding to a gate insulating film, a tantalum film 63 (20 nm) an aluminum film 64 (200 nm) which constitutes a gate wiring are laminated on a Corning 1737 glass substrate 60.

The sample B corresponds to the sample A from which the tantalum film 63 is removed, and is that a polycrystal silicon film 71 (200 nm in thickness) corresponding to a semiconductor layer, a nitrified silicon oxide (SiON) film 72 (120 nm) corresponding to a gate insulating film and an aluminum (Al) film 74 (200 nm) are laminated on a Corning 1737 glass substrate 70.

An SIMS measuring direction is directed from the glass substrates 60 and 70 toward the aluminum films 64 and 74 with respect to both of the samples A and B. The analyzing conditions are identical between the samples A and B and are that a primary ion species is $O_2^+$, a primary acceleration voltage is 6.0 kV, a sputtering rate is 0.6 nm/s, a measured region is 120 $\mu$m×192 $\mu$m, and the degree of vacuum is 3×10$^{-7}$ Pa. The elements to be analyzed are Al, O, Si and Ta.

The SIMS analyzing results of the samples A and B are shown in FIGS. 46 and 47. In FIGS. 46 and 47, the axis of abscissa is the depth [$\mu$m], the left axis of ordinate is the concentration of Al [atoms/cm$^3$] and the right axis of ordinate is a secondary ion intensity [cts/sec] of O, Si and Ta.

In quantifying the concentration of Al, an SiO$_2$ normal sample into which Al ions have been implanted and an Si normal sample into which Al ions have been implanted are used as normal samples. The profiles of the concentrations of Al shown in FIGS. 46 and 47 are processing data. There are shown a profile quantified using the SiO$_2$ normal sample in the SiON films 62 and 72, and a profile quantified using the Si normal sample in the polycrystal silicon films 61 and 71. In FIGS. 46 and 47, the profile quantified using the SiO$_2$ normal sample and the profile quantified using the Si normal sample are connected to each other. For that reason, the inaccuracy due to the data processing remains in the profile on the interface between the SiON film and Si film. The background level of the concentration of Al is 1×10$^{16}$ atoms/cm$^3$ in the SiO$_2$ normal sample and 1×10$^{15}$ atoms/cm$^3$ in the Si normal sample.

As apparent from the comparison of FIG. 46 with FIG. 47, it is found that the Ta film 63 functions as a blocking film for preventing Al from diffusing. In the sample B (including no Ta layer), the concentration of Al is about 1×10$^{19}$ atoms/cm$^3$ both in the Si film (semiconductor layer) 71 and in the SiON film (gate insulating film) 72. On the other hand, in the sample A (including a Ta layer), the concentration of Al is 3×10$^{16}$ atoms/cm$^3$ or less in the SiON film 63, and the lowest concentration is about 1×10$^{16}$ atoms/cm$^3$ or less of the background level. Also, the concentration of Al is within a range of from 1×10$^{15}$ atoms/cm$^3$ to 1×10$^{17}$ atoms/cm$^3$ in the Si film 61.

FIGS. 48A to 48D show the optical microscope photographs of the samples A and B which have been subjected to a heat treatment at 550° C., respectively. FIG. 48A shows the sample B and FIG. 48B shows the sample A. Also, FIGS. 48C and 48D show the sample A in which the thickness of the Ta layer 63 is set at 30 nm and 50 nm, respectively.

In FIG. 48A, in case of the single Al layer (Ta layer=0 nm), it is recognized that aluminum diffuses (oozes). On the other hand, it can be understood from FIGS. 48B to 48D that the formation of the Ta layer having a thickness of 20 nm or more under the aluminum layer can prevent aluminum from oozing.

As described above, it is understood that the gate wiring with the two-layer structure consisting of the Al layer and the Ta layer can prevent Al from diffusing into the semiconductor layer or the gate wiring. According to the present inventors' knowledge, in order to obtain the Al blocking effect, it is necessary to provide the Ta layer of 1 nm or more, preferably, 5 nm or more in thickness. In the case where the thickness of the Ta layer is less than 1 nm, it is difficult to form a film having no pin holes because of the performance of the film forming device, thereby disenabling the blocking effect to be expected.

Also, it is considered that the upper limit of the Ta layer is about 400 nm, preferably, about 200 nm. In the case where it is more than about 400 nm, the aluminum material layer must be thinned in order to suppress the thickness of the gate electrode, thereby disenabling the feature of aluminum, that is, the low resistivity of aluminum to be made the best use of.

From the above-mentioned viewpoints, the thickness of the tantalum layer is set at 1 to 50 nm, preferably 1 to 20 nm, more preferably 5 to 20 nm.

Also, because the degree to which aluminum diffuses becomes larger as a temperature at which a heat treatment is conducted on the gate wiring is high, the thickness of the Ta layer may be set according to the heating temperature. For example, the thickness of the Ta layer is determined in such a manner that the lowest value of the concentration of Al within an under insulating film of the Ta layer (the SiON film 62 in case of FIGS. 45A and 45B) becomes $3 \times 10^{16}$ atoms/cm$^3$ or less, more preferably $1 \times 10^{16}$ atoms/cm$^3$ or less, or in such a manner that the lowest value of the concentration of Al within the semiconductor layer becomes $1 \times 10^{17}$ atoms/cm$^3$ or less, more preferably $1 \times 10^{16}$ atoms/cm$^3$ or less.

The aspects of the present invention are based on the knowledge obtained from the above-mentioned experimental results. In order to achieve the above-mentioned objects, according to a first aspect of the present invention, there is provided a semiconductor device having a gate wiring which intersects with a semiconductor layer through a gate insulating film, said gate wiring comprising:

a first wiring layer made of a first conductive film formed in contact with the gate insulating film;

a second wiring layer made of a second conductive film formed in contact with an upper surface of the first wiring layer;

an anodic oxide film of the first conductive film which is in contact with a side surface of the first wiring layer; and an anodic oxide film of the second conductive film which is in contact with a front surface of the second wiring layer, wherein the upper surface of the gate insulating film is coated with the anodic oxide film of the first conductive film except for a portion where the first wiring layer is formed.

Also, according to a second aspect of the present invention, there is provided a semiconductor device having a gate wiring which intersects with a semiconductor layer through a gate insulating film, the gate wiring comprising:

a first wiring layer made of a first conductive film formed in contact with the gate insulating film;

a second wiring layer made of a second conductive film formed in contact with an upper surface of the first wiring layer;

an anodic oxide film of the first conductive film which is in contact with a side surface of the first wiring layer; and an anodic oxide film of the second conductive film which is in contact with a front surface of the second wiring layer, wherein the gate insulating film covers the entire surface of the semiconductor layer, and the anodic oxide film of the first conductive film is not formed on the surface of a region which covers at least the source region and the drain region.

According to the present invention, the gate wiring uses the second wiring layer which is an upper layer mainly as a charge passage. The thickness of the second wiring layer is set at about 200 to 500 nm. Also, it is preferable that the metal film that forms the second wiring layer is made of aluminum or a material mainly containing aluminum in order to obtain the low resistance of the wiring.

Also, the first conductive film may be made of valve metal. The valve metal is directed to a metal which exhibits that a barrier type anodic oxide film anodically produced allows a cathode current to flow therein but does not allow an anode current to flow therein, that is, exhibits a valve action (see "Electrochemical Handbook", Fourth Edition; "Electrochemical Association Journal", p 370, Maruzen, 1985).

In order to obtain the Al blocking effect, a valve metal film a material of which has a melting point higher than that of aluminum is used for the first conductive film. The metal of this type may be tantalum (Ta), niobium (Nb), hafnium (Hf), zirconium (Zr), titanium (Ti), chromium (Cr) or the like. Also, the first conductive film can be made of an eutectic alloy consisting of any one of those valve metal elements and other metal elements or nitrogen. For example, a molybdenum tantalum (MoTa) alloy, or a nitrogen alloy such as TaNy, NbNy, HfNy, ZrNy, TiNy or CrNy may be employed.

Although it is preferable that the thickness of the first conductive film is thinner, the thickness for functioning as a blocking layer that prevents the structural atoms of the second wiring layer from diffusing is required. The lower limit of the first conductive film is set at 1 nm, preferably 5 nm.

The primary reason why the thinner first conductive film is desired is that in formation of source and drain regions, impurities are added to the semiconductor layer after passing through the first anodic oxide film, that is, the anodic oxide film of the first conductive film. As the anodic oxide film is thinner, an accelerating voltage during the impurity adding process and the dose amount can be decreased, to thereby improving a throughput. Also, the throughput during the process of forming the first conductive film and during the process of etching the anodic oxide of the first conductive film can be more heightened as the first conductive film is thinner.

Also, the upper limit of the thickness of the first conductive film is set at 50 nm, preferably about 30 nm. The first oxide film is formed by oxidizing the first conductive film so that the thickness thereof is about 2 to 4 times as large as that of the first conductive film. Accordingly, taking into account the formation of the first conductive film, the throughput during the processes of etching the anodic oxide film in the first aspect of the present invention and the first anodic oxide film in the second aspect of the present invention, and during adding the impurities etc., the upper limit of the first conductive film is set at 50 nm, preferably 30 nm.

It is considered from the above-mentioned viewpoints that the thickness of the first conductive film is preferably selected from a range of 1 to 50 nm (preferably 5 to 30 nm, more preferably 5 to 20 nm).

Also, because the degree to which aluminum diffuses becomes larger as a temperature at which a heat treatment is conducted on the gate wiring is high, the thickness of the first wiring layer may be set according to the heating temperature. For example, the thickness of the first wiring layer may be determined in such a manner that the lowest value of the concentration of Al within an under insulating film of the first wiring layer (the SiON film 62 in the case of FIGS. 45A and 45B) becomes $3 \times 10^{16}$ atoms/cm$^3$ or less, more preferably $1\times10^{16}$ atoms/cm$^3$ or less, or in such a manner that the lowest value of the concentration of Al within the semiconductor layer becomes $1\times10^{17}$ atoms/cm$^3$ or less, more preferably $1\times10^{16}$ atoms/cm$^3$ or less. The concentration of Al is defined with the lowest value of SIMS data.

In the structure according to the second aspect of the present invention, the anodic oxide film of the first conductive film and the gate insulating film are prevented from being etched at the same time, and only the anodic oxide film of the first conductive film is patterned to selectively expose the surface of the gate insulating film. A region of the gate insulating film the surface of which is exposed is a region that covers the source and drain regions. With this structure, the through-put is improved more than that in a case where impurities are added through both of the anodic oxide film of the first conductive film and the gate insulating film during the process of forming the source and drain regions.

It should be noted that in the present specification, an intersecting portion of the semiconductor layer and a connecting portion of another wiring with respect to the wirings such as the gate wiring, the source wiring or the drain wiring are particularly called "electrode".

BRIEF DESCRIPTION OF THE DRAWINGS

These and other objects, features and advantages of this invention will become more fully apparent from the following detailed description taken with the accompanying drawings in which:

FIGS. 1A to 1C are cross-sectional views of a TFT according to the present invention;

FIGS. 2A to 2C are cross-sectional views of a TFT manufacturing process according to the present invention;

FIGS. 3A to 3C are cross-sectional views of a TFT manufacturing process according to the present invention;

FIGS. 4A to 4C are cross-sectional views of a TFT manufacturing process according to the present invention;

FIGS. 5A to 5C are photographs of SEM observation of a gate wiring and a schematic diagram thereof;

FIGS. 6A to 6C are cross-sectional views of a TFT according to the present invention;

FIGS. 7A to 7D are cross-sectional views of a TFT manufacturing process according to the present invention;

FIGS. 8A to 8D are cross-sectional views of a TFT manufacturing process according to the present invention;

FIGS. 9A to 9C are partially enlarged views of FIGS. 1A to 1C and 8A to 8D.

FIG. 10 is a plan view of a CMOS circuit according to a first embodiment;

FIGS. 11A to 11F are cross-sectional views of a TFT manufacturing process according to the present invention;

FIGS. 12A to 12D are cross-sectional views of a TFT manufacturing process according to the present invention;

FIGS. 13A to 13C are cross-sectional views of a gate wiring;

FIGS. 21A to 21C are cross-sectional views of a gate wiring;

FIGS. 22A to 22C are cross-sectional views of a gate wiring;

FIG. 26 is a cross-sectional view of a gettering process according to a second embodiment;

FIGS. 27A to 27C are cross-sectional views of a gettering process;

FIG. 28 is a cross-sectional view of a gettering process according to the second embodiment;

FIGS. 29A to 29E are cross-sectional views of a TFT manufacturing process according to a fifth embodiment;

FIGS. 30A to 30D are cross-sectional views of a TFT manufacturing process;

FIGS. 31A to 31C are cross-sectional views of an n-channel TFT manufacturing process;

FIGS. 32A to 32E are cross-sectional views of a TFT manufacturing process according to a sixth embodiment;

FIGS. 33A to 33C are cross-sectional views of a TFT manufacturing process;

FIG. 35 is a partially cross-sectional view of a gate electrode;

FIG. 36 is a perspective view of an active matrix substrate according to a seventh embodiment;

FIGS. 37A and 37B are top views of a pixel matrix circuit and a CMOS circuit;

FIG. 38 is a cross-sectional view of an active matrix substrate;

FIG. 39 is a cross-sectional view of an active matrix substrate;

FIGS. 41A to 41F are structural diagrams of an electronic device according to a tenth embodiment;

FIGS. 43A to 43E are cross-sectional views of an aluminum pattern showing an anodic oxidation process according to the present invention;

FIGS. 44A to 44C are TEM observation photographs observing the cross-sectional structure of the aluminum pattern and schematic diagrams thereof;

FIGS. 45A and 45B are cross-sectional views of SIMS measured samples A and B;

DETAILED DESCRIPTION OF THE PREFERRED EMBODIMENTS

Figure 14:
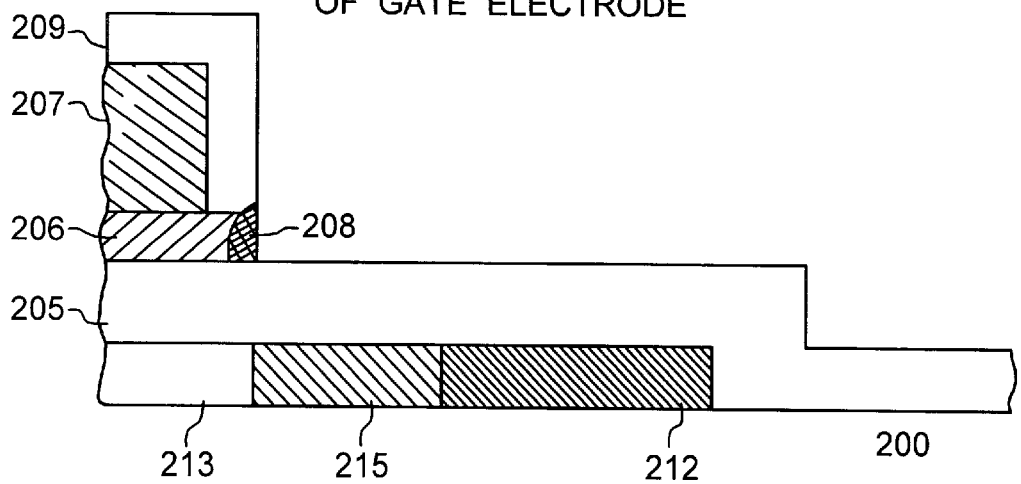
FIG. 14 is a partially cross-sectional view of a gate wiring.

Now, a description will be given in more detail of preferred embodiments of the present invention with reference to the accompanying drawings.

An embodiment of the present invention is applied to a TFT. FIGS. 1A to 1C and 6A to 6C are cross-sectional views showing a TFT according to the embodiment of the present invention, in which FIGS. 1A and 6A are cross-sectional views of the TFT along a front surface of a substrate and are cross-sectional views taken along chain lines W'W' of FIGS. 1B and 6B. FIGS. 1B and 6B are cross-sectional views of the TFT taken along a channel longitudinal direction and are cross-sectional views taken along chain lines X–X' of FIGS. 1A and 6B. FIGS. 1C and 6C are cross-sectional views of the TFT taken along a channel widthwise direction and are cross-sectional views taken along chain lines Y–Y' of FIGS. 1A and 6A.

Referring to FIGS. 1A to 1C, a gate wiring is formed which intersects with a semiconductor layer 102 with the intervention of a gate insulating film 103. The gate wiring includes a conductive layer where a second wiring layer 106 is laminated on a first wiring layer 108 formed in contact with the gate insulating film 103, an anodic oxide film 109 of a first conductive film which covers a side surface of the first wiring layer 108, and an anodic oxide film 107 of a second conductive film which covers the entire surface of the second wiring layer 106. The upper surface of the gate insulating film 103 is covered with the anodic oxide film 109 of the first conductive film except for a portion of that upper surface on which the first wiring layer 108 is formed.

Referring to FIGS. 6A to 6C, a gate wiring is formed which intersects with a semiconductor layer 102 with the intervention of a gate insulating film 103. The gate wiring includes a conductive layer where a second wiring layer 106 is laminated on a first wiring layer 108 formed in contact with the gate insulating film 103, an anodic oxide film 109 of a first conductive film which is in contact with a side surface of the first wiring layer 108, and an anodic oxide film 107 of a second conductive film which covers the entire surface of the second wiring layer 106. The gate insulating film 103 is formed on the entire surface of a substrate so as to cover the semiconductor layer 102. In addition, the first wiring layer 108 and the anodic oxide film 109 of the first conductive film are formed on the surface of the gate insulating film 103, but no anodic oxide film 109 exists in a region that covers source and drain regions 111 and 112.

On a substrate 100 having an insulating surface thereof is formed the semiconductor layer 102 of a TFT. The substrate 100 having the insulating surface may be an insulating substrate such as a glass substrate, a quartz substrate, a crystalline glass substrate or a plastic substrate, or an inorganic insulating film such as a silicon oxide film, a silicon nitride film or a nitrified silicon oxide film being formed on the surface of any one of the above-mentioned substrates.

Further, as the under insulating film, there may be used a laminated film in which the above-mentioned inorganic insulating film as an upper layer is laminated on a metal film having a high-melting point such as tungsten, chromium or tantalum, or a film having a high electric conductivity such as an aluminum nitride film as an lower layer. Alternatively, there may be used a substrate obtained by coating the surface of an electrically conductive substrate high in thermal conductivity such as a stainless substrate, a substrate made of a metal material having a high melting point such as Ta, W, Mo, or Ti, or an alloy consisting of those materials with the above-mentioned inorganic insulating film. In the case of FIGS. 1A to 1C, because a heat generated by a semiconductor device is radiated by the under film or the conductive substrate, the operation of the semiconductor device can be stabilized. In the case of FIGS. 2A to 2C, because a heat generated by a semiconductor device is radiated by a film under the under film or the conductive substrate, the operation of the semiconductor device can be stabilized. The substrate of this type is proper for an active matrix substrate of the reflection type liquid crystal display device.

The semiconductor layer 102 may be made of amorphous silicon, polycrystal silicon, amorphous germanium, polycrystal germanium, amorphous silicon germanium indicated by $Si_xGe_{1-x}$ (0<X<1) or a semiconductor material obtained by crystallizing amorphous silicon germanium. A method of crystallizing the semiconductor material can be executed with a heat treatment within an electric furnace, a light irradiation process of irradiating a laser beam or an infrared lamp light, or the combination of the heat treatment process with the light irradiating process, or the like.

A process of manufacturing a TFT as shown in FIGS. 1A to 1C includes at least:

a step A of forming on a substrate having an insulating surface the semiconductor layer where a source region, a drain region and a channel formation region are formed;

a step B of forming a gate insulating film in close contact with the semiconductor layer;

a step C of forming a laminated film consisting of a first conductive film and a second conductive film on the entire surface of the gate insulating film;

a step D of patterning only the second conductive film out of the laminated film to form the second wiring layer which intersects with the semiconductor layer;

a step E of anodically oxidizing the first conductive film by applying a voltage to the first conductive film to form an anodic oxide film of the first conductive film, and anodically oxidizing the second wiring layer to form an anodic oxide film which coats the surface of the second wiring layer; and a step F of adding impurities to the semiconductor layer through the gate insulating film and the anodic oxide film of the first conductive film.

A method of manufacturing a TFT as shown in FIGS. 6A to 6C includes at least:

a step A of forming on a substrate having an insulating surface the semiconductor layer where a source region, a drain region and a channel formation region are formed;

a step B of forming a gate insulating film in close contact with the semiconductor layer;

a step C of forming a laminated film consisting of a first conductive film and a second conductive film on the entire surface of the gate insulating film;

a step D of patterning only the second conductive film out of the laminated film to form the second wiring layer which intersects with the semiconductor layer;

a step E of anodically oxidizing the first conductive film by applying a voltage to the first conductive film to form an anodic oxide film of the first conductive film, and anodically oxidizing the second wiring layer to form an anodic oxide film which coats the surface of the second wiring layer;

a step F of patterning the anodic oxide film of the first conductive film formed in the step E with the anodic oxide film of the second wiring layer formed in the step E as a mask to expose the surface of the gate insulating film; and a step G of adding impurities to the semiconductor layer through the gate insulating film.

Hereinafter, the above steps A to F will be described with reference to FIGS. 2A to 2C through 4A to 4C. FIG. 2A is a cross-sectional view showing a TFT along a front surface of a substrate and a cross-sectional view taken along a chain line Z–Z' of FIG. 2B. FIG. 2B is a cross-sectional view of the TFT taken along a channel longitudinal direction and a cross-sectional view taken along chain lines X–X' of FIG. 2A. FIG. 2C is a cross-sectional view of the TFT taken along a channel widthwise direction and a cross-sectional view taken along a chain line Y–Y' of FIG. 2A. The relations of FIGS. 3A to 3C and 4A to 4C are identical with those of FIGS. 2A to 2C.

First, the island-like semiconductor layer 102 where a source region, a drain region and a channel formation region will be formed is formed on the substrate 100 (step A). Then, the gate insulating film 103 is formed so as to be in close contact with the semiconductor layer 102 (step B). Subsequently, the laminated layer, which is in contact with the gate insulating film 103, consisting of the first conductive film 104 and the second conductive film 105 is formed on the entire surface of the substrate 100 (step C) (refer to FIGS. 2A to 2C).

The first conductive film 104 may be made of a valve metal such as Ta, Nb, Hf, Zr, Ti or Cr. Also, the first conductive film 104 can be made of an eutectic alloy consisting of any one of those valve metal elements and other metal elements or nitrogen. For example, an MoTa alloy, or a nitrogen alloy film such as TaNy, NbNy, HfNy, ZrNy, TiNy or CrNy may be employed as the first conductive film 104.

In addition, the first conductive film 104 may be made of not only a single-layer film of the metal film or the alloy but also a laminated film consisting of the metal and the alloy or a laminated film of the alloys. For example, a film in which a Ta film and a TaNy film, or a TaNy film and a Ta film are laminated from a lower layer in the stated order, or a three-layer film consisting of a TaNy film, a Ta film and TaNy film may be used for the first conductive film 104. The same is applied to other valve metal elements.

The crystal structure of Ta is known as a low-resistant and stable cubic (α-Ta or bcc-Ta) and a high-resistant and metastable cubic (β-Ta). Ta can facilitate the growth of α-Ta low in resistivity by forming the Ta film after a TaNy alloy film has been formed as an under film.

On the other hand, if the second conductive film 105 is made of not only pure aluminum but also an aluminum material to which Si, Sc or the like of several wt % is added or an alloy consisting of a metal such as Si and Al, or the like, the heat resistance of the second wiring layer can be improved.

In this example, a Ta film of 20 nm in thickness is formed as the first conductive film 104, and an Al film of 40 nm in thickness which contains scandium of 2 wt % is formed as the second conductive film 105.

Then, the Al film 105 is patterned with the formation of a resist mask, to thereby form the second wiring layer (Al layer) 106 (step E). In this situation, the Al layer (second wiring layer) 106 of the respective gate wirings comes to a state in which it is electrically short-circuited by the Ta film (first conductive film) 104 (refer to FIGS. 3A to 3C).

Then, a voltage is applied to the Ta film 104 to conduct anodic oxidation in an anodic oxidization device. The conditions are that ethylene glycol solution containing tartaric acid of 3% is used as an electrolyte solution, an electrolyte solution temperature is 10° C., an arrival voltage is 80 V, a voltage supply period of time is 30 minutes, and a supply current is 30 mA/substrate. Under those conditions, the surfaces of the Ta film 103 and the Al layer 106 are anodically oxidized (step F) (refer to FIGS. 4A to 4C).

In the step F, the entire surface from which the Al layer 106 is exposed is anodically oxidized to form the barrier type anodic oxide film 107 (hereinafter referred to as "barrier A.O. film"). The barrier A.O. film 107 is of a nonporous alumina film and has a high corrosion resistance with respect to a bufferred hydrofluoric acid.

A portion from which the Ta film 104 is exposed is also anodically oxidized together with the anodic oxidation of the Al layer 106 so that it is converted into a tantalum oxide film (hereinafter referred to as "TaOx film") 109. The remaining tantalum film (Ta layer) 104 is sectioned as the first wiring layer (Ta layer) 108. In fact, although the TaOx film 109 becomes 2 or 3 times as thick as the Ta layer 104, they are shown with the same thickness thereof in the figures for simplification.

In the anodic oxidation step, because the Ta film 104 and the Al layer 106 are different in anodic oxidizing speed, an interface of the Al layer 106 and the barrier A.O. film 107 is inner than an interface of the Ta layer 108 and the TaOx film 109. Accordingly, the Al layer 106 is in contact with only the Ta layer 108, and the TaOx film 109 enters the lower portion of the barrier A.O. film 109 to the degree of 5 to 20 nm.

FIG. 5A shows an SEM (scanning type electronic microscope) photograph that observes a sectional structure of the gate wiring shown in FIG. 4. FIG. 5B is a schematic diagram of the SEM photograph where the same reference marks as those in FIGS. 4A to 4C are used. Also, FIG. 5C is an SEM photograph that observes the surface configuration of the gate wiring. In FIGS. 5A to 5C, the gate wiring is formed directly on the glass substrate under the above-mentioned conditions.

Also, the gate wiring shown in FIGS. 5A to 5C is a sample which has been subjected to a heat treatment at 450° C. in a hydrogen atmosphere for one hour. The deformation of the Al layer 106 due to the heat treatment is not recognized.

Subsequently, impurities that give conductivity are added to the semiconductor layer 102 through the gate insulating film 103 and the TaOx film 109 to form p-type or n-type source and drain regions (step F) (refer to FIGS. 1A to 1C).

In patterning the TaOx film 109, there is applied the dry etching method using fluorine gas. For example, a $CF_4$ gas, a $CHF_3$ gas or the like can be employed as the etching gas. Although $CHF_3$ gas is larger than $CF_4$ gas in the selective ratio of $TaO_x$ and $SiO_2$, $CF_4$ gas is better than $CHF_3$ in the anisotropy of etching.

Because the silicon oxide film, the silicon nitride film and the nitrified silicon oxide film which constitute the gate insulating film 103 are small in the etching selective ratio to $CHF_3$ gas and $CF_4$ gas, the surface of the gate insulating film 103 is slightly etched during this process. Accordingly, in this embodiment, in at least one semiconductor layer, a portion that covers the source and drain regions is thinner than a portion that covers the channel formation region.

Also, the thickness (the mean thickness or the thinnest thickness) of the gate insulating film 103 as the entire substrate is set in such a manner that a portion in which the gate wiring exists on the upper surface of the gate insulating film 103 and portions in which the Ta layer 106 and the TaOx film 109 exist thereon are thicker than portions in which the gate wiring, the Ta layer 106 and the TaOx film 109 do not exist thereon.

Subsequently, impurities that give conductivity are added to the semiconductor layer 102 through the gate insulating film 103 to form the p-type or n-type source and drain regions in a self-aligning manner (step G) (refer to FIGS. 6A to 6C).

The impurities may be added through any one of the ion implantation method, the plasma doping method and the laser doping method. Also, in the case of constituting a CMOS circuit, a region to which the impurities are added may be selected by using a resist mask.

In the step F, the Al layer 106 and the barrier A.O. film 107 function as a mask so that the source region 111, the drain region 112 and the channel formation region 113 are formed on the semiconductor layer 102 in a self-aligning manner. Because the process of removing the TaOx film 109 is provided in FIGS. 6A to 6C, the throughput is improved as compared with a case in which the impurities are added through both of the anodic oxide film of the first conductive film and the gate insulating film to the source and drain regions in the formation process. Also, because the TaOx film 109 and the gate insulating film 105 are not dry-etched at the same time, the problem of the above-described remainder does not occur.

Then, a heat treatment is conducted at 500 to 650° C. to activate the impurities within the source and drain regions 111 and 112. In the gate wiring of the present invention, because the Ta layer 108 functions as a passivation film of Al diffusion, the gate wiring (Al layer 106) and the channel formation region 114 are prevented from being short-circuited in the activating process.

In this embodiment, because the impurities are added to the semiconductor layer 102 through the gate insulating film 103 and the TaOx film 109, it is desirable that the gate insulating film is thinner than that of the conventional TFT in which no TaOx film is formed, taking the acceleration voltage and the dose amount into consideration.

Then, an interlayer insulating film 102 made of a silicon oxide film, a nitrified silicon oxide film or the like is formed. A contact hole is formed in the interlayer insulating film 102, a contact hole is formed to the barrier A.O. film 107 and the Al layer 106 at a pad portion of the gate wiring, thus forming a source wiring 121, a drain wiring 122 and a gate wire lead electrode 123 (FIGS. 1A to 1C and 6A to 6C).

In this embodiment, because the TaOx film 109 of the gate wiring is formed on the entire upper surface of the gate insulating film 103, and the TaOx film 109 is about 2 to 3 times as thick as that of the Ta layer 108, a difference in height due to the gate wiring is relaxed.

Also, in this embodiment, because no etching process for cutting the gate wiring is required after the completion of the anodic oxidation, the surface of the Al layer 106 is maintained in a state where it is coated with the barrier A.O. film 107 as shown in FIGS. 1A to 1C and 6A to 6C.

Another embodiment will be described. This embodiment is that the present invention is applied to a TFT. FIGS. 7A to 7D and 8A to 8D are cross-sectional views of the TFT in each process. FIGS. 9A to 9C are partially enlarged diagrams of FIGS. 7A to 7D and 8A to 8D.

First, a substrate 1100 having an insulating surface may be formed of an insulating substrate such as a glass substrate, a quartz substrate, a crystalline glass, or an inorganic insulating film such as a silicon oxide film, a silicon nitride film or a nitrified silicon oxide film being formed on the surface of any one of the above-mentioned substrates.

A semiconductor layer 1102 made of a semiconductor material is formed on a substrate 1100. The semiconductor layer 1102 may be made of amorphous silicon, polycrystal silicon, amorphous silicon film, amorphous silicon germanium film indicated by $Si_xGe_{1-x}$ (0<X<1) or a film material obtained by crystallizing amorphous silicon germanium film.

Then, an insulating film 1103 that constitutes a gate insulating film is formed. A laminated film consisting of a Ta film 1104 as a first conductive film and an Al film 1105 containing scandium of 2 wt % which is 40 nm in thickness as a second conductive film is formed in close contact with the insulating film 1103. It is better that the second conductive film 1105 is made of not only pure aluminum but also an aluminum material to which Si, Sc or the like of several wt % is added or an alloy consisting of a metal such as Si, in order to improve the heat resistance (FIG. 7A).

Then, a resist mask 1106 is formed with which the Al film 1105 is patterned, to thereby form an Al layer 1107 as a second wiring layer. The Al layer 1107 forms an upper layer of the gate wiring (FIG. 7B).

Subsequently, while the resist mask 1106 remains, a probe of an anodic oxidizing device is brought in contact with the Ta film 1104 to conduct anodic oxidation. The conditions are that an oxalic acid aqueous solution of 3% (temperature of 10° C.) is used as an electrolyte solution, an arrival voltage is 8 V, a voltage supply period of time is 40 minutes, and a supply current is 20 mA/substrate. Under those anodic oxidation conditions, a voltage is applied to the Al layer 1107 by the Ta film, and an anodic oxide film 1108 (hereinafter referred to as "A.O. film 1108") is formed on a side surface of the Al layer 1107. The A.O. film 1108 is of a porous alumina film. Also, a surface from which the Ta film 1104 is exposed is also slightly anodically oxidized, but this is omitted from the drawings (FIG. 7C).

After the removal of the resist mask 1106, a voltage is again applied to the Ta film 1104 in the anodic oxidizing device to conduct anodic oxidation. The conditions are that ethylene glycol solution containing tartaric acid of 3% is used as an electrolyte solution, an electrolyte solution temperature is 10° C., an arrival voltage is 80 V, a voltage supply period of time is 30 minutes, and a supply current is 30 mA/substrate.

The tartaric acid penetrates into the porous A.O. film 1108 so that the surface of the Al layer 1107 is anodically oxidized to form a barrier-type anodic oxide film (hereinafter referred to as "barrier A.O. film") 1109. The barrier A.O. film 1109 is a non-porous alumina film and has the corrosiveness with respect to bufferred hydrofluoric acid.

Also, an exposed portion of the Ta film 1104 and a portion of the Ta film 1104 in which the porous A.O. film 1108 exists are anodically oxidized and then converted into a tantalum oxide film (hereinafter referred to as "TaOx film") 1111. The remaining tantalum film (Ta layer) 1104 becomes the first wiring layer (Ta layer) 1110. Although the TaOx film 1111 is thicker than the Ta film 1104, those films are shown in FIGS. 19A to 19D so that they have the same thickness for simplification (FIG. 7D).

FIG. 9A shows an enlarged cross-sectional view of a portion surrounded by a dotted line in FIG. 7D. On the insulating film 1103, a Ta layer 1110, a TaOx layer 1111a and a TaOx layer 1111b are laminated in a region where the porous A.O. film 1108 exists. Also, a TaOx layer 1111a and a TaOx layer 1111c are laminated one on another outside of the A.O. film 1108. In the TaOx film 1111, the TaOx layers 1111a and 1111b are portions that have been oxidized in the same process to which the barrier A.O. film 1109 is subjected. The TaOx layer 1111a enters the lower portion of the A.O. film 1109 to the degree of 5 to 20 nm. Because the TaOx layer 1111b has been anodically oxidized in a state where the porous A.O. film 1108 exists, the layer 1111b is made of TaOx containing Al or an oxide of the alloy of Ta and Al. Also, the TaOx layer 1111c is a portion which has been oxidized in the same process as that of the porous A.O. film 1108 and is not finer than the TaOx layer 1111a.

Then, the TaOx film 1111 is etched with the A.O. films 1108 and 1109 as a mask, and the insulating film 1103 is then dry-etched to form a gate insulating film 1112 (FIG. 8A).

Aluminum mixed acid allows the porous A.O. film 1108 to be removed by etching. Then, impurity ions that give conductivity are added to the semiconductor layer 1102, to thereby form the p-type or n-type source and drain regions. The impurities may be added through any one of the ion implantation method, the plasma doping method and the laser doping method. Also, in the case of constituting a CMOS circuit, a region to which the impurity ions are added may be selected by using a resist mask.

In this process, the doping conditions, the dose amount, the acceleration pressure and so on are adjusted so that the gate insulating film 1112, the Ta layer 1110 and the TaOx layer 1111 function as a translucent mask (i.e. a semi-transparent mask). As a result, at portions extending outwardly of the side surface of the barrier A.O. film 1109 in the semiconductor layer 1102, a lightly-doped impurity region is formed in regions 1117 and 1118 where the gate insulating film exists, and a source region and a drain region are formed in regions 1115 and 1116 where no gate insulating film 1112 exists. Also, a region 1119 under the Al layer 1107 is sectioned as the channel formation region (FIG. 8B).

FIG. 9B shows an enlarged diagram of a portion surrounded by a dotted line of FIG. 8B. The gate insulating film 1112, the Ta layer 1110 and the TaOx layer 1111a and the TaOx layer 1111c are laminated on the lightly-doped impurity region 1118. In this structure, since a voltage is applied to the lightly-doped impurity regions 1117 and 1118 by the Ta layer in an on-state, the deterioration of the TFT is caused to be fastened.

In this embodiment, the Ta layer 1110 on the lightly-doped impurity regions 1117 and 1118 is thermally oxidized (FIG. 8C).

A thermally oxidizing temperature is a temperature at which Ta is oxidized and also a temperature which can be withstood by the Al layer, and is set at 400 to 650° C. An atmosphere is an oxidation atmosphere and is dry oxygen atmosphere, steam atmosphere or a halogen containing atmosphere such as hydrochloric acid. It has been recognized that the entire Ta film of 60 nm in thickness can be thermally oxidized in the dry oxygen atmosphere of 450° C. In this example, a heat treatment is conducted in dry oxygen at 450° C. for two hours.

FIG. 9C shows an enlarged diagram of a portion surrounded by a dotted line of FIG. 8C. The gate insulating film 1112 is formed on the lightly-doped impurity region 1118. The Ta layer 1110 on the gate insulating film 1112 is converted into a TaOx layer 1111d by a thermal oxidation process. Accordingly, the TaOx film 1111' consists of the TaOx layers 1111a and 1111b formed by anodic oxidation and the TaOx layer 1111d formed by thermal oxidation. Also, an interface between the Ta layer 1110 and the TaOx film 1111' exists in the lower portion of the barrier A.O. film 1109, and the TaOx film 1111' is overlapped with the lower portion of the barrier A.O. film 1109 by about several tens nm. Accordingly, the Al layer 1107 is structured so as to be surrounded or sandwiched by the Ta layer 1110 and the barrier A.O. film 1109.

In the conventional aluminum single-layer gate wiring, because the heat resistance of an aluminum material is low, only a heat treatment at about 450° C. at the highest in a short period of time is conducted. In addition, in the conventional structure, even if the heat treatment at about 450° C. is conducted, there is the high possibility that aluminum atoms diffuse into the gate insulating film and the semiconductor layer, resulting in a high possibility that the characteristics of the TFT are deteriorated and varied.

In the present invention, because the structure in which the Al layer 1107 of the gate wiring is surrounded by the Ta layer 1110 and the barrier A.O. film 1109 enables the deformation (expansion) of the Al layer 1107 and the diffusion of Al atoms to be prevented, the upper limit of the heating temperature after the gate wiring has been formed can be elevated up to about 500 to 650° C.

Accordingly, in the process of thermally oxidizing the Ta layer (first wiring layer), the activation of the impurities in the source and drain regions and the restoration of the crystalline structure of the semiconductor layer which has been damaged in the doping process can be conducted at the same time. Further, a gettering process can be conducted together as described in the embodiment.

Then, an interlayer insulating film 1120 made of a silicon oxide film is formed. A contact hole is formed in the interlayer insulating film 1120, and a source wiring 1121 and a gate wiring 1122 are formed (FIG. 8D).

Specific embodiments of the present invention will be described with reference to FIGS. 10 to 21C.

First Embodiment

A first embodiment is an example in which the present invention is applied to a TFT, in which an n-channel TFT and a p-channel TFT are formed on the same substrate to produce a CMOS circuit.

FIG. 10 is a top view of the outline of a CMOS circuit. Referring to FIG. 10, reference numeral 201 denotes a gate wiring; 202, a semiconductor layer of an n-channel TFT; and 203, a semiconductor layer of a p-channel TFT. Reference numerals 204 and 205 denote contact portions of the semiconductor layers 202, 203 and a source wiring; and 206 and 207 are contact portions of the semiconductor layers 202, 203 and a drain wiring. Reference numeral 208 is a contact portion (a gate contact portion) of the semiconductor layers 202, 203 and a lead wiring.

A TFT manufacturing process will be described with reference to FIGS. 11A to 11F and 12A to 12D. FIGS. 11A to 11F and 12A to 12D show cross-sectional views of the n-channel TFT at the respective left sides and cross-sectional views of the p-channel TFT at the respective right sides, respectively. The respective cross-sectional views of the TFT correspond to cross-sectional views taken along a chain line A–A' and a chain line B–B' in FIG. 10.

First, a glass substrate (Corning 1737, strain point=667° C.) on the surface of which an under film is formed is prepared as a substrate 200. As the under film, a silicon oxide film of 200 nm in thickness is formed on the glass substrate.

Then, a polycrystal silicon film is formed. First, an amorphous silicon film 251 having a thickness of 45 nm is formed through a reduced pressure CVD. The thickness of the amorphous silicon film 251 is set at 10 to 100 nm (preferably 15 to 75 nm, more preferably 20 to 45 nm). Then, a silicon oxide film of 70 nm in thickness is formed on the upper surface through the plasma CVD method, and opening portions 252a and 252b are formed by wet etching.

Thereafter, an Ni acetic acid solution is coated on the upper surface by a spinner and then dried to form an Ni layer 253. It should be noted that the Ni layer 253 is not a complete layer (FIG. 11A).

The concentration of Ni in the Ni acetic acid solution is 1 to 20 ppm by weight conversion, and in this embodiment, 10 ppm. In this state, in the opening portions 252a and 252b of the mask 252, the regions 251a and 251b of the amorphous silicon film 251 are in contact with the Ni layer 253 to which Ni is added.

Subsequently, the product is heated at 550° C. in a nitrogen atmosphere for 6 hours. As schematically indicated by an arrow, crystal growth is advanced with Ni as a nucleus as Ni diffuses from the regions 251a and 251b. That is, crystal grows in parallel to the substrate surface. In the present specification, the region thus crystallized is called "lateral growth region" (FIG. 11B).

After the removal of a mask 252 made of silicon oxide, the crystallinity of the polycrystal silicon film 252 is promoted by the irradiation of an excimer laser. Then, the polycrystal silicon film 252 is patterned in the form of islands to form the semiconductor layer 202 of the n-channel TFT and the semiconductor layer 203 of the p-channel TFT. Then, a nitrified silicon oxide film having a thickness of 50 to 120 nm, in this example, 80 nm is formed as a gate insulating film 205 so as to cover the semiconductor layers 202 and 203. In this embodiment, one n-channel TFT and one p-channel TFT are shown, respectively, but a plurality of n-channel TFTs and a plurality of p-channel TFTs are formed according to the circuit structure (FIG. 11C).

In this embodiment, the amorphous silicon film is crystallized by using catalytic elements, but other crystallizing methods such as a thermal crystallization method using no catalytic elements, a laser crystallization method that irradiates an excimer laser beam or an RTA method that irradiates infrared rays may be applied. Also, an annealing process after crystallization may be made by thermally annealing or an RTA within an electric furnace other than the irradiation of the excimer laser.

Subsequently, a laminated film consisting of a tantalum film (Ta film) 256 having a thickness of 20 nm and an aluminum film (Al film) 257 containing scandium of 2 wt % and having a thickness of 40 nm is formed on the gate insulating film 205 by a sputtering device. Then, a probe P of an anodic oxidizing device is brought in contact with the Al film 257 to form a thin barrier type alumina film (not shown) on the surface of the Al film 257. This anodic oxidization process is made in order to improve the adhesion of the resist mask. The conditions are that ethylene glycol solution containing tartaric acid of 3% is used as an electrolyte solution, an electrolyte solution temperature is 30° C., an arrival voltage is 10 V, a voltage supply period of time is 15 minutes, and a supply current is 10 mA/substrate.

After a resist film is formed, the alumina film not shown is etched by a chrome mixed acid, and the Al film 257 is etched by aluminum mixed acid to form an Al layer 207 as a second wiring layer. The Al layer 207 constitutes an upper layer of the gate wiring 204. In FIGS. 11A to 11F, there is shown that the Al layer 207 at the left side and the Al layer 207 at the right side are divided. However, in fact, those Al layers 207 are integral with each other as shown in FIG. 10 to form one gate wiring 201 (FIG. 1E).

After the removal of the resist mask, the probe P is brought in contact with the Ta film 256, and a voltage is again applied to the Ta film 256 in the anodic oxidizing device to conduct anodic oxidation. The conditions are that ethylene glycol solution containing tartaric acid of 3% is used as an electrolyte solution, an electrolyte solution temperature is 10° C., an arrival voltage is 80 V, a voltage supply period of time is 30 minutes, and a supply current is 30 mA/substrate.

The Al layer 207 and the Ta film 256 are anodically oxidized at the same time. The surface of the Al layer 207 is anodically oxidized to form a barrier type anodic oxide film (hereinafter referred to as "barrier A.O. film") 209. The barrier A.O. film 209 is of a non-porous alumina film. A portion from which the Ta film 256 is exposed, that is, a portion in which the Al layer 207 is not formed is anodically oxidized so as to be converted into a tantalum oxide film (hereinafter referred to as "TaOx film") 208. The remaining tantalum layer (Ta layer) 206 is sectioned as a first wiring layer.

Although Al and Ta are oxidized at the same time, an interface between the Al layer 207 and the barrier A.O. film 209 is inside of an interface of the Ta layer 207 and the TaOx film 208, and the lower surface of the Al layer 207 is in contact with only the Ta layer 206 according to a difference in an anodic oxidizing rate. Although the TaOx film 208 is about 2 to 3 times as thick as the Ta film 256, those films are shown so that they have the same thickness for simplification (FIG. 11F).

With the above-mentioned processes, the anodic oxidizing process for forming the gate wiring is completed. In this embodiment, because no anodic oxidation wiring is formed, a process for dividing the gate wiring for each wiring is not required after the completion of anodic oxidation.

FIGS. 13A to 13C are cross-sectional views showing the gate wiring shown in FIG. 11E. FIG. 13B is a cross-sectional view of the n-channel TFT along a channel longitudinal direction taken along a chain line X–X' of FIG. 13A. FIG. 13C is a cross-sectional view taken along a plane Y–Y' of FIG. 13A which corresponds to a cross-sectional view of the n-channel TFT taken along a channel widthwise direction. Also, FIG. 13A is a cross-sectional view taken along a plane Z–Z' of FIG. 13B. The plane configuration of the Al layer 207 is analogous to the gate wiring 201 of FIG. 10, but the Al layer 207 is shown in a rectangle for simplification in FIGS. 13A to 13C. As shown in FIGS. 13A to 13C, the thickness tb of the barrier A.O. film 209 is nearly uniform in the periphery of the Al layer 207.

In this embodiment, because there is no process of dividing the Ta layer 206 and the Al layer 207, the side surface of the Ta layer 206 and the upper surface of the Al layer 207 are maintained in a state where they are coated with the anodic oxide films 208 and 209, respectively. In particular, since the Al layer 207 is not exposed, the heat resistance of the gate wiring can be more enhanced.

Then, a resist mask 260 that covers the p-channel TFT is formed, and impurity ions that give an n-type conductivity are added to the semiconductor layer 202. In this embodiment, phosphorus ions are added to the semiconductor layer 202 through the plasma doping method. Phosphine diluted with hydrogen of 5% is used as doping gas. Phosphorus ions are added to the semiconductor layer 202 through the TaOx film 208 and the gate insulating film 205 which extend outwardly of the side surface of the barrier A.O. film 209 so that n-type regions 231 and 232 are formed in a self-aligning manner. In this process, the concentration of phosphorus in the lightly-doped impurity region of the n-channel TFT is determined.

After the resist mask 260 has been peeled off, a resist mask 261 that partially covers the n-channel TFT and a resist mask 262 that covers the p-channel TFT are formed, and n-type impurities are added to the semiconductor layer 202. The length of the lightly-doped impurity region of the n-channel TFT is determined by the resist mask 261.

In two n-type impurity adding processes, n$^+$ type regions 211, 212 and n$^-$ type regions 214, 215 are formed in the semiconductor layer 202 so that the concentration of phosphorus in the n$^+$ type regions 211 and 212 becomes $1 \times 10^{20}$ to $8 \times 10^{21}$ atom/cm$^3$. The n$^+$ type regions 211 and 212 become a source region and a drain region whereas the n$^-$ type regions 214 and 215 become lightly-doped impurities. Also, a region to which phosphorus is not added in the two n-type impurity adding processes becomes a channel formation region 213 (FIG. 12B).

Then, p-type impurities are added to the semiconductor layer 203 of the p-channel TFT. Diborane diluted with hydrogen of 5% is used as a doping gas. P$^+$ type source and drain regions 221, 222, p$^-$ type lightly-doped impurity regions 224, 225, and a channel formation region 223 are formed. How to form the p$^+$ type regions and the p$^-$ type regions, respectively, may be made by the use of a resist mask as in the n-channel TFT.

Subsequently, a heat treatment is conducted on the product at 550° C. in a nitrogen atmosphere for two hours to activate the impurities added to the semiconductor layer. With this heat treatment an improvement in the crystallinity of the region in which crystallinity is destroyed during the ion doping process is advanced. In this embodiment, because the Ta layer 206 disposed in the lower layer of the Al layer 207 can be employed as an aluminum atom blocking layer, the heat treatment for a long period of time and at 450° C. or higher, 500 to 650° C. can be conducted on the product.

FIG. 14 is a partial cross-sectional view showing the gate electrode of FIG. 12C and a cross-sectional view of the gate electrode in a channel longitudinal direction of the n-channel TFT. An interface between the Ta layer 206 and the TaOx film 208 exists in the lower portion of the barrier A.O. film 209, and the TaOx film 208 is overlapped with the lower portion of the barrier A.O. film 209 by about 5 to 20 nm. Accordingly, the Al layer 207 is structured so as to be surrounded or sandwiched by the Ta layer 206 and the barrier A.O. film 209. Also, the thickness of the TaOx film 208 is about 2 to 3 times as large as that of the Ta layer 206 outside of the barrier A.O. film 209.

Also, in this embodiment, since the TaOx film 208 is anodically oxidized in the state where the surface of the Ta film is exposed, the remaining anodic oxidation in a region other than the channel formation region can be eliminated.

Also, because the TaOx film 208 is formed on the entire upper surface of the gate insulating film 205, and the thickness of the TaOx film 208 is about 2 to 3 times as thick as that of the Ta layer 206, a difference in height due to the gate wiring, in particular, a portion crossing the semiconductor layer (gate electrode) can be reduced.

Then, an interlayer insulating film 240 formed of a silicon oxide film is formed. After a contact hole is formed in the interlayer insulating film 240, a laminated film consisting of titanium, aluminum and titanium is formed as an electrode material and then patterned to form wirings 241 to 243. In this example, the n-channel TFT and the p-channel TFT are connected by the wiring 243 to form a CMOS circuit. In addition, a lead wiring 244 of the gate wiring 201 is also formed. Finally, a hydrogenation process is conducted at 350° C. in a hydrogen atmosphere for about two hours to conduct a hydrogen ending process of the entire TFT (FIGS. 12D and 15).

Figure 15:
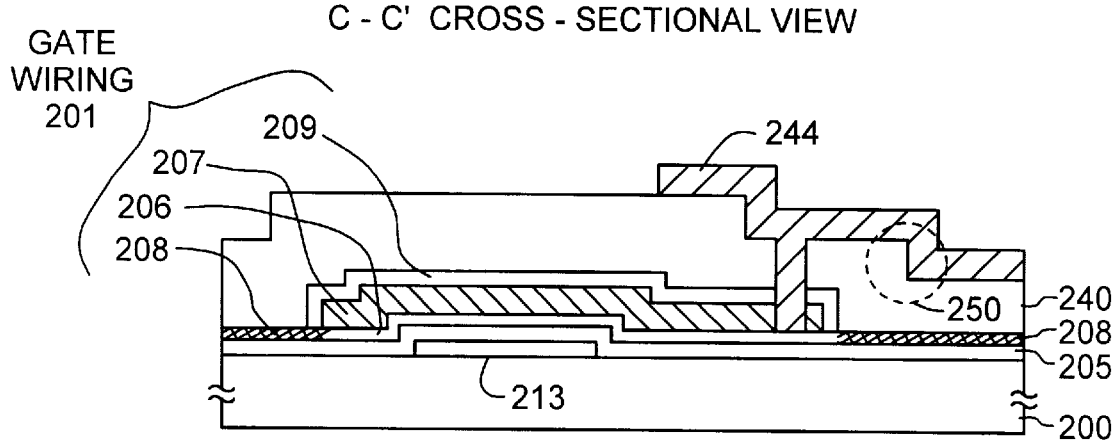
FIG. 15 is a cross-sectional view of an n-channel TFT in a channel widthwise direction.
Figure 16:
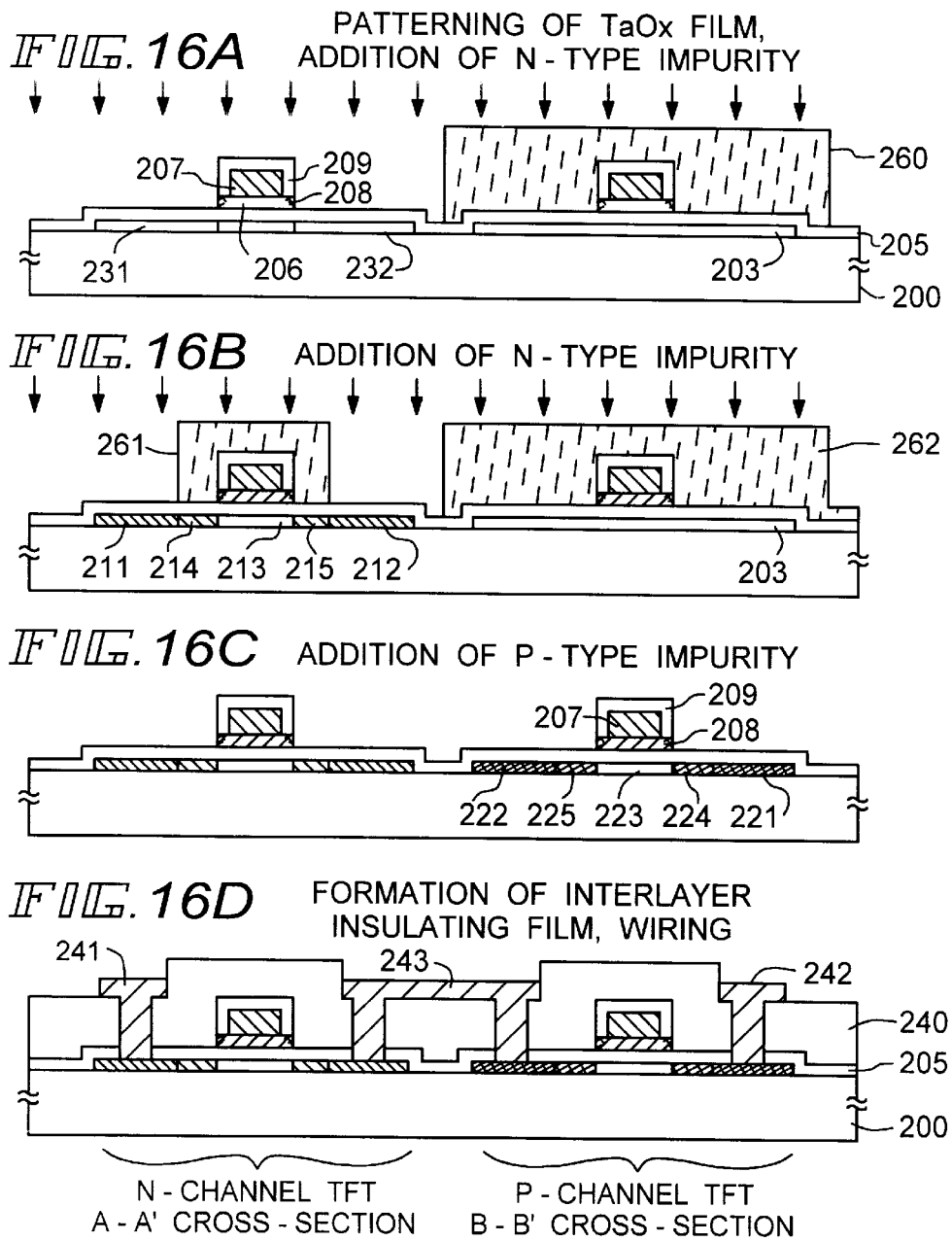
FIGS. 16A to 16D are cross-sectional views of a TFT manufacturing process according to the present invention.

FIG. 15 is a cross-sectional view showing the n-channel TFT of FIG. 12D taken along the channel widthwise direction (a direction orthogonal to the channel length) which corresponds to the cross-sectional view taken along the chain line C–C' of FIG. 10.

Up to now, in the semiconductor device having a multilayer wiring structure, a step that reflects the structure of the lower portion occurs on the surface of the interlayer insulating film, and the disconnection of the wirings is frequently produced at such a step.

In this embodiment, because the TaOx film 208 remains on the upper surface of the gate insulating film 205, and the TaOx film 208 has a thickness of about 2 to 3 times as thick as that of the Ta layer 206, a difference in the height of a step 250 due to the gate wiring is small. Further, since the surface of the interlayer insulating film 240 is flattened by forming the TaOx film 208 on the entire surface of the substrate, a lead wiring 244 that gets over the step 250 can be prevented from being disconnected.

Also, in this embodiment, in the case where a contact hole for the lead wiring 244 is formed, the use of bufferred hydrofluoric acid makes it possible that the Ta layer 206 functions as an etching stopper, thereby being capable of preventing over-etching of the gate insulating film 205.

Second Embodiment

A second embodiment is an example in which the present invention is applied to a TFT, in which an n-channel TFT and a p-channel TFT are formed on the same substrate to produce a CMOS circuit.

FIG. 10 is a top view of the outline of a CMOS circuit. Referring to FIG. 10, reference numeral 201 denotes a gate wiring; 202, a semiconductor layer of an n-channel TFT; and 203, a semiconductor layer of a p-channel TFT. Reference numerals 204 and 205 denote contact portions of the semiconductor layers 202, 203 and a source wiring; and 206 and 207 are contact portions of the semiconductor layers 202, 203 and a drain wiring. Reference numeral 208 is a contact portion (a gate contact portion) of the semiconductor layers 202, 203 and a lead wiring.

A process of manufacturing a TFT will be described with reference to FIGS. 11A to 11F and 16A to 16D. FIGS. 11A to 11F and 16A to 16D show cross-sectional views of the n-channel TFT at the respective left sides and cross-sectional views of the p-channel TFT at the respective right sides. The respective cross-sectional views of the TFT correspond to cross-sectional views taken along a chain line A–A' and a chain line B–B' in FIGS. 6A to 6C.

First, a glass substrate (Corning 1737, strain point=667° C.) on the surface of which an under film is formed is prepared as a substrate 200. As the under film, a silicon oxide film of 200 nm in thickness is formed on the glass substrate.

Then, a polycrystal silicon film is formed. First, an amorphous silicon film 251 having a thickness of 45 nm is formed through a reduced pressure CVD. The thickness of the amorphous silicon film 251 is set at 10 to 100 nm (preferably 15 to 75 nm, more preferably 20 to 45 nm). Then, a silicon oxide film of 70 nm in thickness is formed on the upper surface through the plasma CVD method, and opening portions 252a and 252b are formed by wet etching. Thereafter, an Ni acetic acid solution is coated on the upper surface by a spinner and then dried to form an Ni layer 253. It should be noted that the Ni layer 253 is not a complete layer (FIG. 11A).

The concentration of Ni in the Ni acetic acid solution is 1 to 20 ppm by weight conversion, and in this embodiment, 10 ppm. In this state, in the opening portions 252a and 252b of the mask 252, the regions 251a and 251b of the amorphous silicon film 251 are in contact with the Ni layer 253 to which Ni is added.

Subsequently, the product is heated at 550° C. in a nitrogen atmosphere for 6 hours. As schematically indicated by an arrow, crystal growth is advanced with Ni as a nucleus as Ni diffuses from the regions 251a and 251b. That is, crystal grows in parallel to the substrate surface. In the present specification, the region thus crystallized is called "lateral growth region" (FIG. 11B).

After the removal of a mask 252 made of silicon oxide, the crystallinity of the polycrystal silicon film 252 is promoted by the irradiation of an excimer laser. Then, the polycrystal silicon film 252 is patterned in the form of islands to form the semiconductor layer 202 of the n-channel TFT and the semiconductor layer 203 of the p-channel TFT. Then, a nitrified silicon oxide film having a thickness of 50 to 120 nm, in this example, 80 nm is formed as a gate insulating film 205 so as to cover the semiconductor layers 202 and 203. In this embodiment, one n-channel TFT and one p-channel TFT are shown, respectively, but a plurality of n-channel TFTs and a plurality of p-channel TFTs are formed according to the circuit structure (FIG. 11C).

In this embodiment, the amorphous silicon film is crystallized by using catalytic elements, but other crystallizing methods such as a thermal crystallization method using no catalytic elements, a laser crystallization method that irradiates an excimer laser beam or an RTA method that irradiates infrared rays may be applied. Also, an annealing process after crystallization may be made by thermally annealing in an electric furnace other than the irradiation of the excimer laser.

Subsequently, a laminated film consisting of a tantalum film (Ta film) 256 having a thickness of 20 nm and an aluminum film (Al film) 257 containing scandium of 2 wt % and having a thickness of 40 nm is formed on the gate insulating film 205 by a sputtering device. Then, a probe P of an anodic oxidizing device is brought in contact with the Al film 257 to form a thin barrier type alumina film (not shown) on the surface of the Al film 257. This anodic oxidizing process is made in order to improve the adhesion of the resist mask. The conditions are that ethylene glycol solution containing tartaric acid of 3% is used as an electrolyte solution, an electrolyte solution temperature is 30° C., an arrival voltage is 10 V, a voltage supply period of time is 15 minutes, and a supply current is 10 mA/substrate.

After a resist mask is formed, the alumina film not shown is etched by a chrome mixed acid, and the Al film 257 is etched by aluminum mixed acid to form an Al layer 207 as a second wiring layer. The Al layer 207 constitutes an upper layer of the gate wiring 204. In FIGS. 7A to 7D, there is shown that the Al layer 207 at the left side and the Al layer 207 at the right side are divided. However, in fact, those Al layers 207 are integral with each other as shown in FIG. 10 to form one gate wiring 201 (FIG. 11E).

After the removal of the resist mask, the probe P is brought in contact with the Ta film 256, and a voltage is again applied to the Ta film 256 in the anodic oxidizing device to conduct anodic oxidation. The conditions are that ethylene glycol solution containing tartaric acid of 3% is used as an electrolyte solution, an electrolyte solution temperature is 10° C., an arrival voltage is 80 V, a voltage supply period of time is 30 minutes, and a supply current is 30 mA/substrate.

The Al layer 207 and the Ta film 256 are anodically oxidized at the same time. The surface of the Al layer 207 is anodically oxidized to form a barrier type anodic oxide film (hereinafter referred to as "barrier A.O. film") 209. The barrier A.O. film 209 is of a non-porous alumina film. A portion from which the Ta film 256 is exposed, that is, a portion in which the Al layer 207 is not formed is anodically oxidized so as to be converted into a tantalum oxide film (hereinafter referred to as "TaOx film") 208. The remaining tantalum layer (Ta layer) 206 is sectioned as a first wiring layer.

Although Al and Ta are oxidized at the same time, an interface between the Al layer 207 and the barrier A.O. film 209 is inside of an interface of the Ta layer 207 and the TaOx film 208, and the lower surface of the Al layer 207 is in contact with only the Ta layer 206 according to a difference in an anodic oxidizing rate. Although the TaOx film 208 is about 2 to 3 times as thick as the Ta film 256, those films are shown so that they have the same thickness for simplification (FIG. 11F).

With the above-mentioned processes, the anodic oxidizing process for forming the gate wiring is completed. In this embodiment, because no anodic oxidation wiring is formed, a process for dividing the gate wiring for each wiring is not required after the completion of anodic oxidation.

FIGS. 13A to 13C are cross-sectional views showing the gate wiring shown in FIG. 11E. FIG. 13B is a cross-sectional view of the n-channel TFT along a channel longitudinal direction taken along a chain line X–X' of FIG. 13A. FIG. 13C is a cross-sectional view taken along a plane Y–Y' of FIG. 13A which corresponds to a cross-sectional view of the n-channel TFT taken along a channel widthwise direction. Also, FIG. 13A is a cross-sectional view taken along a plane Y–Y' of FIG. 13A. The plane configuration of the Al layer 207 is analogous to the gate wiring 201 of FIG. 10, but the Al layer 207 is shown in a rectangle for simplification in FIGS. 13A to 13C. As shown in FIGS. 13A to 13C, the thickness tb of the barrier A.O. film 209 is nearly uniform in the periphery of the Al layer 207.

In this embodiment, because there is no process of dividing the Ta layer 206 and the Al layer 207, the side surface of the Ta layer 206 and the upper surface of the Al layer 207 are maintained in a state where they are coated with the anodic oxide films 208 and 209, respectively. In particular, since the Al layer 207 is not exposed, the heat resistance of the gate wiring can be more enhanced.

Then, the TaOx film 208 is patterned with the barrier A.O. film 209 as a mask in a self-aligning manner. In patterning, the dry etching method using a $CHF_3$ gas is employed. Since the $CHF_3$ gas also etches the gate insulating film 205, an etching processing period of time is controlled in such a manner that only the TaOx film 208 is removed so that the semiconductor layers 202 and 203 are prevented from being exposed.

Then, after the TaOx film 208 has been etched, a resist mask 260 that covers the p-channel TFT is formed, and impurity ions that give an n-type conductivity are added to the semiconductor layer 202. In this embodiment, phosphorus ions are added to the semiconductor layer 202 through the plasma doping method. Phosphine diluted with hydrogen of 5% is used as a doping gas. Phosphorus ions are added to the semiconductor layer 202 through the gate insulating film 205 so that n-type regions 231 and 232 are formed in a self-aligning manner. In this process, the concentration of phosphorus in the lightly-doped impurity region of the n-channel TFT is determined.

After the resist mask 260 has been peeled off, a resist mask 261 that partially covers the n-channel TFT and a resist mask 262 that covers the p-channel TFT are formed, and n-type impurities are added to the semiconductor layer 202. The length of the lightly-doped impurity region of the n-channel TFT is determined by the resist mask 261.

In two n-type impurity adding processes, n$^+$ type regions 211, 212 and n$^-$ type regions 214, 215 are formed in the semiconductor layer 202 so that the concentration of phosphorus in the n$^+$ type regions 211 and 212 becomes $1\times10^{20}$ to $8\times10^{21}$ atom/cm$^3$. The n$^+$ type regions 211 and 212 become a source region and a drain region whereas the n$^-$ type regions 214 and 215 become lightly-doped impurities. Also, a region to which phosphorus is not added in the two n-type impurity adding processes becomes a channel formation region 213 (FIG. 16B).

Then, p-type impurities are added to the semiconductor layer 203 of the p-channel TFT. Diborane diluted with hydrogen of 5% is used as a doping gas. P$^+$ type source and drain regions 221, 222, p$^-$ type lightly-doped impurity regions 224, 225, and a channel formation region 223 are formed. How to form the p$^+$ type regions and the p$^-$ type regions, respectively, may be made by the use of a resist mask as in the n-channel TFT.

Subsequently, a heat treatment is conducted on the product at 550° C. in a nitrogen atmosphere for two hours to activate the impurities added to the semiconductor layer. With this heat treatment, an improvement in the crystallinity of the region in which crystallinity is destroyed during the ion doping process is advanced. In this embodiment, because the Ta layer 206 disposed in the lower layer of the Al layer 207 can be employed as an aluminum atom blocking layer, the heat treatment for a long period of time and at 450° C. or higher, 500 to 650° C. can be conducted on the product.

FIG. 14 is a partial cross-sectional view showing the gate electrode of FIG. 16C and a cross-sectional view of the gate electrode in a channel longitudinal direction of the n-channel TFT. An interface between the Ta layer 206 and the TaOx film 208 exists in the lower portion of the barrier A.O. film 209, and the TaOx film 208 is overlapped with the lower portion of the barrier A.O. film 209 by about 5 to 20 nm. Accordingly, the Al layer 207 is structured so as to be surrounded or sandwiched by the Ta layer 206 and the barrier A.O. film 209. Also, the thickness of the TaOx film 208 is about 2 to 3 times as large as that of the Ta layer 206 outside of the barrier A.O. film 209.

Also, in this embodiment, because the TaOx film 208 is etched with the barrier A.O. film 209 as a mask, the TaOx film 208 does not exist on the source and drain regions 211, 212, 221 and 222, and the side surface of the TaOx film 208 and the side surface of the barrier A.O. film 209 are substantially on the same plane.

Further, because a CHF$_3$ gas is used in the etching, a region where the TaOx film 208 does not exist on the upper surface of the gate insulating film 205, that is, a region that covers the source and drain regions 211, 212, 221 and 222 are caused to be slightly etched. For that reason, in the gate insulating film 205, the thickness (the means thickness or the thickness of the thinnest portion) in this region is thinner than the thickness in the region crossing the gate wiring 201.

Subsequently, an interlayer insulating film 240 formed of a silicon oxide film is formed. After a contact hole is formed in the interlayer insulating film 240, a laminated film consisting of titanium, aluminum and titanium is formed as an electrode material and then patterned to form wirings 241 to 243. In this example, the n-channel TFT and the p-channel TFT are connected by the wiring 243 to form a CMOS circuit.

In addition, a lead wiring 244 of the gate wiring 201 is also formed. Finally, a hydrogenation process is conducted at 350° C. in a hydrogen atmosphere for about two hours to conduct a hydrogen ending process of the entire TFT (FIGS. 16D and 17).

Figure 17:
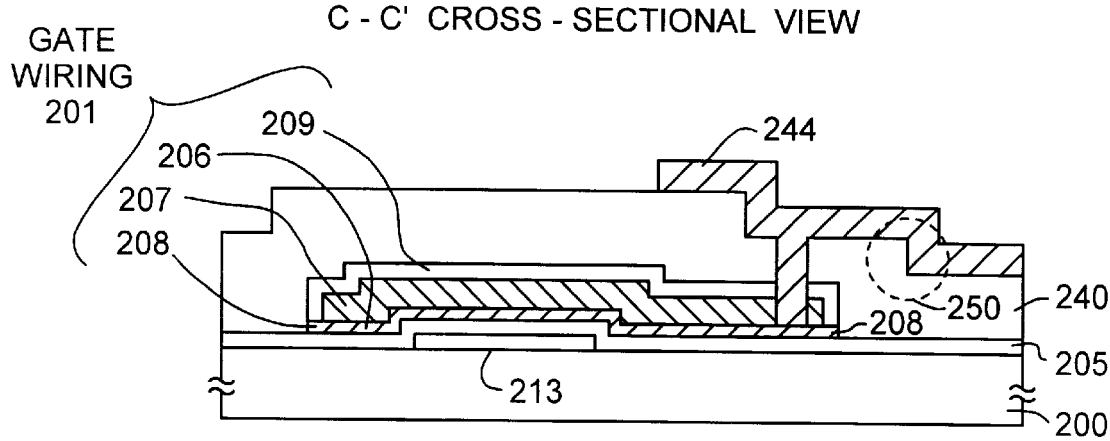
FIG. 17 is a cross-sectional view of an n-channel TFT in a channel widthwise direction.

FIG. 17 is a cross-sectional view showing the n-channel TFT of FIG. 16D taken along the channel widthwise direction (a direction orthogonal to the channel length) which corresponds to the cross-sectional view taken along the chain line C–C' of FIGS. 6A to 6C.

This embodiment has a conductive layer in which the gate wiring Ta layer 206 and the Al layer 207 are laminated.

For that reason, in this embodiment, in the case where a contact hole for the lead wiring 244 is formed, the use of bufferred hydrofluoric acid makes it possible that the Ta layer 206 functions as an etching stopper, thereby being capable of preventing over-etching of the gate insulating film 205.

Third Embodiment

A third embodiment is an example in which the present invention is applied to a TFT, in which an n-channel TFT and a p-channel TFT are formed on the same substrate to produce a CMOS circuit.

FIG. 10 is a top view of the outline of a TFT. Referring to FIG. 10, reference numeral 201 denotes a gate wiring; 202, a semiconductor layer of an n-channel TFT; and 203, a semiconductor layer of a p-channel TFT. Reference numerals 204 and 205 denote contact portions of the semiconductor layers 202, 203 and a source wiring; and 206 and 207 are contact portions of the semiconductor layers 202, 203 and a drain wiring. Reference numeral 508 is a contact portion (a gate contact portion) of the semiconductor layers 202, 203 and a lead wiring (not shown).

A process of manufacturing a TFT will be described with reference to FIGS. 18A to 18E and 19A to 19D. FIGS. 18A to 18E and 19A to 19D show cross-sectional views of the n-channel TFT at the respective left sides and cross-sectional views of the p-channel TFT at the respective right sides, respectively. The respective cross-sectional views of the TFT correspond to cross-sectional views taken along a dotted line A A' and a dotted line B–B' in FIG. 10.

Figure 18A:
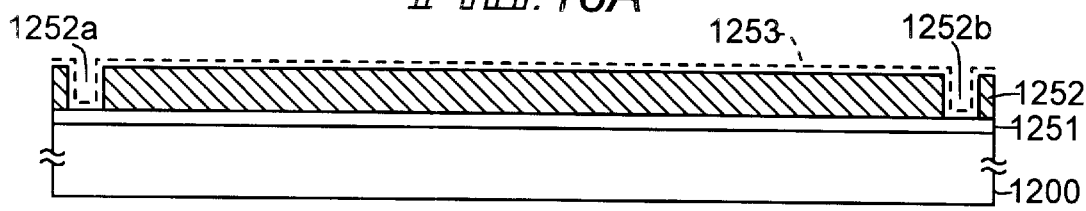
FIGS. 18A to 18E are cross-sectional views of a TFT manufacturing process according to the present invention.

First, a glass substrate (Corning 1737, strain point=667° C.) is prepared as a substrate 1200, and a silicon oxide film is formed in thickness of 200 nm on the surface of the glass substrate as an under film not shown. Then, a polycrystal silicon film is formed. First, an amorphous silicon film 1251 having a thickness of 45 nm is formed through a reduced pressure CVD. The thickness of amorphous silicon film 1251 is 10 to 100 nm (preferably 15 to 75 nm, more preferably 20 to 45 nm). Then, a silicon oxide film of 70 nm in thickness is formed on the upper surface through the plasma CVD method, and opening portions 1252a and 1252b are formed by wet etching. Thereafter, an Ni acetic acid solution is coated on the upper surface by a spinner and then dried to form an Ni layer 1253. It should be noted that the Ni layer 1253 is not a complete layer (FIG. 18A).

The concentration of Ni in the Ni acetic acid solution is 1 to 20 ppm by weight conversion, and in this embodiment, 10 ppm. In this state, in the opening portions 1252a and 1252b of the mask 1252, the regions 1251a and 1251b of the amorphous silicon film 1251 are added with Ni.

Figure 18B:
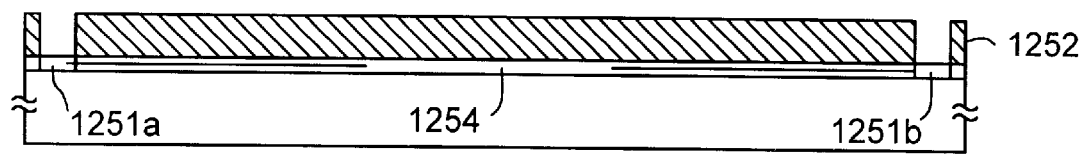

Subsequently, the product is heated at 550° C. in a nitrogen atmosphere for 6 hours. As schematically indicated by an arrow, crystal growth is advanced with Ni as a nucleus as Ni diffuses from the regions 1251*a* and 1251*b*. That is, crystal grows in parallel to the substrate surface. In the present specification, the region thus crystallized is called "lateral growth region" (FIG. 18B).

Figure 18C:
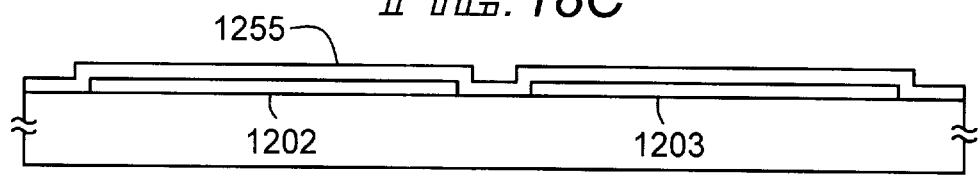

After the removal of a mask 1252 made of silicon oxide, the polycrystal silicon film 1252 is patterned to form the semiconductor layer 1202 of the n-channel TFT and the semiconductor layer 1203 of the p-channel TFT. Then, a nitrified silicon oxide film which forms a gate insulating film is formed in thickness of 120nm so as to cover the semiconductor layers 1202 and 1203. In this embodiment, one n-channel TFT and one p-channel TFT are shown, respectively, but a plurality of n-channel TFTs and a plurality of p-channel TFTs are formed according to the circuit structure (FIG. 18C).

Subsequently, a tantalum film (Ta film) 1256 having a thickness of 20 nm and an aluminum film (Al film) 1257 containing scandium of 2 wt % and having a thickness of 40 nm are formed on the substrate 1200 by a sputtering device. Then, a probe P of an anodic oxidizing device is brought in contact with the Al film 1257 to form a thin barrier type alumina film (not shown) on the surface of the Al film 1257. This anodic oxidizing process is made in order to improve the adhesion of the resist mask. The conditions are that ethylene glycol solution containing tartaric acid of 3% is used as an electrolyte solution, an electrolyte solution temperature is 30° C., and arrival voltage is 10 V, a voltage supply period of time is 15 minutes, and a supply current is 10 mA/substrate.

A resist mask 1258 is formed. The alumina film not shown is etched by a chrome mixed acid, and the Al film 1257 is etched by aluminum mixed acid to form an Al layer 1207 as a second wiring layer. The Al layer 1207 constitutes an upper layer of the gate wiring 1204. In FIGS. 18A to 18E, there is shown that the Al layer 1207 at the left side and the Al layer 1207 at the right side are divided. However, in fact, those Al layers 1207 are integral with each other as shown in FIG. 10 (FIG. 18E).

Figure 18D:
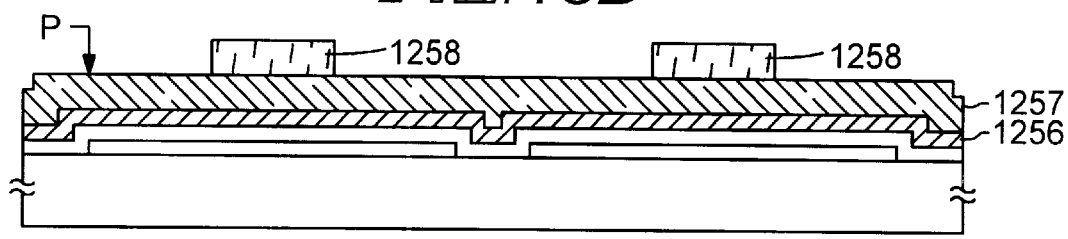
Figure 18E:
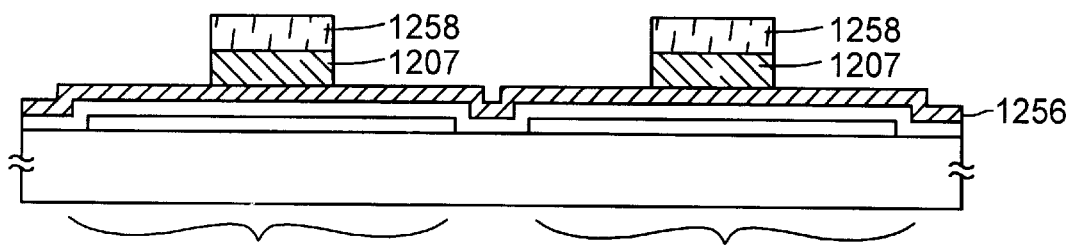

FIGS. 21A to 21C are cross-sectional views showing the gate wiring shown in FIG. 18D. FIG. 21B is a cross-sectional view of the n-channel TFT along a channel longitudinal direction taken along a chain line X–X' of FIG. 21A. FIG. 21C is a cross-sectional view taken along a plane Y–Y' of FIG. 21A which corresponds to a cross-sectional view of the n-channel TFT taken along a channel widthwise direction. Also, FIG. 22A is a cross-sectional view taken along a plane Z–Z' of FIG. 18B. The relation between the section X–X', the section Y–Y' and the section Z–Z' in FIGS. 22A to 22C and 23A to 23C is identical with that in FIGS. 21A to 21C. The plane configuration of the Al layer 1207 is analogous to the gate wiring 1201 of FIG. 10, but the Al layer 1207 is shown in a rectangle for simplification. The same is applied to the Al layer 1207 in FIGS. 22A to 22C and 23A to 23C.

Figure 19A:
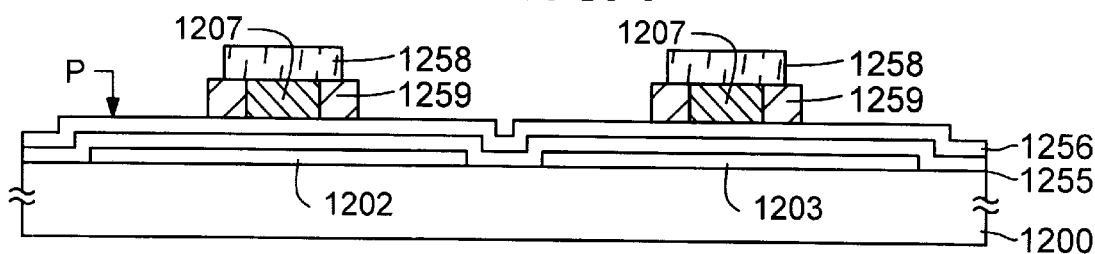
FIGS. 19A to 19D are cross-sectional views of a TFT manufacturing process according to the present invention.

Subsequently, while the resist mask 1258 remains, a probe P of an anodic oxidizing device is brought in contact with the Ta film 1256 to conduct anodic oxidation. The conditions are that an oxalic acid aqueous solution of 3% (temperature of 10° C.) is used as an electrolyte solution, an arrival voltage is 8 V, a voltage supply period of time is 40 minutes, and a supply current is 20 mA/substrate. Under those anodic oxidation conditions, a porous anodic oxide film 1259 (hereinafter referred to as "A.O. film 1259") is formed on a side surface of the Al layer 1207. The A.O. film 1259 is of a porous alumina film. Also, a surface of the A.O. film 1259 from which the Ta film 1256 is exposed is also slightly anodically oxidized, but this is omitted from the drawings (FIG. 19A).

After the removal of the resist mask 1258, the probe P is again brought in contact with the Ta film 1256 in the anodic oxidizing device to conduct anodic oxidation. The conditions are that ethylene glycol solution containing tartaric acid of 3% is used as an electrolyte solution, an electrolyte solution temperature is 10° C., an arrival voltage is 80 V, a voltage supply period of time is 30 minutes, and a supply current is 30 mA/substrate.

The tartaric acid penetrates into the porous A.O. film 1259 so that the surface of the Al layer 1207 is anodically oxidized to form a barrier-type anodic oxide film (hereinafter referred to as "barrier A.O. film") 1209. The barrier A.O. film 1209 is a non-porous alumina film. An exposed portion of the Ta film 1256 and a portion of the Ta film 1256 in which the porous A.O. film 1259 exists are also anodically oxidized and then converted into a tantalum oxide film (hereinafter referred to as "TaOx film") 1208. The remaining tantalum layer (Ta layer) 1206 is sectioned as the first wiring layer. Although the TaOx film 1208 is thicker than the Ta film 1206, those films are shown so that they have the same thickness for simplification (FIG. 19B).

Figure 19B:
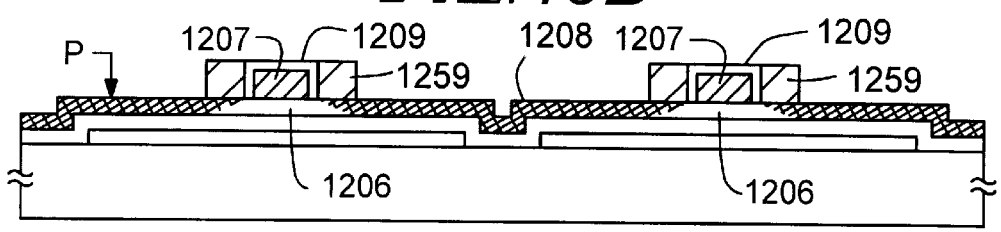

FIGS. 22A to 22C show cross-sectional views of the gate wiring in the state of FIG. 19B. As shown in FIGS. 22A to 22C, the thickness tp of the porous A.O. film 1259 projecting from the side surface of the barrier A.O. film 1209 and the thickness tb of the barrier A.O. 1209 are all nearly uniform in the periphery of the Al layer 1207.

Also, in the anodic oxidation process of FIG. 19B, a region of the Ta film 1255 on the upper portion of which the porous A.O. film 1259 exists is not completely oxidized, and the TaOx film 1208 is formed on the upper layer because the Ta layer 1206 remains on the lower layer. A part of the TaOx film 1208 exists also in the lower portion of the barrier A.O. film 1209.

Figure 19C:
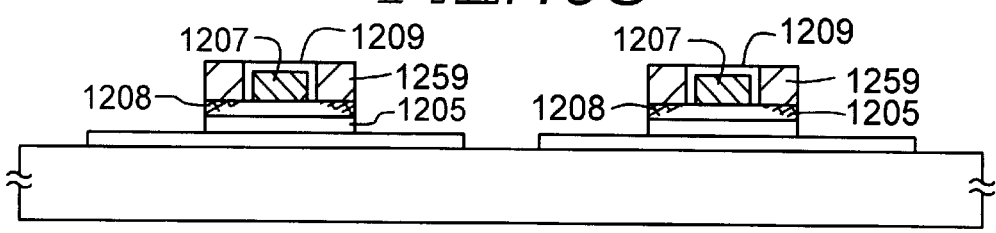

Then, the TaOx film 1208 and the gate insulating film 1207 are dry-etched with the A.O. films 1209 and 1259 as a mask to form a gate insulating film 1205. An etching gas resulting from mixing $CF_4$ with $O_2$ gas is used in etching (FIG. 19C).

Figure 19D:
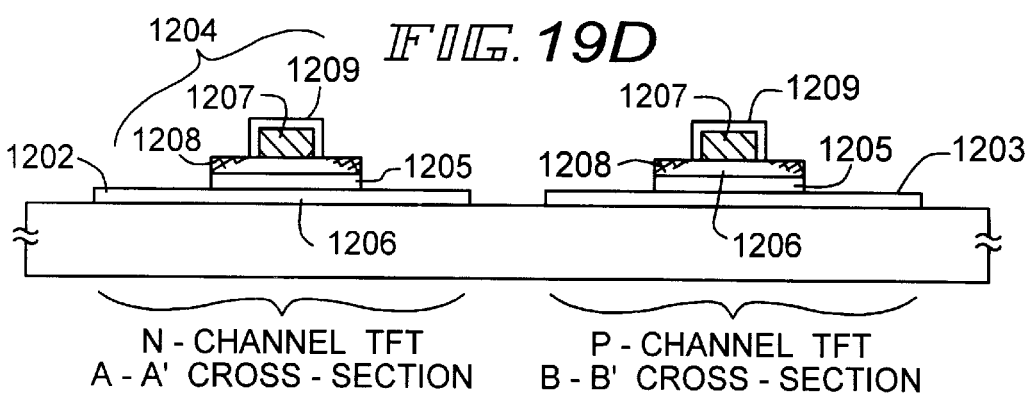

Aluminum mixed acid allows the porous A.O. film 1259 to be removed by etching. Also, at a portion of the gate insulating film 1205 extending outwardly of the side surface of the barrier A.O. film 1209, a Ta layer 1206 as a lower layer and a TaOx film 1208 as an upper layer are laminated one on another (FIG. 19D).

In this embodiment, because no wiring for anodic oxidation is formed, there is required no process of dividing the gate wiring for each wiring after the anodic oxidation has been completed.

Subsequently, impurity ions that give the n-type conductivity are added to the semiconductor layers 1202 and 1203. In this embodiment, phosphorus ions are added to the semiconductor layers 1202 and 1203 through the plasma doping method. Phosphine diluted with hydrogen of 5% is used as a doping gas. An acceleration voltage is elevated to 60 to 90 keV. The dose amount is set at $1 \times 10^{13}$ to $8 \times 10^{15}$ atoms/cm$^3$. Because the acceleration voltage is high in this process, phosphorus ions are added to the semiconductor layers 1202 and 1203 through the TaOx film 1208, the Ta layer 1206 and the end portion of the gate insulating film 1205.

Subsequently, a second doping process is conducted at a low acceleration voltage of 5 to 10 keV. In this process, because the acceleration voltage is low, the gate insulating film 1205 completely functions as a mask.

Figure 20A:
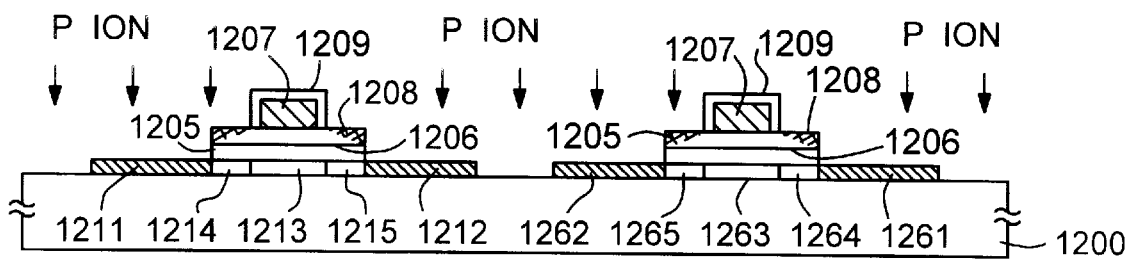
FIGS. 20A to 20D are cross-sectional views of a TFT manufacturing process according to the present invention.

In this embodiment, phosphorus is added to the n$^+$ type regions indicated by reference numerals 1211, 1212, 1261 and 1262 with a concentration of $1\times10^{20}$ to $8\times10^{21}$ atoms/cm$^3$. The concentration of phosphorus in the n$^-$ type regions indicated by reference numerals 1214, 1215, 1264 and 1265 is adjusted to be $1\times10^{15}$ to $1\times10^{17}$ atoms/cm$^3$. In the n-channel TFT, the n$^+$ type regions 1211 and 1212 are the source region and the drain region, and the n$^-$ type regions 1214 and 1215 are lightly-doped impurities (FIG. 20A).

Figure 20B:
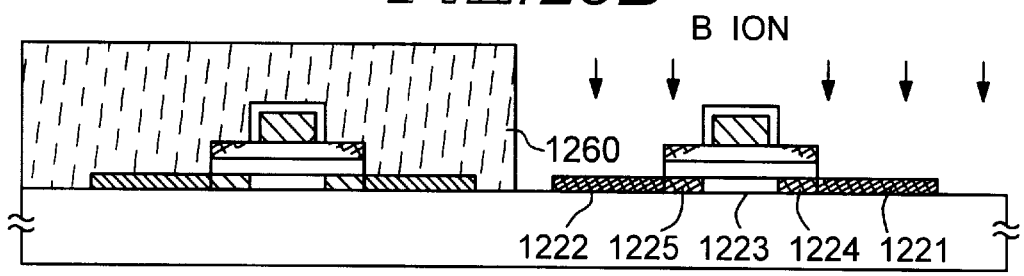

Then, the n-channel TFT is covered with a resist mask 1260, and boron ions are added to the semiconductor layer 1203 to form p$^+$ type regions 1221, 1222 and p$^-$ type regions 1224, 1225. Diborane diluted with hydrogen of 5% is used as a doping gas. The dose amount of boron is set in such a manner that the concentration of boron ions in the p$^+$ regions 1221 and 1222 becomes about 1.3 to 2 times as large as the concentration of phosphorus ions which are added to the n$^+$ type regions 1262 and 1261 (FIG. 20B).

The p$^+$ regions 1221 and 1222 are the source region and the drain region of the p-channel TFT, and the p$^-$ type regions 1224 and 1225 are the lightly-doped impurity regions. The regions 1213 and 1223 into which phosphorus ions and boron ions have not been implanted are intrinsic or substantially intrinsic channel formation regions which will form carrier moving paths later.

The "intrinsic region" is directed to a complete neutral region in which electrons completely balance with holes, and the "substantially intrinsic region" is directed to a region containing impurities that give the p-type or n-type conductivity in a range of concentration where a threshold value is controllable ($1\times10^{15}$ to $1\times10^{17}$ atoms/cm$^3$), or a region in which the conductivity is offset by intentionally adding the reverse conductive impurities.

Subsequently, a heat treatment is conducted on the product at 550° C. in a dry oxygen atmosphere for 2 hours. In this embodiment, because the Ta layer 1206 disposed in the lower layer of the Al layer 1207 can be employed as an aluminum atom blocking layer, the heat treatment for a long period of time and at 450° C. or higher, 500 to 650° C. can be conducted on the product (FIG. 20C).

Due to the heat treatment in the oxidizing atmosphere, and also in the above-described heat treatment in the dry oxygen atmosphere, a Ta layer 1206 remained in a portion extending outwardly from the side surface of the barrier A.O. film 1209 of the gate insulating film 1205 is oxidized. With this process, the Ta layer 1206' is sectioned as the first wiring layer that constitutes the gate wiring 1201. Also, the TaOx film 1208' consists of a portion oxidized by anodic oxidation and a portion thermally oxidized.

Figure 20C:
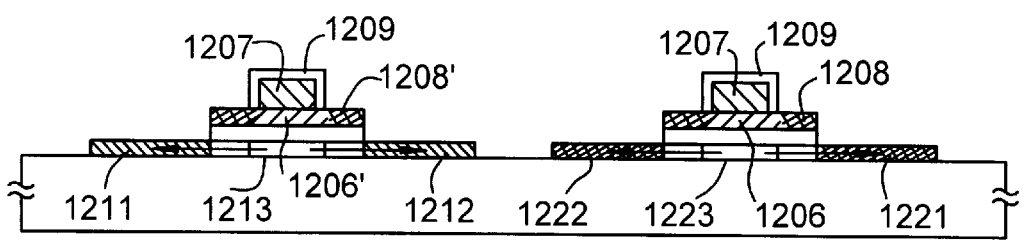
Figure 23A:
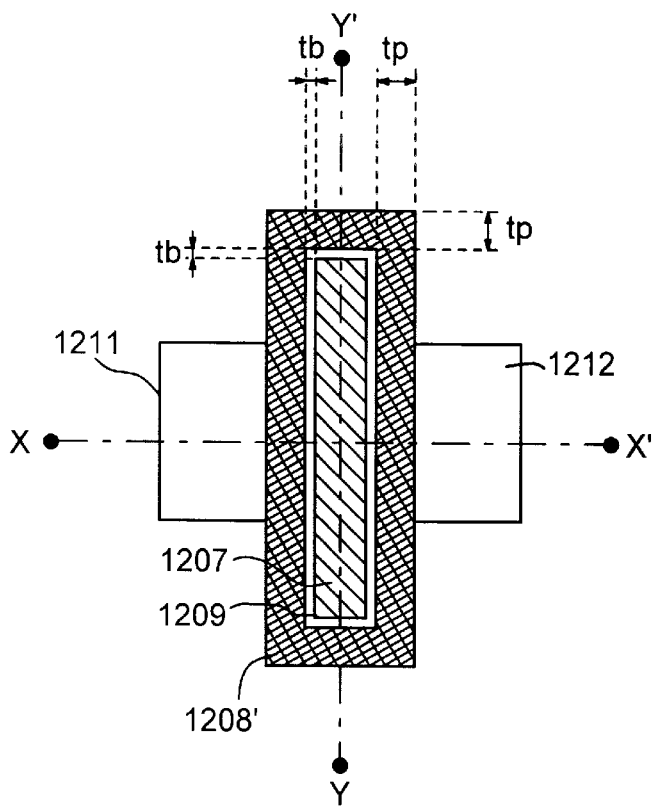
FIGS. 23A to 23C are cross-sectional views of a gate wiring.
Figure 23C:
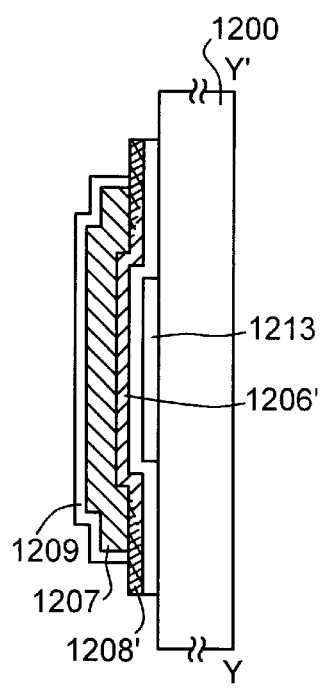
Figure 23B:
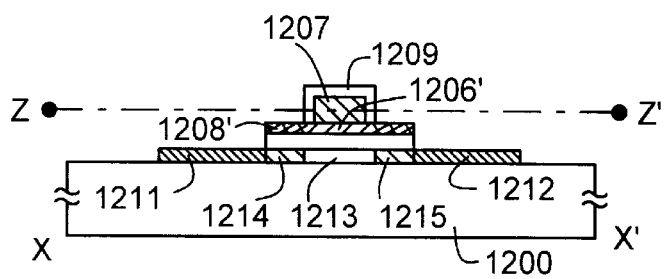
Figure 24:
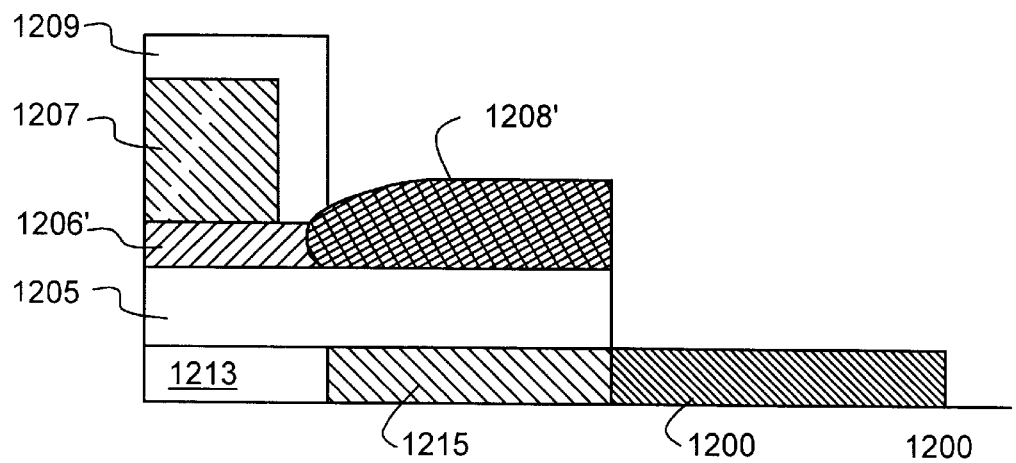
FIG. 24 is a partially enlarged view of a TFT.

FIGS. 23A to 23C show cross-sectional views of the gate wiring in a state of FIG. 20C. FIG. 24 shows an partially enlarged diagram of an n-channel TFT in a state of FIG. 19C. The TaOx film 1208' extends outside the side surface of the barrier A.O. film 1209. Also, an interface between the Ta layer 1206' and the TaOx film 1208' exists in the lower portion of the barrier A.O. film 1209, and the TaOx film 1208' is overlapped with the lower portion of the barrier A.O. film 1209 by about several tens nm. Accordingly, the Al layer 1207 is structured so as to be surrounded or sandwiched by the Ta layer 1206' and the barrier A.O. film 1209.

Before the heat treatment is conducted in the oxidizing atmosphere, the Ta layer 1206 exists also on the low-concentration impurity regions 1214, 1215, 1224 and 1225 through a gate insulating film 1205. If the Ta layer 1206 exists in these lightly-doped impurity regions, a voltage is applied to the lightly-doped impurity regions by the Ta layer in the on-state, and thus the TFT is likely to deteriorate.

Also, in the off-state, a current is liable to leak from the drain region. By removing the Ta film remained on the lightly-doped impurity regions, the deterioration and the leak current can be reduced.

Due to the above-described heating process, Ni intentionally added for crystallization of the amorphous silicon film diffuses into the respective source and drain regions 1211, 1212, 1221 and 1222 from the channel formation regions 1213 and 1223 as schematically indicated by an arrow in FIG. 20C. This is because those regions contain phosphorus elements at a high concentration, and Ni that reaches those source and drain regions are gettered there. A heat treatment at 500 to 600° C. for about two to four hours enables Ni to diffuse about 5 to 10 μm.

As a result, the concentration of Ni within the channel formation regions 1213 and 1223 can be reduced. The concentration of Ni in the channel formation region can be set as $5\times10^{17}$ atoms/cm$^3$ or less which is a lower limit detected by the SIMS. On the other hand, the concentration of Ni in the source and drain regions 1211, 1212, 1221 and 1222 which are used for gettering sink becomes higher than the channel formation regions 1213 and 1223.

As the impurities that give the n-type conductivity, antimony or bismuth can be used other than phosphorus. Phosphorus is the highest in gettering capability, and antimony is higher.

In particular, it has been proved through the experiments that the region to which both of phosphorus and boron are added in which the concentration of boron is about 1.3 to 2 times as high as that of phosphorus as in the source and drain regions 1221 and 1222 of the p-channel TFT is higher in gettering capability than the source and drain regions 1211 and 1212 of the n-channel TFT to which only phosphorus is added.

In addition, with this heat treatment, phosphorus and boron which are added to the source and drain regions 1211, 1212, 1221 and 1222 and the lightly-doped impurity regions 1214, 1215, 1224 and 1225 are activated while gettering is effected. Up to now, because the heat resistance of the aluminum material is low, only the heat treatment at about 450° C. is conducted with the result that the activation of dopant (phosphorus, boron) is low, and the activating process with an excimer laser needs to be implemented. In this embodiment, since the heating temperature is elevated to 500° C. or higher, the dopant can be sufficiently activated, and the resistance in the source and drain regions can be more lowered by only the heat treatment.

In addition, because the heating temperature rises, an improvement in the crystallinity of the region in which crystallinity is destroyed by the doping process is advanced by the heat treatment.

In other words, in the heat treatment in the oxidizing atmosphere of FIG. 20C, the following processes can be conducted at the same time.

1) A thermal oxidizing process for oxidizing the Ta layer 1206 remaining on the lightly-doped impurity region;
2) A gettering process for reducing the concentration of metal elements in the channel formation region;
3) An impurity activating process in the source and drain regions; and
4) An annealing process for restoring the damage of the crystal structure which is caused at the time of ion implantation.

In the conventional aluminum single-layer gate wiring, because the heat resistance of an aluminum material is low, only a heat treatment at about 450° C. at the highest in a short period of time is conducted. In addition, in the conventional structure, even if the heat treatment at about 450° C. is conducted, there is the high possibility that aluminum atoms diffuse into the gate insulating film and the semiconductor layer, resulting in a high possibility that the characteristics of the TFT are deteriorated and varied.

In this embodiment, because the structure in which the Al layer 1207 of the gate wiring is surrounded by the Ta layer 1206' and the barrier A.O. film 1209 enables the deformation (expansion) of the Al layer 1207 and the diffusion of Al atoms to be prevented, the upper limit of the heating temperature after the gate wiring has been formed can be elevated up to about 500 to 650° C.

Subsequently, an interlayer insulating film 1240 formed of a silicon oxide film is formed. After a contact hole is formed in the interlayer insulating film 1240, a laminated film consisting of titanium, aluminum and titanium is formed as an electrode material and then patterned to form wirings 1241 to 1243. In this example, the n-channel TFT and the p-channel TFT are connected by the wiring 1243 to form a CMOS circuit. In addition, a lead wiring 1244 of the gate wiring 1201 is also formed (FIG. 20D).

Finally, a hydrogenation process is conducted in a hydrogen atmosphere at 350° C. for about two hours to conduct a hydrogen ending process of the entire TFT.

Figure 20D:
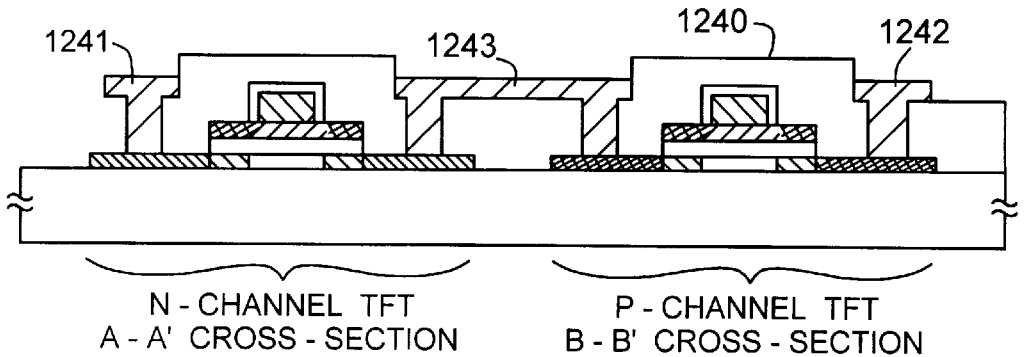
Figure 25:
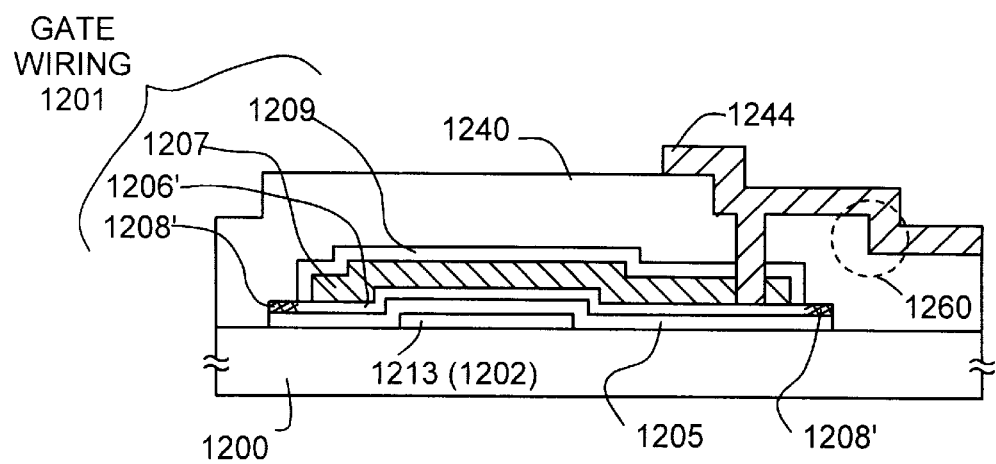
FIG. 25 is a cross-sectional view of a TFT in a channel widthwise direction.

FIG. 25 is a cross-sectional view showing the semiconductor layer 1202 of FIG. 20D taken along the channel widthwise direction (a direction orthogonal to the channel length) which corresponds to the cross-sectional view taken along the chain line C–C' of FIG. 10.

Up to now, in the semiconductor device having a multilayer wiring structure, a step that reflects the structure of the lower portion occurs on the surface of the interlayer insulating film. A lead wiring 1244 is formed on this step portion. Up to now, there arises a problem that the wiring is disconnected at the step portion. In particular, the disconnection of the wirings is frequently produced at the step caused by the gate wiring and the gate insulating film.

In this embodiment, because the TaOx film 2108' is formed around the surface of the gate insulating film 1205, a difference in height between the gate wiring 1201 and the gate insulating film 1205 is relaxed, as a result of which in particular, the step 1260 caused by the gate wiring and the gate insulating film makes it difficult to disconnect the lead wiring 1244.

Also, in the case where a contact hole for connecting the gate wiring 1201 and the lead wiring 1244 is formed, the use of bufferred hydrofluoric acid makes it possible that the Ta layer 1206 functions as an etching stopper, thereby being capable of preventing over-etching of the gate insulating film 1205.

Fourth Embodiment

The first embodiment shows an example in which polycrystal silicon which has been crystallized by use of catalytic elements is used for the semiconductor layer of the thin film transistor. The use of the catalytic elements makes it possible to lower the crystallizing temperature. However, after the crystallizing process, the catalytic elements deteriorate the characteristics of the semiconductor of the semiconductor material as described above.

Under the above-mentioned circumstances, this embodiment adds a process of gettering the catalytic elements used in the crystallizing process to the process subsequent to the crystallizing process of the first embodiment.

A gettering process of this embodiment will be described with reference to FIGS. 26 and 28. First, a method in which the source and drain regions of the n-channel TFT and the p-channel TFT are used for the gettering sink will be described. In FIGS. 26 and 28, the same reference marks as those in FIGS. 12A to 12D and 16A to 16D denote identical structural elements.

In order that the source and drain regions are used for the gettering sink, it is necessary to add the n-type impurities such as phosphorus. As the impurities that give the n-type conductivity, antimony or bismuth can be used other than phosphorus. Phosphorus is the highest in gettering capability, and antimony is higher. The concentration of the added n-type impurities is set at $1 \times 10^{20}$ to $8 \times 10^{21}$ atoms/cm$^3$ although it depends on the concentration of the catalytic elements remaining in the channel formation region.

Under the above-mentioned circumstances, in the n-type impurity adding process shown in the first embodiment, phosphorus ions are added also to the semiconductor layer 203 of the p-channel TFT. Then, in the n-type impurity adding process, the concentration of boron ions in the source and drain regions 271 and 272 of the p-channel type is set to be about 1.3 to 2 times as high as the concentration of phosphorus ions which are added to those regions 271 and 272. Reference numeral 273 denotes a channel formation region, and reference numerals 274 and 275 are lightly-doped impurity regions.

After the source and drain regions have been formed, a heat treatment at 550° C. for 2 hours is conducted. Due to the heating process, Ni intentionally added for crystallization of the amorphous silicon film diffuses into the respective source and drain regions 211, 212, 271 and 272 from the channel formation regions 213 and 273 as schematically indicated by an arrow in FIGS. 26 and 28. This is because those regions contain phosphorus elements at a high concentration, and Ni that reaches those source and drain regions are gettered there. A heat treatment at 500 to 600° C. for about 2 to 4 hours enables Ni to diffuse about 5 to 10 $\mu$m.

As a result, the concentration of Ni within the channel formation regions 213 and 273 can be reduced, and the concentration of Ni can be set at $5 \times 10^{17}$ atoms/cm$^3$ or less which is a lower limit detected by the SIMS. On the other hand, the concentration of Ni in the source and drain regions 211, 212, 271 and 272 which are used for gettering sink becomes higher than the channel formation regions 213 and 273.

In addition, with this heat treatment, phosphorus and boron which are added to the source and drain regions 211, 212, 271 and 272 and the lightly-doped impurity regions 214, 215, 274 and 275 are activated while gettering is effected. Up to now, because the heat resistance of the aluminum material is low, only the heat treatment at about 450° C. is conducted with the result that the activation of dopant (phosphorus, boron) is low, and the activating process with an excimer laser needs to be implemented. In this embodiment, since the heating temperature is elevated to 500° C. or higher, the dopant can be sufficiently activated, and the resistance in the source and drain regions can be more lowered by only the heat treatment. In addition, because of the heating temperature rises, an improvement in the crystallinity of the region in which crystallinity is destroyed by the doping process of ions is advanced by the heat treatment.

In particular, it has been proved through the experiments that the region to which both of phosphorus and boron are added in which the concentration of boron is about 1.3 to 2 times as high as that of phosphorus as in the source and drain regions 271 and 272 of the p-channel TFT is higher in gettering capability than the source and drain regions 211 and 212 of the n-channel TFT to which only phosphorus is added.

In the conventional aluminum single-layer gate wiring, because the heat resistance of an aluminum material is low, only a heat treatment at about 450° C. at the highest in a short period of time is conducted. In addition, in the conventional structure, even if the heat treatment at about 450° C. is conducted, there is the high possibility that aluminum atoms diffuse into the gate insulating film and the semiconductor layer, resulting in a high possibility that the characteristics of the TFT are deteriorated and varied. The gate wiring of the two-layer structure consisting of the Al layer and the Ta layer enables the heat treatment at 500 to 650° C. to be conducted after the gate wiring has been formed. As a result, even if the above-described gettering process is applied, the reliability of the TFT is not lowered.

Also, a phosphorus adding region may be additionally formed instead of the source and drain regions being used for the gettering sink. This example will be described with reference to FIGS. 27A to 27C.

For example, after the completion of the crystallizing process of FIG. 11B, the mask insulating film 252 is used as a phosphorus addition mask to form the phosphorus added regions 280a and 280b in the polycrystal silicon film 280. The concentration of phosphorus in the phosphorus added regions 280a and 280b is set at $1\times10^{20}$ to $8\times10^{21}$ atoms/cm$^3$. In this example, a mask for phosphorus addition may be formed additionally instead of the mask insulating film 252.

Then, a heat treatment at 450 to 650° C. for about 2 to 4 hours is conducted. As schematically indicated by an arrow in FIG. 27B, Ni diffuses into the phosphorus added regions 280a and 280b from the regions 280c to which no phosphorus is added, to thereby reduce Ni in the region 280c.

After the removal of the mask insulating film 252, the region 280c in which Ni is gettered is patterned to form the semiconductor layers 282 and 283 of the TFT (FIG. 27C).

Also, the heat treatment atmosphere of gettering may be any one of an inactive atmosphere such as nitrogen, a hydrogen atmosphere and an oxidizing atmosphere such as hydrochloric acid or dry oxygen.

Fifth Embodiment

A fifth embodiment shows a method of manufacturing a TFT using the porous anodic oxidation process described in the conventional example. This embodiment shows a process of manufacturing a CMOS circuit as in the first embodiment. In this embodiment, the n-channel TFT is of the LDD structure, and the p-channel TFT is of the offset structure.

A process of manufacturing the TFT will be described with reference to FIGS. 29A to 29E and 30A to 30D. In FIGS. 29A to 29E and 30A to 30D, the left side shows a cross-sectional view of the n-channel TFT whereas the right side shows a cross-sectional view of the p-channel TFT.

A glass substrate (Corning 1737, strain point=667° C.) is prepared as a substrate 300, and a silicon oxide film is formed in thickness of 200 nm on the surface of the glass substrate as an under film not shown. Then, semiconductor layers 301 and 302 which are formed of a polycrystal silicon film of 45 nm in thickness are formed. Then, a nitrified silicon oxide film is formed in thickness of 80 nm as the gate insulating film 305. A tantalum film (Ta film) 356 having a thickness of 20 nm and an aluminum film (Al film) 357 containing scandium of 2 wt % and having a thickness of 40 nm are formed in contact with the gate insulating film 305 by a sputtering device (FIG. 29A).

In this embodiment, as the polycrystal silicon film that constitutes the semiconductor layers 301 and 302, there is used a film obtained by crystallizing an amorphous silicon film by an excimer laser. The crystallizing method may be made by thermal crystallization using catalyzer as in the first embodiment or the use of RTA.

Then, a probe P on the anode side of an anodic oxidizing device is brought into contact with the Al film 357 to form a thin barrier type alumina film (not shown) on the surface of the Al film 357. This anodic oxidizing process is made in order to improve the adhesion of the resist formed on the Al film 357. The process conditions are that ethylene glycol solution containing tartaric acid of 3% is used as an electrolyte solution, an electrolyte solution temperature is 30° C., an arrival voltage is 10 V, a voltage supply period of time is 15 minutes, and a supply current is 10 mA/substrate.

A resist mask 358 is formed. The alumina film (not shown) is etched by a chrome mixed acid, and the Al film 357 is etched by aluminum mixed acid to form an Al layer 307 as a second wiring layer. The Al layer 307 constitutes an upper layer of the gate wiring. In FIGS. 29A to 29E, there is shown that the Al layer 307 on the left side and the Al layer 307 on the right side are divided. However, in fact, those Al layers 307 are integral with each other to constitute the same gate wiring (FIG. 29B).

While the resist mask 358 remains, a probe P on the anode side in an anodic oxidization device is brought into contact with the Ta film 356 to conduct anodic oxidation. This process corresponds to the porous anodic oxidizing process shown in FIGS. 43A to 43E. The conditions are that an oxalic acid aqueous solution of 3% is used as an electrolyte solution, an apply voltage is 8 V, a voltage supply period of time is 40 minutes, and a supply current is 20 mA/substrate. Under those anodic oxidation conditions, a porous anodic oxide film 359 (hereinafter referred to as "A.O. film 359") is formed on a side surface of the Al layer 307. The A.O. film 359 is of a porous alumina film. Also, a surface of the A.O. film 359 to which the Ta film 356 is exposed is also slightly anodically oxidized, but this is omitted from the drawings (FIG. 29C).

After the removal of the resist mask 358, the probe P on the anode side is again brought into contact with the Ta film 356 in the anodic oxidization device to conduct anodic oxidation on the Al layer 307. The process conditions are that ethylene glycol solution containing tartaric acid of 3% is used as an electrolyte solution, an electrolyte solution temperature is 10° C., an arrival voltage is 80 V, a voltage supply period of time is 30 minutes, and a supply current is 30 mA/substrate.

The tartaric acid penetrates into the porous A.O. film 359 so that the surface of the Al layer 307 is anodically oxidized to form a barrier-type anodic oxide film (hereinafter referred to as "barrier A.O. film") 309. The barrier A.O. film 309 is of a non-porous alumina film. An exposed portion of the Ta film 356 and a portion of the Ta film 356 in which the porous A.O. film 359 exists are also anodically oxidized and then converted into a tantalum oxide film (hereinafter referred to as "TaOx film") 308. The first wiring layer is formed by the remaining tantalum layer (Ta layer) 306. Although the TaOx film 308 is thicker than the Ta film 306, those films are shown so that they have the same thickness for simplification (FIG. 29D).

In the anodic oxidation process, a region of the Ta film 356 on the upper portion of which the porous A.O. film 359 exists is not completely oxidized, and as shown in the TEM photograph of FIGS. 44A to 44C, the Ta layer 306 remains in the lower layer of the TaOx film 308. Also, a tip of the TaOx film 308 exists in the lower portion of the barrier A.O. film 309.

FIGS. 31A to 31C show cross-sectional views of the gate wiring after the anodic oxidation process of FIG. 32D. As shown in FIGS. 31A to 31C, the film thickness tp of the porous A.O. film 359 and the film thickness tb of the barrier A.O. 309 are all nearly uniform in the periphery of the Al layer 307.

With the above, the anodic oxidization process is completed. In this embodiment, because no wiring for anodic oxidation is formed, there is required no process of dividing the gate wiring for each wiring after the anodic oxidation has been completed. Accordingly, the Ta layer 306 and the Al layer 307 can be maintained in a state that they are coated with their anodic oxide films 308 and 309.

Then, the TaOx film 308 and the gate insulating film 307 are dry-etched with the A.O. films 309 and 359 as the masks, and impurity ions that give the n-type conductivity are added to the semiconductor layers 301 and 302 to form n-type regions 331 to 334. In this embodiment, phosphorus ions are added to the semiconductor layers 301 and 302 through the plasma doping method. Phosphine diluted with hydrogen of 5% is used as a doping gas (FIG. 29E).

After the porous A.O. film 359 has been removed through the wet etching process due to aluminum mixed acid, a resist mask 361 that covers the semiconductor layer of the p-channel TFT is formed. Then, phosphorus is again added to the upper surface to form $n^+$ type regions 311, 312 and $n^-$ type regions 314, 315 on the semiconductor layer 302 of the n-channel TFT (FIG. 30A).

In the n-channel TFT, the $n^+$ type regions 311 and 312 are a source region and a drain region, respectively, and the $n^-$ type regions 314 and 315 are lightly-doped impurities. Also, a region 313 to which phosphorus has not been added in the two $n^-$ type impurity adding processes becomes a channel formation region 213. In this example, the concentration of phosphorus in the source and drain regions 311 and 312 is set at $1\times10^{20}$ to $8\times10^{21}$ atom/cm$^3$, and the concentration of phosphorus in the lightly-doped impurity regions 314 and 315 is set at $1\times10^{15}$ to $1\times10^{17}$ atom/cm$^3$.

After the resist mask 361 has been peeled off, a resist mask 362 that covers the n-channel TFT and a resist mask 363 that covers the periphery of the gate electrode of the p-channel TFT are formed. The resist mask 363 is provided for forming an offset region on the semiconductor layer 303 and formed so as to cover substantially same region as that of the porous A.O. film 359.

P-type impurities are added to the semiconductor layer 303 to reverse the conductivity of the n-type regions 333 and 334 to form $p^+$ type regions 321 and 322. Diborane diluted with hydrogen of 5% is used as a doping gas (FIG. 30B).

The $p^+$ type regions 321 and 322 are a source region and a drain region of the p-channel TFT, respectively. Regions to which phosphorus ions and boron ions have not been added become a channel formation region 323 and offset regions 324, 325, respectively.

Then, a heat treatment is conducted at 550° C. for two hours in a dry oxygen atmosphere. This process is made for oxidizing a portion of the Ta layer 306 which extends outwardly of the side surface of the barrier A.O. film 309. In other words, if the Ta layer 306 exists on that portion, a voltage is caused to be applied to the lightly-doped impurity regions 314, 315 and the off-set regions 324, 325, the above-described process is made to thermally oxidize the Ta layer 306 on that portion for insulation.

Due to the thermal oxidation process, a Ta layer 306' is sectioned as the first wiring layer that constitutes the gate wiring. Also, the TaOx film 308' consists of a portion (308) oxidized by anodic oxidation and a portion thermally oxidized, and a portion which is in contact with the Ta layer 306' becomes a TaOx film formed by thermal oxidation. The atmosphere in which the thermal oxidation process is conducted may be pyrochloa oxidation, hydrochloric acid or the like other than dry oxidation (FIG. 30C).

In this embodiment, there is structured such that the Al layer 307 of the gate wiring is surrounded by the Ta layer 306' and the barrier A.O. film 309. With this structure, because the deformation (expansion) of the Al layer 307 and the diffusion of Al atoms can be prevented, the upper limit of the heating temperature after the gate wiring has been formed can be elevated up to about 500 to 650° C.

In addition, with this thermal oxidation process, phosphorus and boron which have been added to the source and drain regions 311, 312, 321 and 322, the lightly-doped impurity regions 314, 315 and the offset regions 324, 325 are activated. Up to now, because the heat resistance of the aluminum material is low, only the heat treatment at about 450° C. is conducted with the result that the activation of dopant (phosphorus, boron) is low, and the activating process with an excimer laser needs to be implemented. In this embodiment, since the heating temperature is elevated to 500° C. or higher, the dopant can be sufficiently activated, and the resistance in the source and drain regions can be lowered by only the heat treatment. In addition, the crystallinity of the region in which crystallinity has been destroyed during the doping process of ions is improved by the heat treatment.

Subsequently, an interlayer insulating film 340 formed of a silicon oxide film is formed. After a contact hole is formed in the interlayer insulating film 340, a laminated film consisting of titanium, aluminum and titanium is formed as an electrode material and then patterned to form wirings 341 to 343. The n-channel TFT and the p-channel TFT are connected by the wiring 343 to form a CMOS circuit (FIG. 30D).

Sixth Embodiment

A sixth embodiment shows a method of manufacturing a TFT using the porous anodic oxidation process described in the conventional example. This embodiment shows a process of manufacturing a CMOS circuit as in the second embodiment. In this embodiment, the n-channel TFT is of the LDD structure, and the p-channel TFT is of the offset structure.

A process of manufacturing the TFT will be described with reference to FIGS. 32 and 33. In FIGS. 32 and 33, the left side shows a cross-sectional view of the n-channel TFT whereas the right side shows a cross-sectional view of the p-channel TFT.

First, a glass substrate (Corning 1737, strain point=667° C.) is prepared as a substrate 300, and a silicon oxide film is formed in thickness of 200 nm on the surface of the glass substrate as an under film (not shown). Then, semiconductor layers 301 and 302 which are formed of a polycrystal silicon film with a thickness of 45 nm are formed. Then, a nitrified silicon oxide film is formed in thickness of 80 nm as a gate insulating film 305. A tantalum film (Ta film) 356 having a thickness of 20 nm and an aluminum film (Al film) 357 containing scandium of 2 wt % and having a thickness of 40 nm are formed in contact with the gate insulating film 305 by a sputtering device (FIG. 32A).

In this embodiment, as the polycrystal silicon film that constitutes the semiconductor layers 301 and 302, there is used a film obtained by crystallizing an amorphous silicon film by an excimer laser. The crystallizing method may be made by thermal crystallization using catalyzer as in the second embodiment or the use of RTA.

Then, a probe P on the anode side of an anodic oxidizing device is brought into contact with the Al film 357 to form a thin barrier type alumina film (not shown) on the surface of the Al film 357. This anodic oxidizing process is made in order to improve the adhesion of the resist formed on the Al film 357. The process conditions are that ethylene glycol solution containing tartaric acid of 3% is used as an electrolyte solution, an electrolyte solution temperature is 30° C., an arrival voltage is made 10 V, a voltage apply (period of time) is 15 minutes, and a supply current is 10 mA/substrate.

A resist mask 358 is formed. The alumina film (not shown) is etched by a chrome mixed acid, and the Al film 357 is etched by aluminum mixed acid to form an Al layer 307 as a second wiring layer. The Al layer 307 constitutes an upper layer of the gate wiring. In FIGS. 32A to 32E, there is shown that the Al layer 307 on the left side and the Al layer 307 on the right side are divided. However, in fact, those Al layers 307 are integral with each other to constitute the same gate wiring (FIG. 32B).

While the resist mask 358 remains, a probe on the anode side in the anodic oxidizing device is brought into contact with the Ta film 356 to conduct anodic oxidation. This process corresponds to the porous anodic oxidizing process shown in FIGS. 43A to 43E. The conditions are that an oxalic acid aqueous solution of 3% is used as an electrolyte solution, an apply voltage is 8 V, a voltage apply period of time is 40 minutes, and a supply current is 20 mA/substrate. Under those anodic oxidation conditions, a porous anodic oxide film 359 (hereinafter referred to as porous "A.O. film 359") is formed on a side surface of the Al layer 307. The A.O. film 359 is of a porous alumina film. Also, a surface of the A.O. film 359 to which the Ta film 356 is exposed is also slightly anodically oxidized, but this is omitted from the drawings (FIG. 32C).

After the removal of the resist mask 358, the probe P on the anode side is again brought into contact with the Ta film 356 in the anodic oxidizing device to anodically oxide the Al layer 307. The process conditions are that ethylene glycol solution containing tartaric acid of 3% is used as an electrolyte solution, an electrolyte solution temperature is 10° C., an arrival voltage is 80 V, a voltage apply (period of) time is 30 minutes, and a supply current is 30 mA/substrate.

The tartaric acid penetrates into the porous A.O. film 359 so that the surface of the Al layer 307 is anodically oxidized to form a barrier-type anodic oxidation film (hereinafter referred to as "barrier A.O. film") 309. The barrier A.O. film 309 is of a non-porous alumina film. An exposed portion of the Ta film 356 and a portion of the Ta film 356 in which the porous A.O. film 359 exists are also anodically oxidized and then converted into a tantalum oxide film (hereinafter referred to as "TaOx film") 308. The first wiring layer is formed by the remaining tantalum film (Ta layer) 306. Although the TaOx film 308 is thicker than the Ta film 306, those films are shown so that they have the same thickness for simplification (FIG. 32D).

In the anodic oxidation process, a region on the upper portion of the Ta film 356 in which the porous A.O. film 359 exists is not completely oxidized, and as shown in the TEM photograph of FIGS. 44A to 44C, the Ta layer 306 remains in the lower layer of the TaOx film 308. Also, a tip of the TaOx film 308 exists in the lower portion of the barrier A.O. film 309.

Figure 34A:
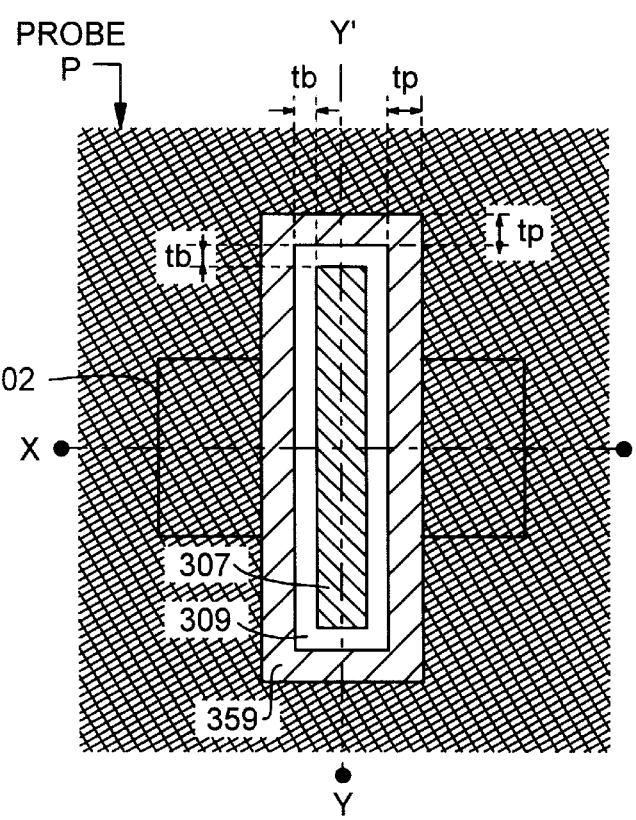
FIGS. 34A to 34C are cross-sectional views of a gate wiring.
Figure 34C:
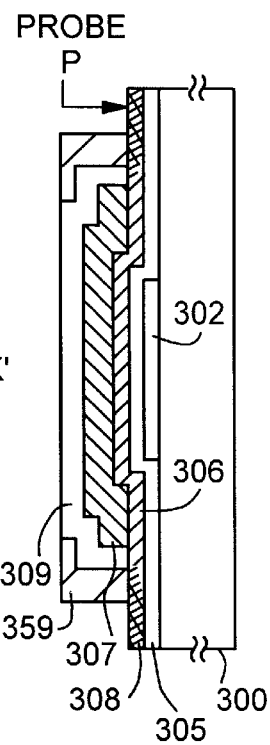
Figure 34B:
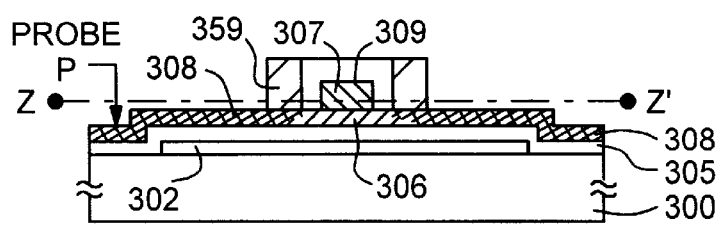

FIGS. 34A to 34C show cross-sectional views of the gate wiring after the anodic oxidation process of FIG. 32D. As shown in FIGS. 34A to 34C, on at least one semiconductor layer, the film thickness tp of the porous A.O. film 359 and the film thickness tb of the barrier A.O. 309 are all nearly uniform in the periphery of the Al layer 307.

With the above-mentioned process, the anodic oxidizing process is completed. In the embodiment, because no wiring for anodic oxidation is formed, there is required no process of dividing the gate wiring for each wiring after the anodic oxidation has been completed. Accordingly, the Ta layer 306 and the Al layer 307 can be maintained in a state that they are coated with their anodic oxidation films 308 and 309.

Then, the TaOx film 308 is patterned with the A.O. films 309 and 359 as a mask. In patterning, there is employed a dry etching process with a gas resulting from mixing $CF^4$ gas with $O_2$ gas. The reason why $O_2$ gas is mixed with another gas is that Ta which has not been anodically oxidized is etched while being oxidized. In this etching process, the surfaces of portions of the semiconductor layers 202 and 203 where the source and drain regions are formed are exposed.

After the process of patterning the TaOx film has been completed, impurity ions that give the n-type conductivity are added to the semiconductor layers 301 and 302 to form n-type regions. In the embodiment, phosphorus ions are added to the semiconductor layers 301 and 302 through the plasma doping method. Phosphine diluted with hydrogen of 5% is used as a doping gas. In this process, the barrier A.O. film 309 and the porous A.O. film 359 function as a mask, and N-type regions 331 to 334 are formed on the semiconductor layers 301 and 302 in a self-aligning manner (FIG. 32E).

Subsequently, the porous A.O. film 359 is removed by a wet etching process using aluminum mixed acid. Then, the TaOx film 308 is again patterned with the barrier A.O. film 309 as a mask. A dry etching process using $CHF_3$ gas is employed for the patterning. The reason why the $CHF_3$ gas is employed is to prevent the TaOx film 308 and the Ta layer 306 from being gouged, attaching importance to etching anisotropy.

After the TaOx film 308 has been patterned, a resist mask 361 that covers the semiconductor layer of the p-channel TFT is formed. Then, phosphorus is again added to form $n^+$ type regions 311, 312 and $n^-$ type regions 314, 315 on the semiconductor layer 302 of the n-channel TFT (FIG. 33A).

In the n-channel TFT, the $n^+$ type regions 311 and 312 are a source region and a drain region, respectively, and the $n^-$ type regions 314 and 315 are lightly-doped impurities. Also, a region 313 to which phosphorus has not been added in the two n-type impurity adding processes becomes a channel formation region. In this example, the concentration of phosphorus in the source and drain regions 311 and 312 is set at $1\times10^{20}$ to $8\times10^{21}$ atom/cm$^3$, and the concentration of phosphorus in the lightly-doped impurity regions 314 and 315 is set at $1\times10^{15}$ to $1\times10^{17}$ atom/cm$^3$.

After the resist mask 361 has been peeled off, a resist mask 362 that covers the n-channel TFT and a resist mask 363 that covers the periphery of the gate electrode of the p-channel TFT are formed. The resist mask 363 is provided for forming an offset region on the semiconductor layer 302 and formed so as to cover substantially same region as that of the porous A.O. film 359.

P-type impurities are added to the semiconductor layer 302 to reverse the conductivity of the n-type regions 321 and 322 to form p⁺ type regions 321 and 322. Diborane diluted with hydrogen of 5% is used as a doping gas (FIG. 33B).

The p⁺ type regions 321 and 322 are a source region and a drain region of the P-channel TFT, respectively. Regions to which phosphorus ions and boron ions have not been implanted become a channel formation region 323 and offset regions 324, 325, respectively. Although the P-channel TFT is of the offset structure in this example, it can be of the LDD structure depending on how to make the resist mask.

After the impurity adding process has been completed through the above process, the added impurities are activated through a heat treatment or the application of an excimer laser.

FIG. 35 is a cross-sectional view of the gate wiring and a cross-sectional view of the gate wiring taken along the channel longitudinal direction of the gate electrode of the n-channel TFT. In the gate wiring, the lower portion of the Al layer 307 is in contact with only the Ta layer 306 and is structured so as to be surrounded or sandwiched by the Ta layer 306 and the barrier A.O. film 309.

Also, because the side anodic oxidation process is employed in this embodiment, the Ta layer 306 remains from the barrier TaOx film 308 to the lower portion of the porous A.O. film 359 (refer to the TEM photograph of FIGS. 44A to 44C). Accordingly, a portion where the Ta layer 306 and the TaOx film 308 are laminated one on another exists on the lower portion of the barrier A.O. film 309, and the side surface of the Ta layer 306 and the side surface of the TaOx film 308 are exposed.

Therefore, for the purpose of preventing the short-circuiting between the gate wiring and source/drain electrodes, it is better that a heat treatment is conducted at 500 to 650° C. in an oxidizing atmosphere to thermally oxidize the side surface of the Ta layer 306 for insulation. This thermal oxidation process can also serve as the impurity activating process.

Also, although the gate insulating film 305 is so formed as to cover the entire substrate 300, a portion in which no gate wiring exists is thinner in film than a portion in which the gate wiring exists because a gas that etches the gate insulating film 305 is employed in the process of patterning the TaOx film 308. In addition, because the surface of a region in which no gate wiring exists and no porous A.O. film 359 exists is exposed to the etching gas in the two TaOx film patterning processes, the region becomes the thinnest in film. As a result, on at least one semiconductor layer, the film thickness of the gate insulating film 305 becomes thinner in the stated order of a portion that covers the channel formation region, a portion that covers the lightly-doped impurities or the offset region, and a portion that covers the source and drain regions. In the drawing, the thickness of the gate insulating film 305 is uniformly shown for simplification. The comparison of the film thickness of the gate insulating film may be made by the mean film thickness or the thinnest film thickness of that portion.

Subsequently, an interlayer insulating film 340 formed of a silicon oxide film is formed. After a contact hole is formed in the interlayer insulating film 340, a laminated film consisting of titanium, aluminum and titanium in stated order is formed as an electrode material and then patterned to form wirings 341 to 343. The n-channel TFT and the p-channel TFT are connected by the wiring 343 to form a CMOS circuit (FIG. 33C).

Seventh Embodiment

In a seventh embodiment, the TFT described in the first embodiment is applied to an active matrix substrate. The active matrix substrate of the present embodiment is employed for a plate-type electro-optic device such as a liquid crystal display unit or an EL display unit.

This embodiment will be described with reference to FIGS. 36 to 39. In FIGS. 36 to 39, the same symbols denote the identical structural elements. FIG. 36 is a schematic perspective view showing an active matrix substrate in accordance with this embodiment. An active matrix substrate is made up of a pixel matrix circuit 401, a scanning line drive circuit 402 and a signal line drive circuit 403 which are formed on a glass substrate 400. The scanning line drive circuit 402 and the signal line drive circuit 403 are connected to the pixel matrix circuit 401 by scanning lines 502 and signal line 503, respectively, and those drive circuits 402 and 403 are mainly made up of CMOS circuits.

The scanning lines 502 are formed for each column of the pixel matrix circuit, and the signal lines 503 are formed for each row thereof. Pixel TFTs 500 connected to the respective wirings are formed in the vicinity of the cross portions of the scanning lines 502 and the signal lines 503. Each of the pixel TFTs 500 is connected with a pixel electrode 505 and an additional capacitor 510.

First, the n-channel TFT and the p-channel TFT of a CMOS circuit and the pixel TFTs of the pixel matrix are completed in accordance with the TFT manufacturing process of the first embodiment.

FIG. 37A is a top view showing the pixel matrix circuit 401 and a top view of substantially one pixel. FIG. 37B is a top view showing the CMOS circuit that constitutes the drive circuits 502 and 503. FIGS. 38 and 39 are cross-sectional views showing the active matrix substrate, and cross-sectional views of the pixel matrix circuit 401 and the CMOS circuit. A cross-sectional view of the pixel matrix circuit 401 is a cross-sectional view taken along a chain line A-A' of FIG. 37A, and a cross-sectional view of the CMOS circuit is a cross-sectional view taken along a chain line B-B' of FIG. 37B.

Each of the pixel TFTs 500 of the pixel matrix circuit 401 is an n-channel TFT and has a semiconductor layer 501 bent in a U-shape (horseshoe-shape). The scanning lines 502 which are first-layer wirings cross with the semiconductor layer 501 through the gate insulating film 505. The scanning lines 502 are formed of a Ta layer (first wiring layer) 506, an Al layer (second wiring layer) 507, a TaOx film (anodic oxidation film) 420 and a barrier A.O. film (anodic oxidation film) 509 as in the first embodiment.

On the semiconductor layer 501 are formed n⁺ type regions 511 to 513, two channel formation regions 514, 515 and lightly-doped impurity regions (n⁻ type regions) 516 to 519. The n⁺ type regions 511 and 512 are source/drain regions.

On the other hand, in the CMOS circuit, one gate wiring 601 crosses with two semiconductor layers 602 and 603 through a gate insulating film 605. On the semiconductor layer 602 are formed source/drain regions (n⁺ type regions) 611, 612, a channel formation region 613 and lightly-doped impurity regions (n⁻ type regions) 614, 615. On the semiconductor layer 603 are formed source and drain regions (p⁺ type regions) 621, 622, a channel formation region 623 and lightly-doped impurity regions (p⁻ type regions) 624, 625.

After the source and drain regions have been formed on the semiconductor layers 501, 602 and 603, an interlayer insulating film 430 is formed on the entire surface of the substrate. On the interlayer insulating film 430, there are formed the signal lines 503, the drain electrode 504, the source electrodes 631, 632 and the drain electrode 633 as the second-layer wirings and electrodes.

As shown in FIG. 37A, on the pixel matrix circuit 401, the scanning lines 502 are formed for each of rows, and the signal lines 503 are formed for each of columns in such a manner that the scanning lines 502 and the signal lines 503 are orthogonal to each other through the interlayer insulating film 440. The drain electrode 504 functions as a lead electrode for connecting the drain region 512 and the pixel electrode 505 and also as a lower electrode of the additional capacitor 510. In order to increase the capacitance of the additional capacitor 510, the drain electrode 504 is widened as large as possible so far as an opening portion is not lowered.

As shown in FIG. 37B, the drain electrode 633 of the CMOS circuit is connected to the gate wiring 610 (the first-layer wiring) of another TFT.

Although the signal lines 503 and the drain electrodes 504 are formed so as to get over the scanning lines 502 and the semiconductor layer 501, because the TaOx film 420 is formed on the upper surface of the gate insulating film 410, that is, on the entire surface of the substrate 400, a difference in height therebetween is relaxed. As a result, the signal lines 503 and the drain electrode 504 can be prevented from being disconnected due to a step. Because the TaOx film 420 is a transparent insulating film that transmits a visual light, even if it is formed on the entire surface of the substrate, the opening degree of the pixel matrix circuit is not lowered.

A first flattening film 440 is formed on the second-layer wirings and electrodes. In this embodiment, a laminated film consisting of silicon nitride (50 nm), silicon oxide (25 nm) and acrylic (1 μm) is employed as the first flattening film 440. Since an organic resin film made of acrylic, polyimide or benzo-cyclobutene is a solution coating type insulating film which can be formed through the spin coating method, the film thickness of about 1 μm can be formed with a high through-put, thereby being capable of obtaining an excellent flat surface. In addition, because the organic resin film is lower in dielectric constant than silicon nitride or silicon oxide, the parasitic capacitance can be reduced.

Subsequently, a source wiring 641, a drain electrode 642, a drain wiring 643 and a black mask 52 which are formed of a light shield conductive film such as titanium or chrome are formed on the first flattening film 44 as third-layer wirings. As shown in FIG. 37A, the black mask 520 is integral with the pixel matrix circuit 401 and formed so as to be overlapped with the periphery of the pixel electrode 505 and to cover all the portions which do not contribute to display, as indicated by a dotted line in FIG. 37A. Also, the potential of the black mask 520 is fixed to a predetermined value.

Prior to the formation of those third-layer wirings 461, 462 and 520, the first flattening film 440 is etched in such a manner that a recess portion 530 where only the silicon nitride film of the lowest layer remains is formed on the drain electrode 504.

Since the drain electrode 504 and the black mask 520 are opposed to each other through only the silicon nitride film in the recess portion 530, the additional capacitor 510 having the drain electrode 504 and the black mask 520 as electrodes and the silicon nitride film as dielectric is formed in the recess portion 530. If silicon nitride which is high in dielectric constant is thinned in film, a larger capacitance can be ensured.

A second flattening film 450 is formed on the third-layer wirings 641, 642 and 530. The second flattening film 450 is made of acrylic in thickness of 1.5 μm. Although a portion where the additional capacitor 510 is formed has a large steps, such steps can be satisfactorily flattened.

A contact hole is formed in the first flattening film 440 and the second flattening film 450 to form a pixel electrode 505 formed of a transparent conductive film such as ITO or tin oxide. Thus, the active matrix substrate is completed.

In the case where the active matrix substrate of this embodiment is used in a liquid crystal display unit, an oriented film (not shown) is formed so as to cover the entire surface of the substrate. If necessary, the oriented film may be subjected to a rubbing process.

If the pixel electrode 505 is made of a conductive film which is high in reflection factor, representatively, aluminum or a material mainly containing aluminum, an active matrix substrate for a reflection type AMLCD can be manufactured.

Also, although the pixel TFT 500 is of the double gate structure in the present embodiment, it may be of the single gate structure or the multi-gate structure such as a triple gate structure. Also, the n-channel TFT may be formed by the LDD structure and the p-channel TFT may be formed by the offset structure in accordance with the process of manufacturing the TFT shown in the fifth embodiment. The structure of the active matrix substrate according to this embodiment is not limited to the structure of this embodiment. Since the feature of the present invention resides in the structures of the gate wiring, other structure may be appropriately determined by an implementor.

Eighth Embodiment

In an eighth embodiment, a description will be given of an example in which the liquid crystal display unit of the active matrix system (hereinafter referred to as "AMLCD") is structured as an exemplary electro-optic device using the active substrate shown in the seventh embodiment.

Figure 40A:
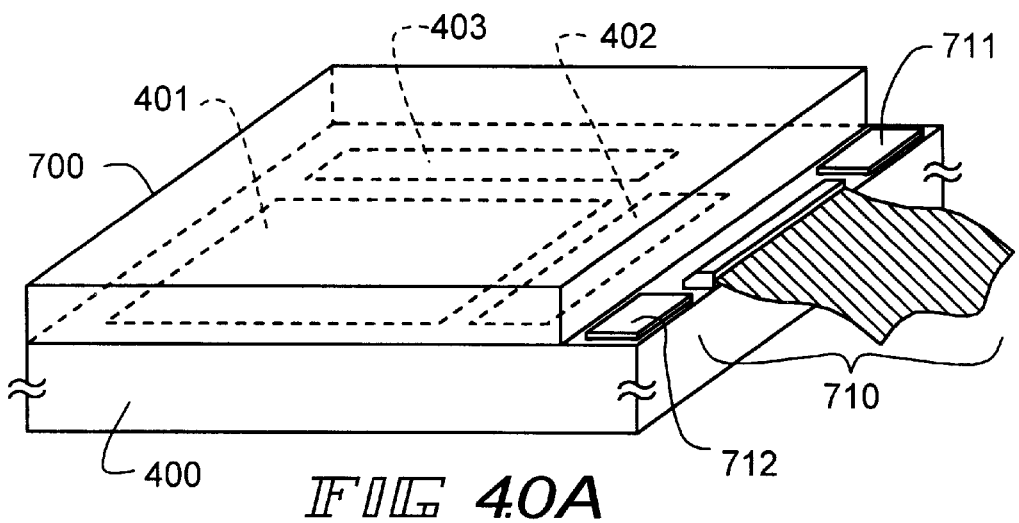
FIGS. 40A and 40B are perspective views of the appearance of a liquid crystal display unit according to an eighth embodiment.
Figure 40B:
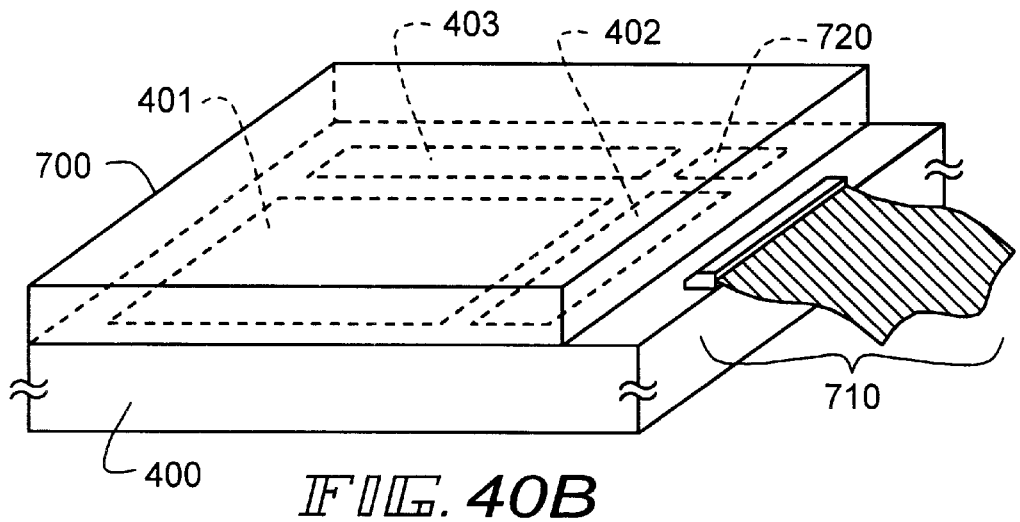

An appearance of the AMLCD according to this embodiment is shown in FIGS. 40A and 40B. In FIG. 40A, the same symbols as those in FIG. 36 denote identical structural elements. The active matrix substrate includes the pixel matrix circuit 401, the scanning line drive circuit 402 and the signal line drive circuit 403 which are formed on the glass substrate 400.

The active matrix substrate is stuck onto the opposing substrate 700. A gap between those substrates is sealed with liquid crystal. An external terminal is formed on the active matrix substrate during the TFT manufacturing process, and a portion where the external terminal is formed is not opposed to the opposing substrate 700. The external terminal is connected with an FPC (flexible printed circuit) 710, and an external signal and a power supply are transmitted to the circuits 401 to 403 through the FPC 710.

The opposing substrate 700 is designed such that the transparent conductive film such as an ITO is formed on the entire surface of the glass substrate. The transparent conductive film is an opposing electrode to the pixel electrode of the pixel matrix circuit 401, and a liquid crystal material is driven by an electric field formed between the pixel electrode and the opposing electrode. In addition, an orientated layer or a color filter may be formed on the opposing substrate 700 if necessary.

IC chips 711 and 712 are fitted onto the active matrix substrate of this embodiment using a surface to which the FPC 710 is fitted. Those IC chips are consisted of circuits formed on a silicon substrate, such as a video signal processing circuit, a timing pulse generating circuit, γ correction circuit, a memory circuit and an arithmetic operating circuit. Two IC chips are provided in FIG. 40A, but one IC chip or three or more IC chips may be provided.

Alternatively, the structure shown in FIG. 40B may be adopted. In FIG. 40B, the same structural elements as those in FIG. 40A are designated by identical symbols. This example shows that the signal processing conducted by the IC chip in FIG. 40A is conducted by a logic circuit 720 formed of TFTs on the same substrate. In this case, the logic circuit 720 is also basically structured by the CMOS circuit as in the drive circuits 402 and 403.

In this embodiment, there is employed a structure (BM on TFT) in which the black mask is formed on the active matrix substrate, but there may be employed a structure in which another black mask is formed on the opposite side in addition to the above structure.

Also, color display may be obtained using color filters, or using no color filters liquid crystal may be driven by an ECB (electric field control birefringence) mode, a GH (guest host) mode or the like.

Further, as disclosed in Japanese Patent Application Laid-open No. Sho 8-15686, a micro-lens array may be used.

Ninth Embodiment

The TFT of the present invention is applicable to various electro-optic devices or a semiconductor circuit other than the AMLCD.

The electro-optic device other than the AMLCD may be an EL (electro-luminescence) display unit, an image sensor or the like.

Also, the semiconductor circuit includes an arithmetic operating circuit such as a microprocessor consisted of IC chip, a high-frequency module (MMIC) dealing with input/output signals of a portable device on the title.

In this way, the present invention is applicable to all the semiconductor devices that function by the circuit formed of the insulated gate TFTs.

Tenth Embodiment

The CMOS circuit and the pixel matrix circuit formed by carrying out the present invention can be used for various electro-optic devices (active matrix liquid crystal display, active matrix EL display, active matrix EC display). In other words the present invention can be embodied in all the electronic devices incorporating an electro-optic device as a display medium.

The electronic devices of the above type may be a video camera, a digital camera, a projector (a rear-type or a front type), a head mount display (goggle type display), a navigation system for vehicles, a personal computer, a portable information terminal (mobile computer, a portable telephone, an electronic book or the like), etc. Those examples are shown in FIGS. 41 and 42.

FIG. 41A shows a personal computer which is made up of a main body 2001, an image input section 2002, a display unit 2003 and a key board 2004. The present invention is applicable to the image input section 2002, the display unit 2003 and other signal control circuits.

FIG. 41B shows a video camera which is made up of a main body 2101, a display unit 2102, an audio input section 2103, an operation switch 2104, a battery 2105 and an image receiving section 2106. The present invention is applicable to the display unit 2102, the audio input section 2103 and other signal control circuits.

FIG. 41C shows a mobile computer which is made up of a main body 2201, a camera section 2202, an image receiving section 2203, an operation switch 2204 and a display unit 2205. The present invention is applicable to the display unit 2205 and other signal control circuits.

FIG. 41D shows a goggle type display which is made up of a main body 2301, a display unit 2302 and an arm section 2303. The present invention is applicable to the display unit 2302 and other signal control circuits.

FIG. 41E shows a player using a recording medium (hereinafter referred to as "recording medium") in which program is recorded,and which is made up of a main body 2401, a display unit 2402, a speaker section 2403, a recording medium 2404 and an operation switch 2405. This apparatus provides the measure for music appreciation, movie appreciation, playing game or connecting to internet by using DVD (digital versatile disc) as the recording medium. The present invention is applicable to the display unit 2402 and other signal control circuits.

FIG. 41F shows a digital camera which is made up of a main body 2501, a display unit 2502, an eye piece section 2503, an operation switch 2504 and an image receiving section (not shown). The present invention is applicable to the display unit 2502 and other signal control circuits.

Figure 42A:
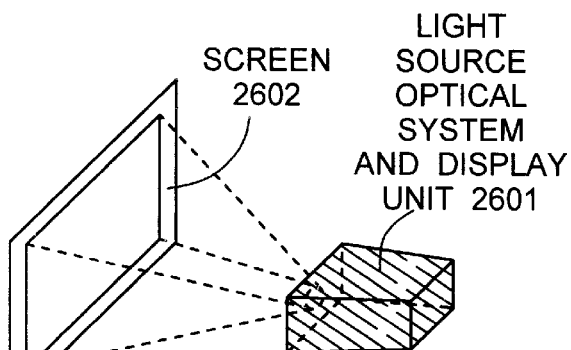
FIGS. 42A to 42D are structural diagrams of an electronic device according to the tenth embodiment.

FIG. 42A shows a front type projector which is made up of a light source optical system and display unit 2601 and a screen 2602. The present invention is applicable to the display unit and other signal control circuits.

Figure 42B:
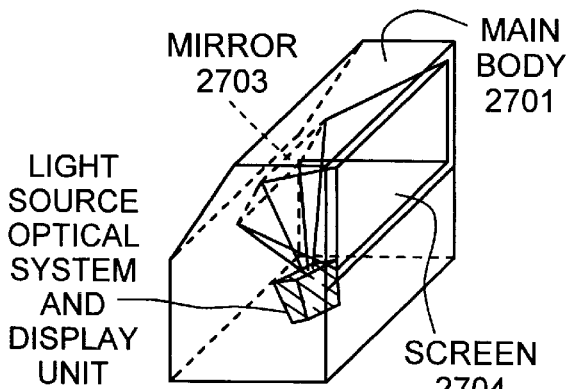

FIG. 42B shows a rear type projector which is made up of a main body 2701, a light source optical system and display unit 2702, a mirror 2703 and a screen 2704. The present invention is applicable to the display unit and other signal control circuits.

Figure 42C:
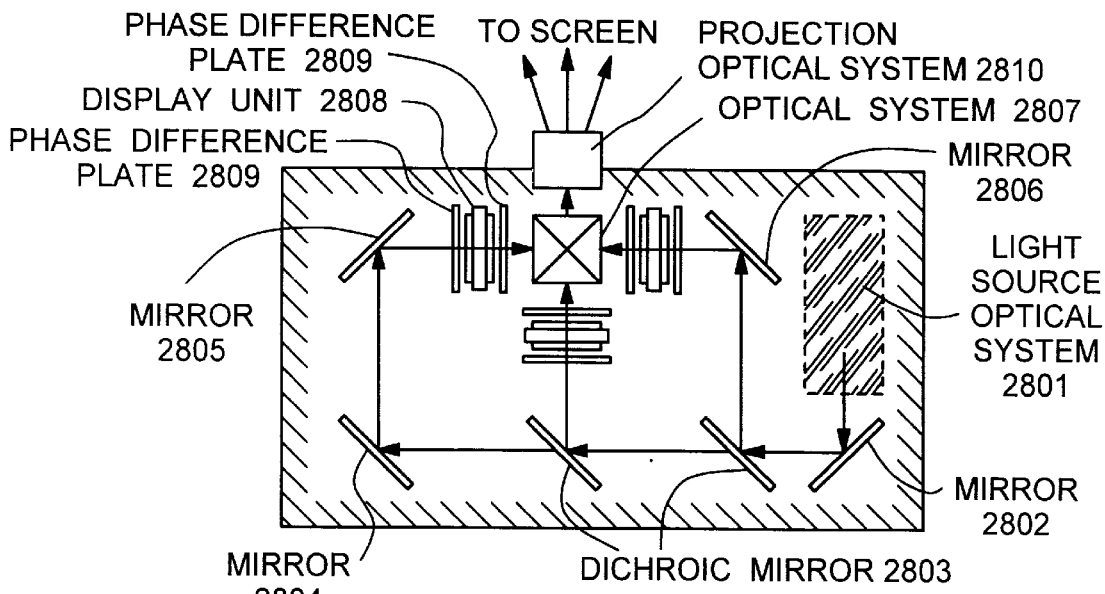

FIG. 42C is a diagram showing an example of the structure of the light source optical system and display unit 2601 and 2702 in FIGS. 42A and 42B. The light source optical system and display unit 2601 or 2702 is made up of a light source optical system 2801, mirrors 2802 and 2804 to 2806, dichroic mirrors 2803, an optical system 2807, and display units 2808, phase difference plates 2809 and a projection optical system 2810. The projection optical system 2810 is made up of a plurality of optical lenses having a projection lens. This embodiment shows an example of a three-plate type using three display units 2808. However, the present invention is not particularly limited to this, and may be applied to for example, a single-plate type. Also, in FIG. 42C, an optical lens, a film having a polarization function, a film for adjusting a phase difference, an IR film or the like may be provided in an optical path indicated by an arrow in FIG. 42C at discretion of a person who carries out the invention.

Figure 42D:
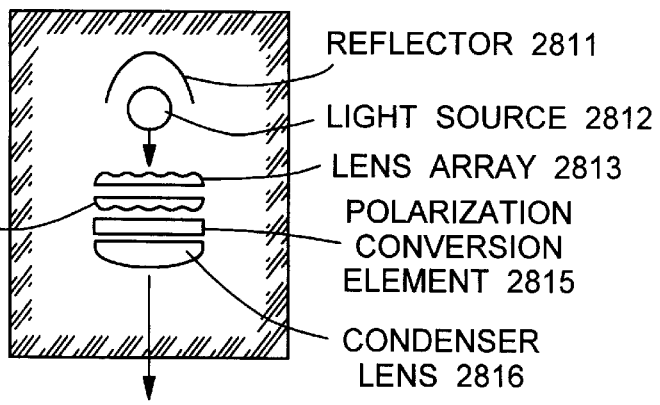
Figure 46:
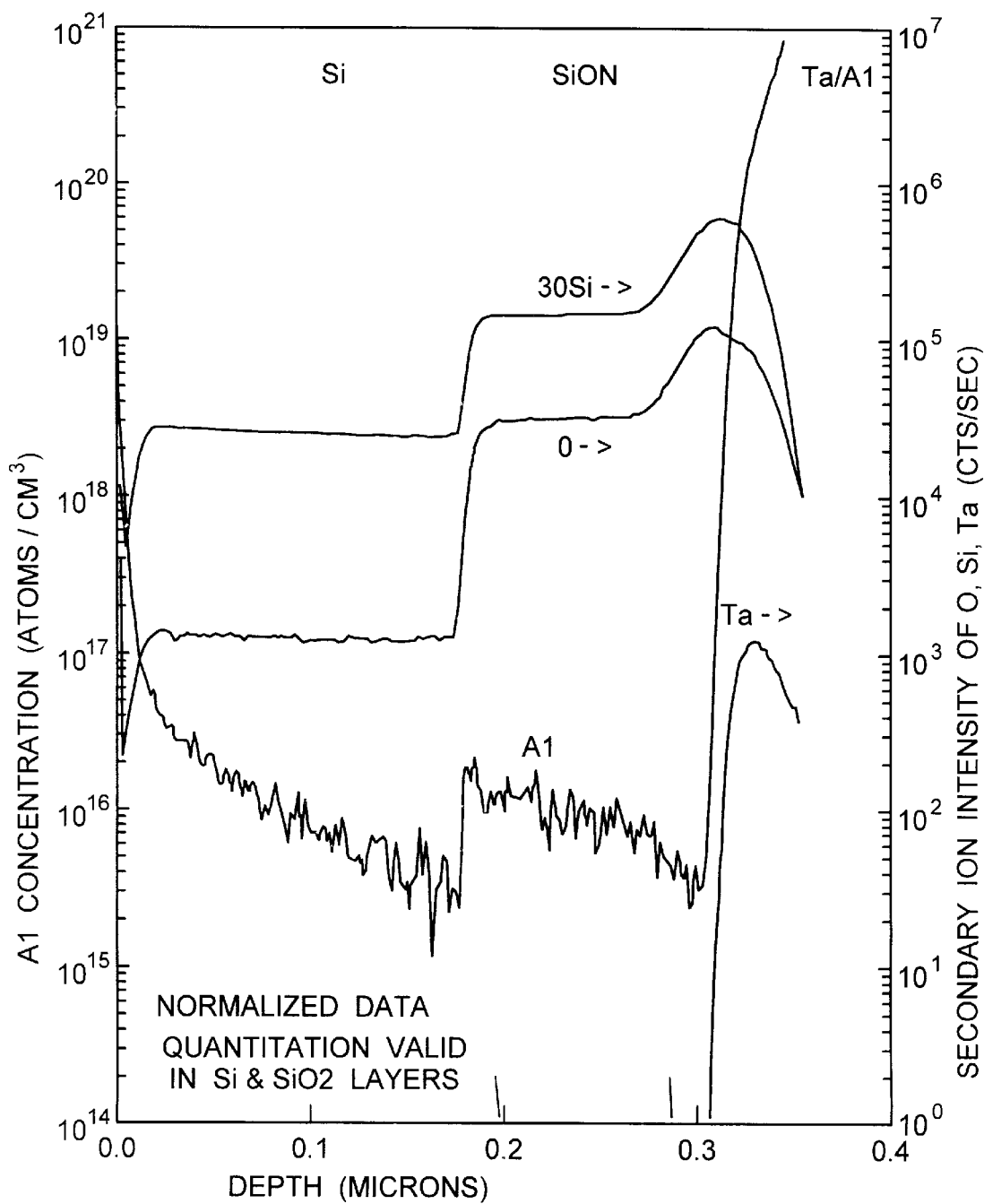
FIG. 46 is a graph showing the profile of Al concentration which is the SIMS data of the sample A.
Figure 47:
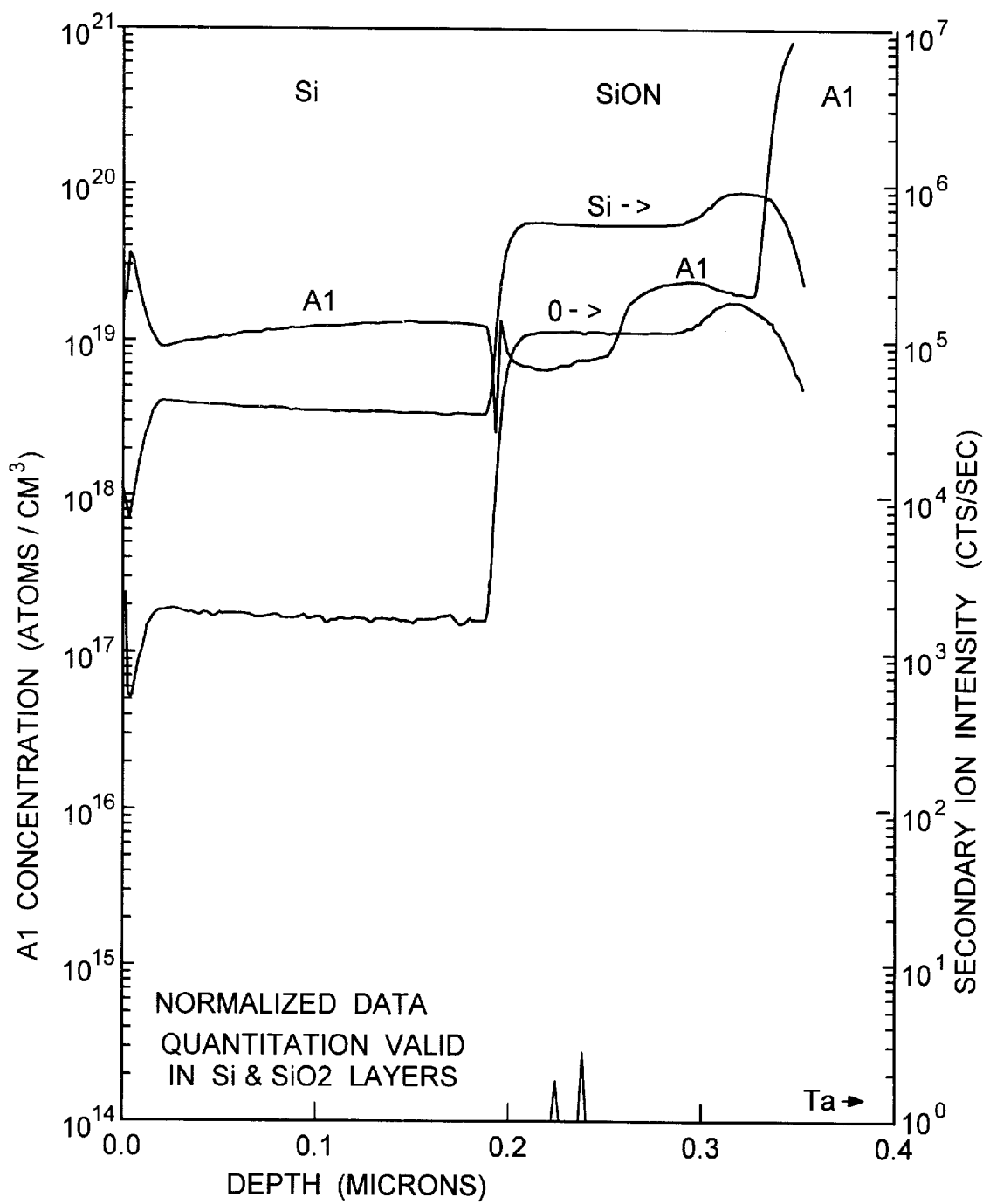
FIG. 47 is a graph showing the profile of Al concentration which is the SIMS data of the sample B.
Figure 48A:
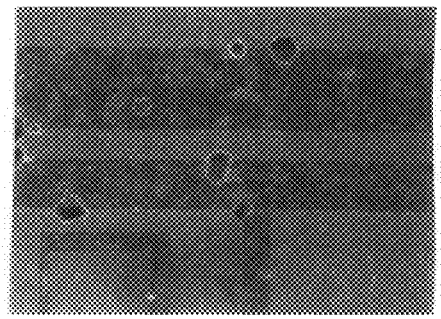
FIG. 48 is a photograph of the samples A and B which have been subjected to a heat treatment through an optical microscope.
Figure 48B:
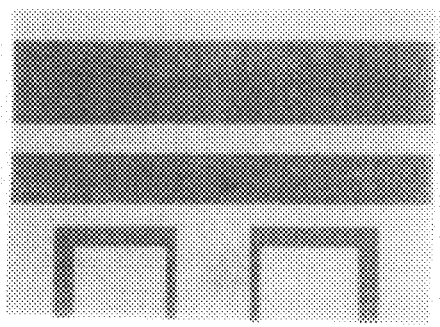
Figure 48C:
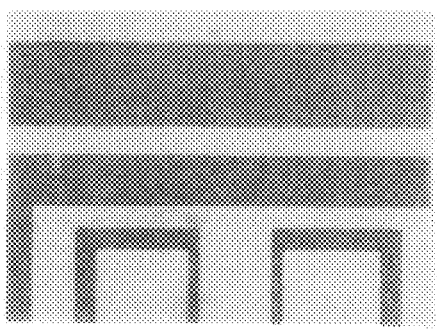
Figure 48D:
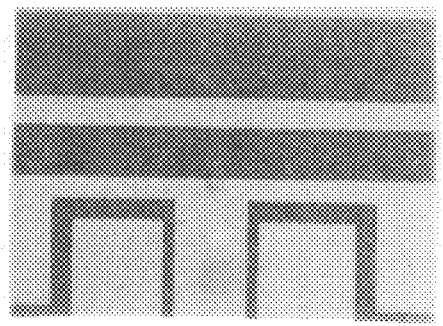
Figure 49A:
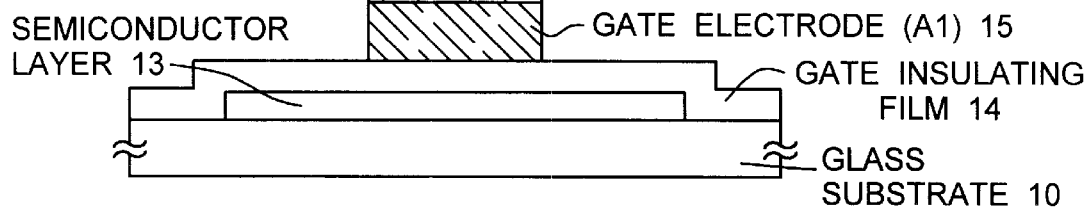
FIGS. 49A to 49F are cross-sectional views of a TFT using a conventional anodic oxidation process.
Figure 49B:
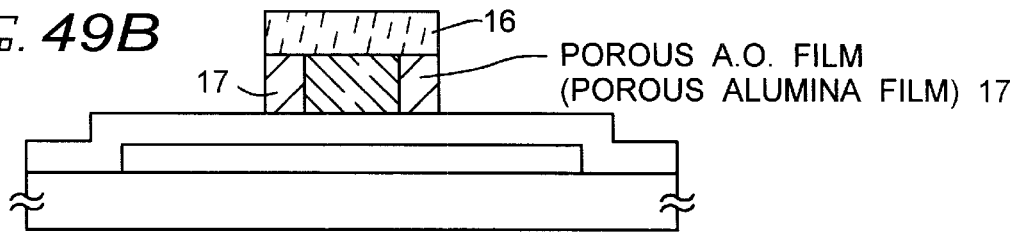
Figure 49C:
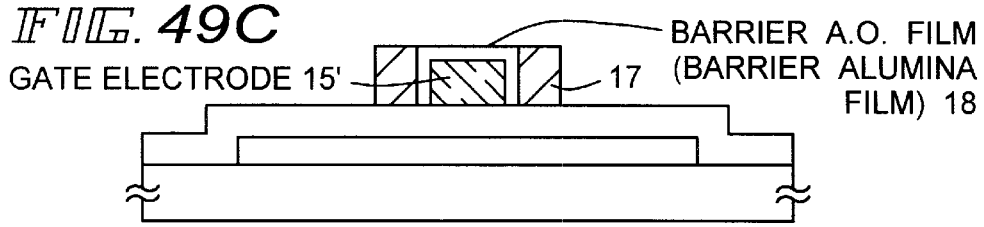
Figure 49D:
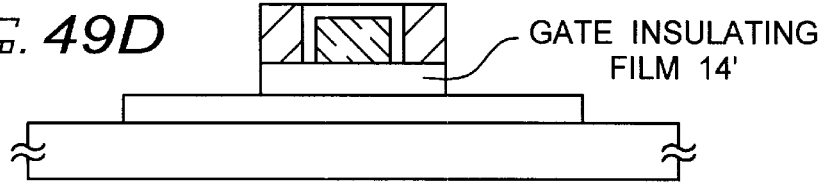
Figure 49E:
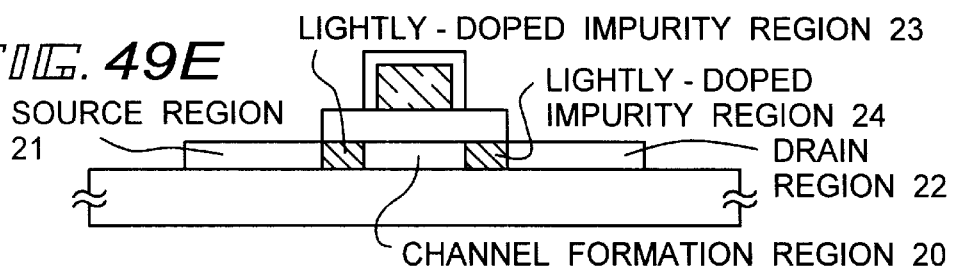
Figure 49F:
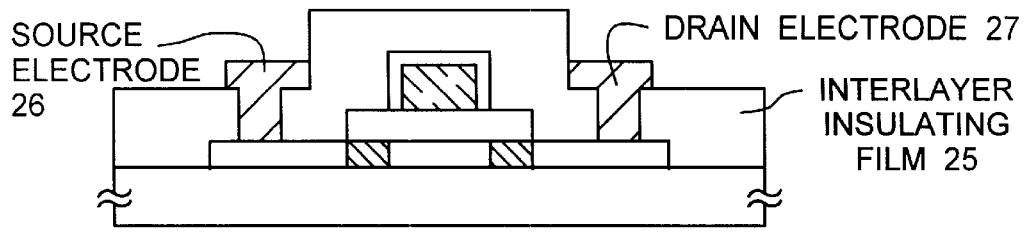

Also, FIG. 42D is a diagram showing an example of the structure of the light source optical system 2801 in FIG. 42C. In this embodiment, the light source optical system 2801 is made up of a reflector 2811, a light source 2812, lens arrays 2813, 2814, a polarization conversion element 2815 and a condenser 2816. The light source optical system shown in FIG. 42D is one example and the present invention is not particularly limited to this. For example, an optical lens, a film having a polarization function, a film for adjusting a phase difference, an IR film or the like may be provided in the light source optical system at discretion of a person who carries out the invention.

As described above, the field to which the present invention is applied is extremely broad, and the present invention is applicable to the electronic devices in any fields. Also, the electronic device of this embodiment can be realized by the structure resulting from any combination of first to ninth embodiments.

According to the present invention, because the wiring can be anodically oxidized without forming a voltage supply wiring for anodic oxidation, the circuit can be designed without taking into consideration a space for forming the supply wiring, an etching margin for dividing the voltage supply wiring, etc. Consequently, the high integration of the circuit and the reduction of the substrate area are promoted.

Also, the heat resistance can be enhanced by the laminated-layer structure of the wiring, and even if the gate wiring is made of aluminum, the deformation of the Al layer and the occurrence frequency of hillock are lowered, thereby being capable of improving the yield of the semiconductor device.

The foregoing description of the preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A method of manufacturing a semiconductor device including a gate wiring having a conductive layer in which a second wiring layer is laminated on a first wiring layer, and at least one semiconductor layer which intersects with said gate wiring, said method comprising:

a step A of forming on a substrate having an insulating surface said semiconductor layer where a source region, a drain region and a channel formation region are formed;

a step B of forming a gate insulating film in close contact with said semiconductor layer;

a step C of forming a laminated film consisting of a first conductive film and a second conductive film on an entire surface of said gate insulating film;

a step D of patterning only said second conductive film out of said laminated film to form said second wiring layer which intersects with said semiconductor layer;

a step E of anodically oxidizing said first conductive film by applying a voltage to said first conductive film to form an anodic oxide film of said first conductive film, and anodically oxidizing said second wiring layer to form an anodic oxide film which coats an upper surface of said second wiring layer by the application of said voltage; and a step F of adding impurities to said semiconductor layer through said gate insulating film and said anodic oxide film of said first conductive film, wherein said first wiring layer is formed of said first conductive film which remains without being anodically oxidized in said step E.

2. A method according to claim 1, wherein thickness of said first conductive film is 1 to 50 nm.

3. A method according to claim 1, wherein said second conductive film is formed of aluminum or a material mainly containing aluminum.

4. A method of manufacturing a semiconductor device including a gate wiring having a conductive layer in which a second wiring layer is laminated on a first wiring layer, and at least one semiconductor layer which intersects with said gate wiring, said method comprising:

a step A of forming on a substrate having an insulating surface said semiconductor layer where a source region, a drain region and a channel formation region are formed;

a step B of forming a gate insulating film in close contact with said semiconductor layer;

a step C of forming a laminated film consisting of a first conductive film and a second conductive film on an entire surface of said gate insulating film;

a step D of patterning only said second conductive film out of said laminated film to form said second wiring layer which intersects with said semiconductor layer;

a step E of anodically oxidizing a side surface of said second wiring layer by applying a voltage to said first conductive film to form a first anodic oxide film;

a step F of anodically oxidizing said second wiring layer by applying a voltage to said first conductive film to form a second anodic oxide film which coats an upper surface of said second wiring layer, and anodically oxidizing said first conductive film to form a third anodic oxide film;

a step G of adding impurities to said semiconductor layer through said gate insulating film and said third anodic oxide film using as masks the anodic oxide of said first and second conductive films;

a step H of removing said first anodic oxide film; and a step I of adding impurities to said semiconductor layer through said gate insulating film and said third anodic oxide film using the anodic oxide of said second conductive film as a mask, wherein said first wiring is formed of said first conductive film which remains without being anodically oxidized in said step F.

5. A method according to claim 4, further comprising a step J of oxidizing said first wiring layer after said step H.

6. A method according to claim 4, wherein thickness of said first conductive film is 1 to 50 nm.

7. A method according to claim 4, wherein said first conductive film is formed of a material mainly containing any one kind of metal elements selected from Ta, Nb, Hf, Ti and Cr or an alloy containing those metal elements.

8. A method according to claim 4, wherein said second conductive film is formed of aluminum or a material mainly containing aluminum.

9. A method of manufacturing an active matrix substrate on which a matrix circuit is formed, said matrix circuit including a thin film transistor formed on a substrate having an insulating surface, scanning lines each having a conductive layer where a second wiring layer is laminated on a first wiring layer, signal lines which intersect with said scanning lines, and pixel electrodes connected to said thin film transistor, said method comprising:

a step A of forming on a substrate having an insulating surface said semiconductor layer where a source region, a drain region and a channel formation region are formed;

a step B of forming a gate insulating film in close contact with said semiconductor layer;

a step C of forming a laminated film consisting of a first conductive film and a second conductive film on the entire surface of said gate insulating film;

a step D of patterning only said second conductive film out of said laminated film to form said second wiring layer which intersects with said semiconductor layer;

a step E of anodically oxidizing said first conductive film by applying a voltage to said first conductive film to form an anodic oxide film of said first conductive film, and anodically oxidizing said second wiring layer to form an anodic oxide film which coats the upper surface of said second wiring layer; and a step F of adding impurities to said semiconductor layer through said gate insulating film and said anodic oxide film of said first conductive film;

wherein said first wiring is formed of said first conductive film which remains without being anodically oxidized in said step E.

10. A method according to claim 9, wherein said step A comprises at least:

a step K of forming an amorphous semiconductor film in contact with said insulating surface;

a step L of bringing catalytic elements into contact with said amorphous semiconductor film;

a step M of crystallizing said amorphous semiconductor film by a heat treatment to form a crystalline semiconductor film; and a step N of patterning said crystalline semiconductor film in an island to form said semiconductor layer.

11. A method according to claim 9, wherein thickness of said first conductive film is 1 to 50 nm.

12. A method according to claim 9, wherein said first conductive film is formed of a material mainly containing any one kind of metal elements selected from Ta, Nb, Hf, Ti and Cr or an alloy containing those metal elements.

13. A method according to claim 9, wherein said second conductive film is formed of aluminum or a material mainly containing aluminum.

14. A liquid crystal display device using an active matrix substrate manufactured by a manufacturing method according to claim 9.

15. An electronic equipment having a liquid crystal display device according to claim 14.

16. A method of manufacturing an active matrix substrate having a matrix circuit which includes a thin film transistor formed on a substrate having an insulating surface, a scanning line intersecting with a semiconductor layer of said thin film transistor through a gate insulating film and having a laminated structure where a first wiring layer and a second wiring layer are laminated one on another, a signal line intersecting with said scanning line, and a pixel electrode connected to said thin film transistor, said method comprising:

a step A of forming on a substrate having an insulating surface said semiconductor layer where a source region, a drain region and a channel formation region are formed;

a step B of forming a gate insulating film in close contact with said semiconductor layer;

a step C of forming a laminated film consisting of a first conductive film and a second conductive film on an entire surface of said gate insulating film;

a step D of patterning only said second conductive film out of said laminated film to form said second wiring layer which intersects with said semiconductor layer;

a step E of anodically oxidizing a side surface of said second wiring layer by applying a voltage to said first conductive film to form a first anodic oxide film;

a step F of anodically oxidizing said second wiring layer by applying a voltage to said first conductive film to form a second anodic oxide film which coats an upper surface of said second wiring layer, and anodically oxidizing said first conductive film to form a third anodic oxide film;

a step G of adding impurities to said semiconductor layer through said gate insulating film and said third anodic oxide film using as masks the anodic oxide films of said first and second conductive films;

a step H of removing said first anodic oxide film; and a step I of adding impurities to said semiconductor layer through said gate insulating film and said third anodic oxide film using the anodic oxide of said second conductive film as a mask, wherein said first wiring is formed of said first conductive film which remains without being anodically oxidized in said step F.

17. A method according to claim 16, further comprising a step J of oxidizing said first wiring layer after said step H.

18. A method according to claim 16, wherein said step A comprises at least:

a step K of forming an amorphous semiconductor film in contact with said insulating surface;

a step L of bringing catalytic elements into contact with said amorphous semiconductor film;

a step M of crystallizing said amorphous semiconductor film by a heat treatment to form a crystalline semiconductor film; and a step N of patterning said crystalline semiconductor film in an island to form said semiconductor layer.

19. A method according to claim 18, wherein said catalytic elements are at least one element selected from Fe, Co, Ni, Ru, Rh, Pd, Os, Ir, Pt, Cu, Au and Ge.

20. A method according to claim 16, wherein thickness of said first conductive film is 1 to 50 nm.

21. A method according to claim 16, wherein said first conductive film is formed of a material mainly containing any one kind of metal elements selected from Ta, Nb, Hf, Ti and Cr or an alloy containing those metal elements.

22. A method according to claim 16, wherein said second conductive film is formed of aluminum or a material mainly containing aluminum.

23. A method of manufacturing a semiconductor device including a gate wiring having a conductive layer where a first wiring layer and a second wiring layer are laminated, and at least one semiconductor layer which intersects said gate wiring, said method comprising:

a step A of forming on a substrate having an insulating surface said semiconductor layer where a source region, a drain region and a channel formation region are formed;

a step B of forming a gate insulating film in close contact with said semiconductor layer;

a step C of forming a laminated film consisting of a first conductive film and a second conductive film on an entire surface of said gate insulating film;

a step D of patterning only said second conductive film out of said laminated film to form said second wiring layer which intersects with said semiconductor layer;

a step E of anodically oxidizing said first conductive film by applying a voltage to said first conductive film to form an anodic oxide film of said first conductive film, and anodically oxidizing said second wiring layer to form an anodic oxide film which coats an upper surface of said second wiring layer by the application of said voltage;

a step F of patterning said anodic oxide film of said first conductive film formed in said step E while using said anodic oxide film of said second wiring layer formed in said step E as a mask to expose a surface of said gate insulating film; and a step G of adding impurities to the semiconductor layer through said gate insulating film, wherein said first wiring layer is formed of said first conductive film which remains without being anodically oxidized in said step E.

24. A method according to claim 23, wherein thickness of said first conductive film is 1 to 50 nm.

25. A method according to claim 23, wherein said first conductive film is formed of a material mainly containing any one kind of metal elements selected from Ta, Nb, Hf, Ti and Cr or an alloy containing those metal elements.

26. A method according to claim 23, wherein said second conductive film is formed of aluminum or a material mainly containing aluminum.

27. A method of manufacturing a semiconductor device including a gate wiring having a conductive layer in which a first wiring layer and a second wiring layer are laminated one on another, and at least one semiconductor layer which intersects with said gate wiring, said method comprising:

a step A of forming on a substrate having an insulating surface said semiconductor layer where a source region, a drain region and a channel formation region are formed;

a step B of forming a gate insulating film in close contact with said semiconductor layer;

a step C of forming a laminated film consisting of a first conductive film and a second conductive film on an entire surface of said gate insulating film;

a step D of patterning only said second conductive film out of said laminated film to form said second wiring layer which intersects with said semiconductor layer;

a step E of anodically oxidizing a side surface of said second wiring layer by applying a voltage to said first conductive film to form a first anodic oxide film;

a step F of anodically oxidizing said second wiring layer by applying a voltage to said first conductive film to form a second anodic oxide film which coats an upper surface of said second wiring layer, and anodically oxidizing said first conductive film to form a third anodic oxide film;

a step G of patterning said third anodic oxide film using said first anodic oxide film as a mask to expose a surface of said gate insulating film;

a step H of removing said first anodic oxide film;

a step I of patterning said third anodic oxide film with said second anodic oxide film as a mask to further expose a surface of said gate insulating film; and a step J of adding impurities to the semiconductor layer through said gate insulating film at least after said step G, wherein said first wiring layer is formed of said first conductive film which remains without being anodically oxidized in said step F.

28. A method according to claim 27, wherein thickness of said first conductive film is 1 to 50 nm.

29. A method according to claim 27, wherein said first conductive film is formed of a material mainly containing any one kind of metal elements selected from Ta, Nb, Hf, Ti and Cr or an alloy containing those metal elements.

30. A method according to claim 27, wherein said second conductive film is formed of aluminum or a material mainly containing aluminum.

31. A method of manufacturing an active matrix substrate on which a matrix circuit is formed, said matrix circuit including a thin film transistor formed on a substrate having an insulating surface, a scanning line each having a conductive layer where a first wiring layer and a second wiring layer are laminated one on another, a signal line intersecting with said scanning line, and a pixel electrodes connected to said thin film transistor, said method comprising:

a step A of forming on a substrate having an insulating surface said semiconductor layer where a source region, a drain region and a channel formation region are formed;

a step B of forming a gate insulating film in close contact with said semiconductor layer;

a step C of forming a laminated film consisting of a first conductive film and a second conductive film on an entire surface of said gate insulating film;

a step D of patterning only said second conductive film out of said laminated film to form said second wiring layer which intersects with said semiconductor layer;

a step E of anodically oxidizing said first conductive film by applying a voltage to said first conductive film to form an anodic oxide film of said first conductive film, and anodically oxidizing said second wiring layer to form an anodic oxide film which coats an upper surface of said second wiring layer by the application of said voltage;

a step F of patterning said anodic oxide film of said first conductive film formed in said step E while using said anodic oxide film of said second wiring layer formed in said step E as a mask to expose a surface of said gate insulating film; and a step G of adding impurities to the semiconductor layer through said gate insulating film;

wherein said first wiring layer is formed of said first conductive film which remains without being anodically oxidized in said step E.

32. A method according to claim 31, wherein thickness of said first conductive film is 1 to 50 nm.

33. A method according to claim 31, wherein said first conductive film is formed of a material mainly containing any one kind of metal elements selected from Ta, Nb, Hf, Ti and Cr or an alloy containing those metal elements.

34. A method according to claim 31, wherein said second conductive film is formed of aluminum or a material mainly containing aluminum.

35. A liquid crystal display device using an active matrix substrate manufactured by a manufacturing method according to claim 31.

36. A method of manufacturing an active matrix substrate having a matrix circuit that includes a thin film transistor formed on a substrate having an insulating surface, a scanning line having a conductive layer where a first wiring layer and a second wiring layer are laminated one on another, a signal line which intersects with said scanning line, and a pixel electrode connected to said thin film transistor, said method comprising:

a step A of forming on a substrate having an insulating surface said semiconductor layer where a source region, a drain region and a channel formation region are formed;

a step B of forming a gate insulating film in close contact with said semiconductor layer;

a step C of forming a laminated film consisting of a first conductive film and a second conductive film on an entire surface of said gate insulating film;

a step D of patterning only said second conductive film out of said laminated film to form said second wiring layer which intersects with said semiconductor layer;

a step E of anodically oxidizing a side surface of said second wiring layer by applying a voltage to said first conductive film to form a first anodic oxide film;

a step F of anodically oxidizing said second wiring layer by applying a voltage to said first conductive film to form a second anodic oxide film which coats an upper surface of said second wiring layer, and anodically oxidizing said first conductive film to form a third anodic oxide film;

a step G of patterning said third anodic oxide film using said first anodic oxide film as a mask to expose a surface of said gate insulating film;

a step H of removing said first anodic oxide film;

a step I of patterning said third anodic oxide film using as a mask said second anodic oxide film to further expose a surface of said gate insulating film; and a step J of adding impurities to the semiconductor layer through said gate insulating film at least after said step G, wherein said first wiring layer is formed of said first conductive film which remains without being anodically oxidized in said step F.

37. A method according to claim 31, wherein said step A comprises:

a step K of forming an amorphous semiconductor film in contact with said insulating surface;

a step L of bringing catalytic elements into contact with said amorphous semiconductor film;

a step M of crystallizing said amorphous semiconductor film by a heat treatment to form a crystalline semiconductor film; and a step N of patterning said crystalline semiconductor film in an island to form said semiconductor layer.

38. A method according to claim 37, wherein said catalytic elements are at least one element selected from Fe, Co, Ni, Ru, Rh, Pd, Os, Ir, Pt, Cu, Au and Ge.

39. A method according to claim 31, wherein thickness of said first conductive film is 1 to 50 nm.

40. A method according to claim 31, wherein said first conductive film is formed of a material mainly containing any one kind of metal elements selected from Ta, Nb, Hf, Ti and Cr or an alloy containing those metal elements.

41. A method according to claim 31, wherein said second conductive film is formed of aluminum or a material mainly containing aluminum.

42. A method of manufacturing a semiconductor device including a plurality of wirings each having a laminated structure in which a second wiring layer is laminated on a first wiring layer, said method comprising the steps of:

forming a first conductive film on an insulating surface;

forming a second conductive film in contact with an upper surface of said first conductive film;

patterning said second conductive film to selectively form said second wiring layer for each of said wirings;

anodically oxidizing said second wiring layer by applying a voltage to said first conductive film; and thermally oxidizing said first conductive film.

43. A method according to claim 42, wherein said second conductive film is made of aluminum or a material mainly containing aluminum.

44. A method of manufacturing a semiconductor device including a wiring having a laminated structure in which a second wiring layer is laminated on a first wiring layer, said method comprising:

a step A of forming a first conductive film on an insulating surface;

a step B of forming a second conductive film in contact with an upper surface of said first conductive film;

a step C of patterning said second conductive film to selectively form said second wiring layer on said first conductive film;

a step D of anodically oxidizing said second wiring layer by applying a voltage to said first conductive film and anodically oxidizing said first conductive film by the application of said voltage;

a step E of selectively removing an anodic oxide film of said first conductive film; and a step F of thermally oxidizing remaining part of said first conductive film.

45. A method according to claim 44, wherein said second conductive film is made of aluminum or a material mainly containing aluminum.

46. A method of manufacturing a semiconductor device including a gate wiring having a laminated structure in which a second wiring layer is laminated on a first wiring layer, said method comprising:

a step A of forming a plurality of semiconductor layers on an insulating surface;

a step B of forming an insulating film in close contact with said semiconductor layers;

a step C of forming a first conductive film on said insulating film;

a step D of forming a second conductive film in contact with an upper surface of said first conductive film;

a step E of patterning said second conductive film to form said second wiring layer which intersects with said semiconductor layers through said insulating film;

a step F of anodically oxidizing said second wiring layer by applying a voltage to said first conductive film to form a first anodic oxide film which coats a side surface of said second wiring layer;

a step G of anodically oxidizing said second wiring layer by applying a voltage to said first conductive film to form a second anodic oxide film which coats an upper surface of said second wiring layer and, simultaneously, selectively subjecting said first conductive film to anodic oxidation to form a third anodic oxide film, thereby sectioning said first wiring layer;

a step H of patterning said insulating film and said third anodic oxide film using said first and second anodic oxide films as masks;

a step I of removing said first anodic oxide film;

a step J of adding impurities to the semiconductor layer using as masks said insulating film and said second and third anodic oxide films to form a source region, a drain region and a channel formation region in each of said semiconductor layer; and a step K of conducting a heat treatment on said first wiring layer in an oxidization atmosphere.

47. A method according to claim 46, wherein said step A comprises:

a step of forming an amorphous semiconductor film in contact with said insulating surface;

a step of bringing catalytic elements into contact with said amorphous semiconductor film;

a step of crystallizing said amorphous semiconductor film by a heat treatment to form a crystalline semiconductor film; and a step of patterning said crystalline semiconductor film in an island to form said semiconductor layer.

48. A method according to claim 47, wherein said catalytic elements are at least one element selected from Fe, Co, Ni, Ru, Rh, Pd, Os, Ir, Pt, Cu, Au and Ge.

49. A method according to claim 47, wherein impurities that give an n-type conductivity are added to said source region and said drain region in said step J.

50. A method according to claim 47, wherein impurities that give a p-type conductivity, impurities that give an n-type conductivity are added to said source region and said drain region in said step J.

51. A method according to claim 47, wherein thickness of said first conductive film is 1 to 50 nm.

52. A method according to claim 47, wherein said first conductive film is formed of a material mainly containing any one kind of metal elements selected from Ta, Nb, Hf, Ti and Cr or an alloy containing those metal elements.

53. A method according to claim 46, wherein said second conductive film is made of aluminum or a material mainly containing aluminum.

* * * * *